United States Patent
Shino

(10) Patent No.: US 8,026,553 B2
(45) Date of Patent: Sep. 27, 2011

(54) SEMICONDUCTOR MEMORY DEVICE AND MANUFACTURING METHOD THEREOF

(75) Inventor: Tomoaki Shino, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 397 days.

(21) Appl. No.: 12/114,205

(22) Filed: May 2, 2008

(65) Prior Publication Data

US 2008/0277725 A1   Nov. 13, 2008

(30) Foreign Application Priority Data

May 10, 2007 (JP) .................................. 2007-125968
Apr. 25, 2008 (JP) .................................. 2008-115780

(51) Int. Cl.
   *H01L 29/66* (2006.01)

(52) U.S. Cl. ..... 257/365; 257/353; 257/347; 257/E21.7; 257/E27.127; 438/157

(58) Field of Classification Search ........................ None
See application file for complete search history.

(56) References Cited

U.S. PATENT DOCUMENTS

2006/0081851 A1   4/2006   Ono
2007/0007574 A1   1/2007   Ohsawa

FOREIGN PATENT DOCUMENTS

JP   2006-108396   4/2006
JP   2007-18588    1/2007

OTHER PUBLICATIONS

U.S. Appl. No. 12/360,399, filed Jan. 27, 2009, Shino.

*Primary Examiner* — Jarrett J Stark
(74) *Attorney, Agent, or Firm* — Oblon, Spivak, McClelland, Maier & Neustadt, L.L.P.

(57) ABSTRACT

This disclosure concerns a memory comprising a semiconductor layer extending in a first direction; a source; a drain; a body between the source and the drain; a bit-line extending in the first direction; a first gate-dielectric on a first side-surface of the body; a first gate-electrode on the first side-surface of the body via the first gate dielectric film; a first gate line extending in the first direction, connected to a bottom of the first gate-electrode, and formed integratedly with the first gate-electrode using same material; a second gate dielectric on a second side-surface of the body; a second gate-electrode on the second side surface of the body via the second gate dielectric film; and a second gate line extending in a second direction crossing the first direction, connected to an upper portion of the second gate-electrode, and formed integratedly with the second gate-electrode using same material.

12 Claims, 90 Drawing Sheets

FIRST EMBODIMENT

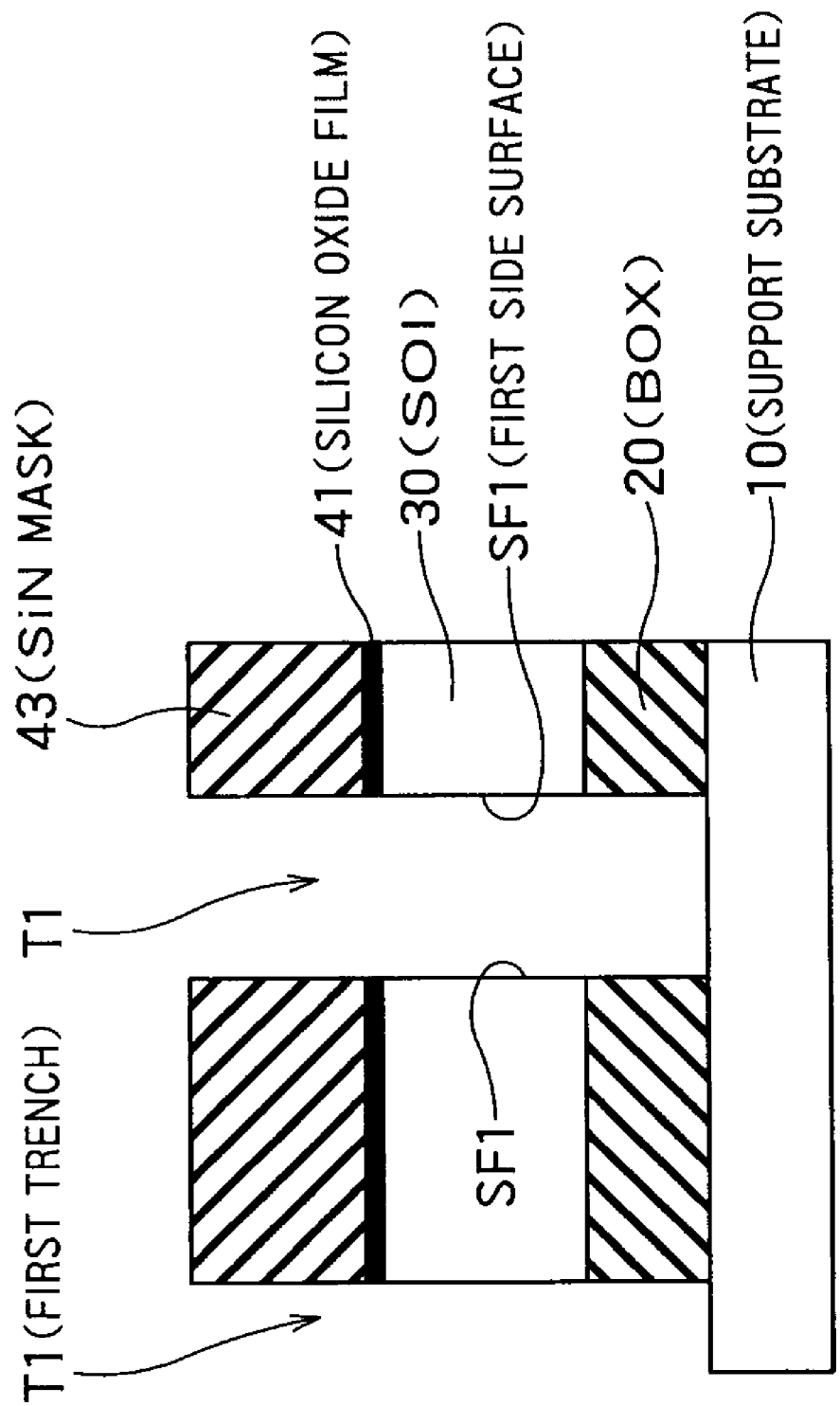

FIG. 23  SECOND EMBODIMENT

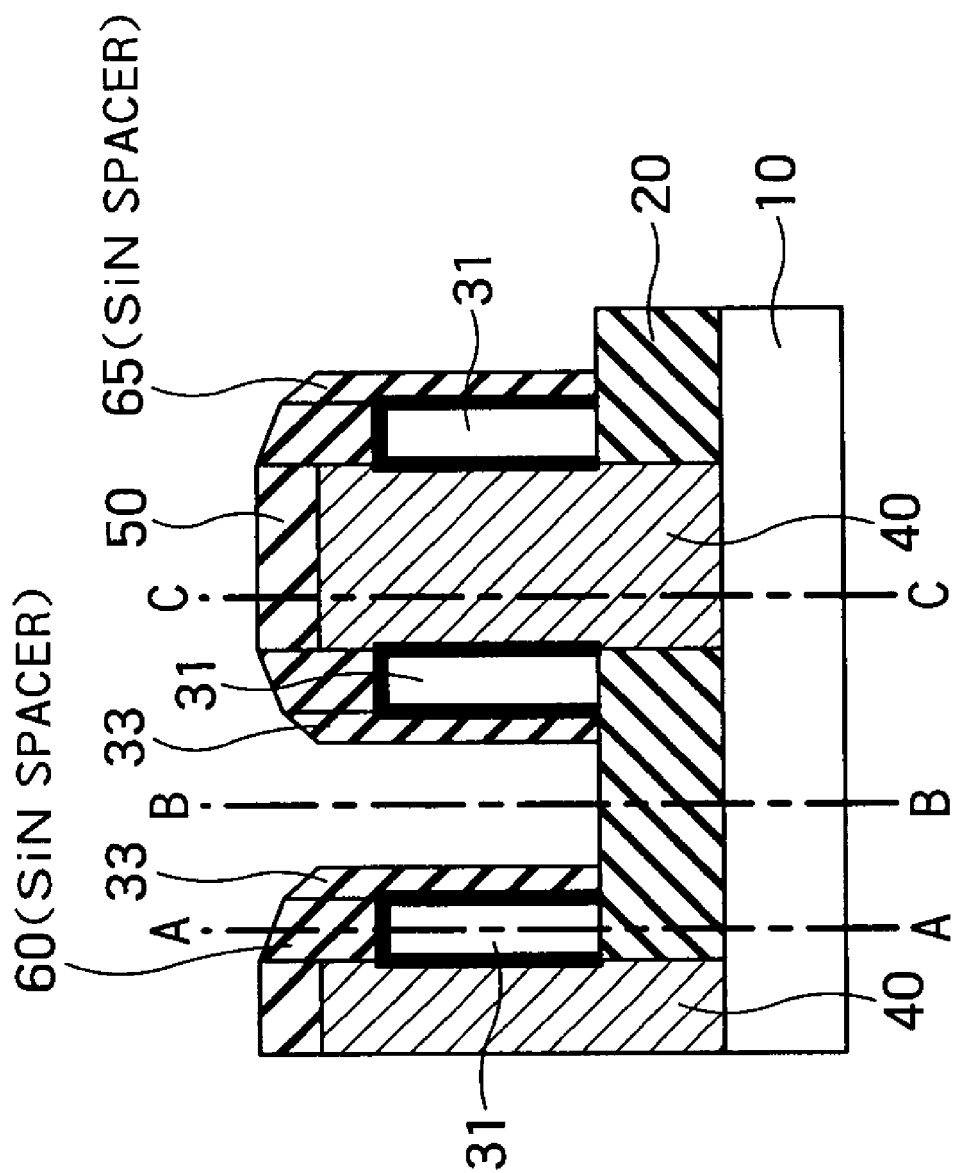

FIG. 44  THIRD EMBODIMENT

FIG. 52 FOURTH EMBODIMENT

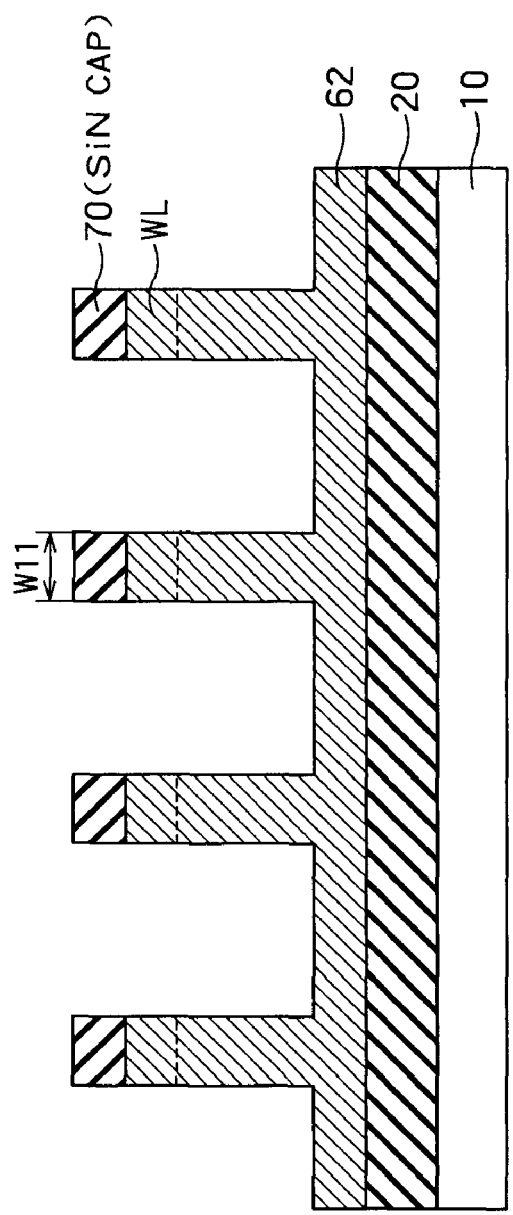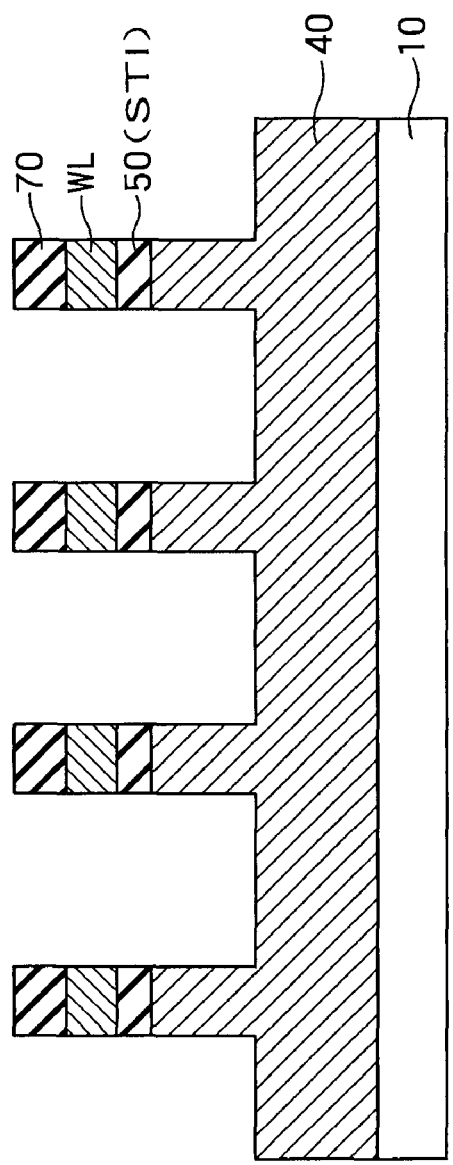

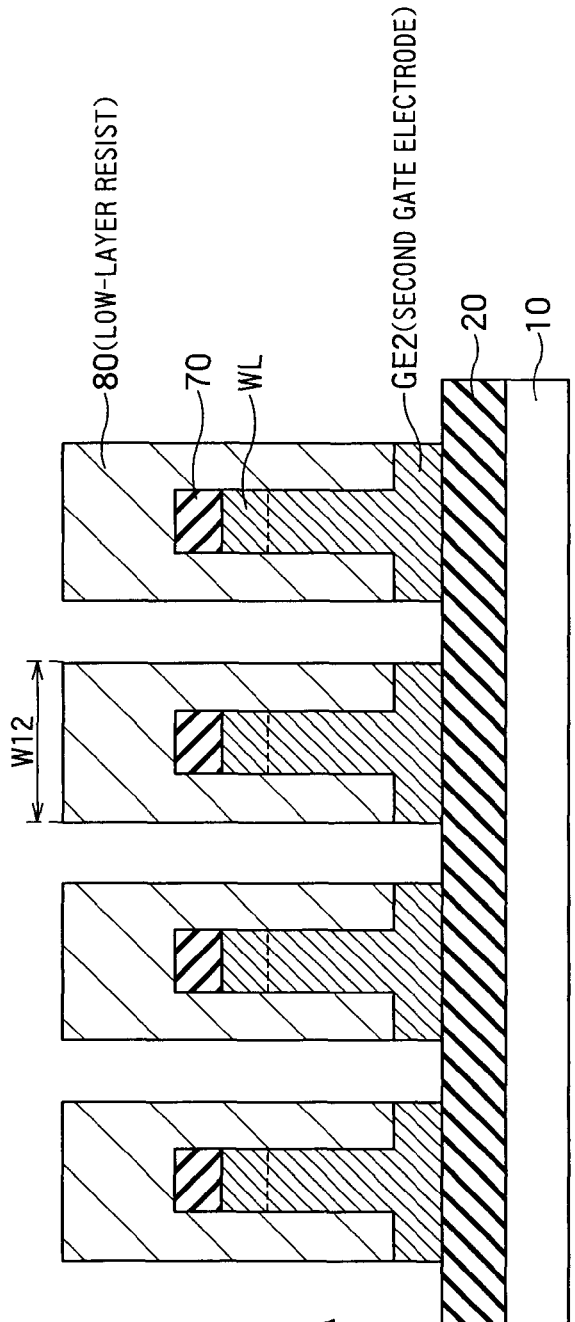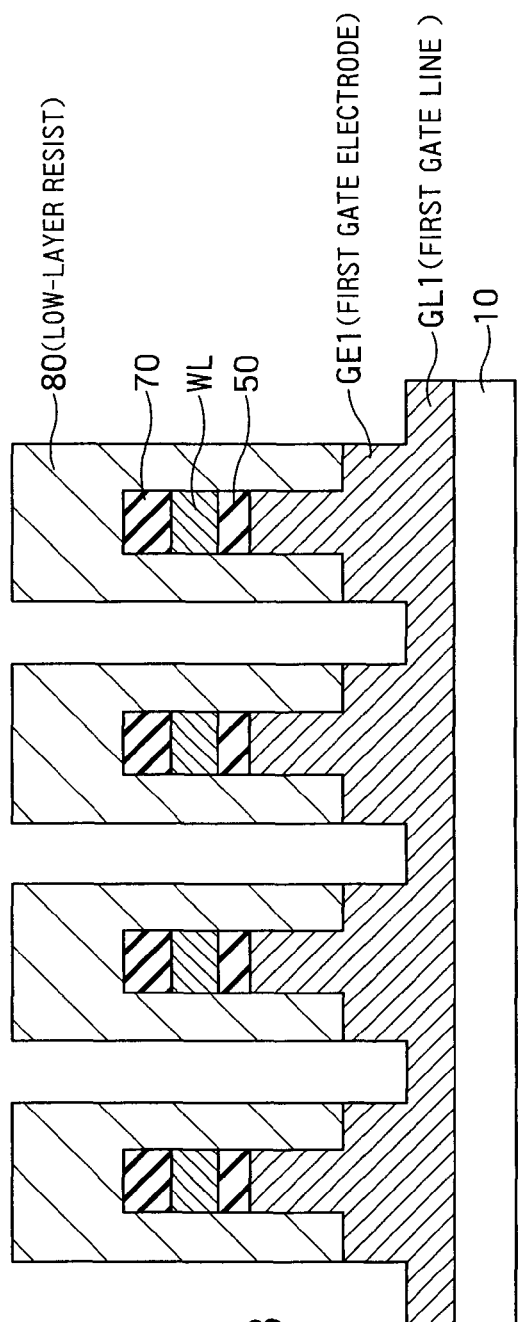

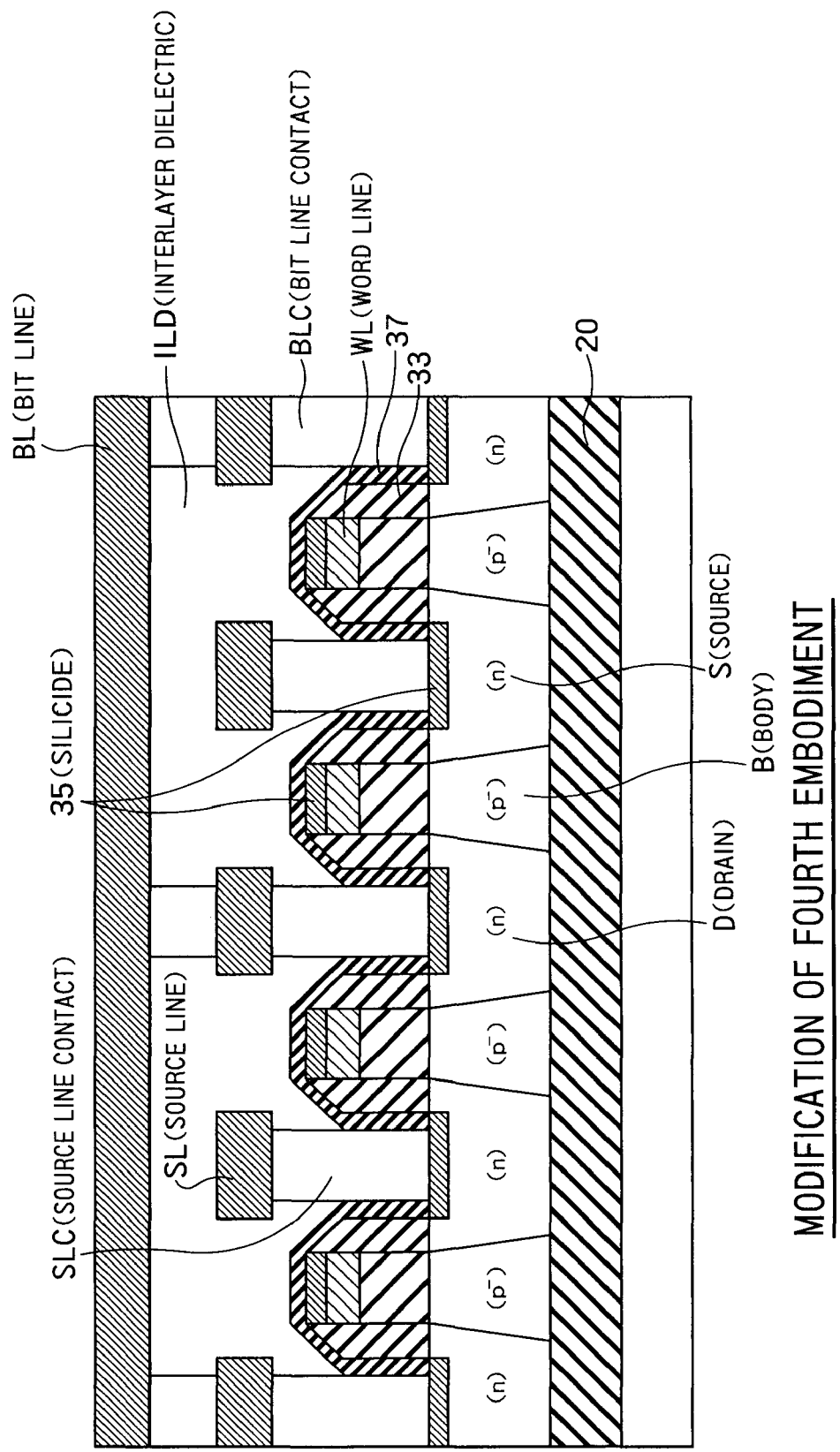
FIG. 58 MODIFICATION OF FOURTH EMBODIMENT

FIG. 60 FIFTH EMBODIMENT

FIG. 97 SEVENTH EMBODIMENT

SEMICONDUCTOR MEMORY DEVICE AND MANUFACTURING METHOD THEREOF

CROSS-REFERENCE TO RELATED APPLICATION

This application is based upon and claims the benefit of priority from the prior Japanese Patent Applications No. 2007-125968, filed on May 10, 2007 and No. 2008-115780, filed on Apr. 25, 2008 the entire contents of which are incorporated herein by reference.

BACKGROUND OF THE INVENTION

1. Field of the Invention

The present invention relates to a semiconductor memory device and a manufacturing method thereof, for example, a Fin FBC (Floating Body Cell) memory device and a manufacturing method thereof.

2. Related Art

In recent years, an FBC memory device has been known as a semiconductor device expected to replace a 1T (Transistor)-1C (Capacitor) DRAM. The FBC memory device is configured so that FETs (Field Effect Transistors) each including a floating body (hereinafter, also "body") are formed on an SOI (Silicon On Insulator) substrate. The FBC memory device stores data "1" or "0" in each FET according to the number of majority carriers accumulated in the body of the FET.

Recently, development of a fully depleted FBC (hereinafter, "FD-FBC") is underway. If a memory device is made smaller in size, a gate length of the FD-FBC is smaller, accordingly. If the gate length is smaller, a threshold voltage difference between a memory cell storing therein data "0" (hereinafter, "0" cell) and a memory cell storing therein data "1" (hereinafter, "1" cell) is smaller. This causes a reduction in signal difference necessary for data discrimination.

To deal with the problem, an FBC memory device using FinFETs has been developed. However, a conventional Fin FBC needs a contact region for connecting each word line to a gate electrode. Due to this, a distance margin is required between each contact hole and an SOI layer to some extent. If FBCs configured as described above are arranged in a matrix, a size of a unit cell (cell size) is disadvantageously made large.

Moreover, in FIG. 12 of JP-A 2007-18588 (KOKAI), one plate electrode is formed integratedly with each plate line, so that no plate contacts are formed. However, if the plate lines are formed adjacent to the SOI layer (drain layer), a parasitic capacitance between each plate electrode and a drain increases. The increase in the parasitic capacitance between the plate electrode and the drain causes a reduction in an operation speed of the FBC and an increase in power consumption. Furthermore, if the plate lines are formed adjacent to the SOI layer (source layers or drain layers), a short circuit may possibly occurs between each plate electrode and either the source layer or the drain layer corresponding to the plate electrode. On the other hand, if the plate lines are formed to be separate from the SOI layer, the cell size of the FBC disadvantageously increases.

SUMMARY OF THE INVENTION

A semiconductor memory device according to an embodiment of the present invention comprises a supporting substrate; a semiconductor layer provided above the supporting substrate, and extending in a first direction; a source layer provided in the semiconductor layer; a drain layer provided in the semiconductor layer; a body provided between the source layer and the drain layer in the semiconductor layer, the body being in an electrically floating state, electric charges being accumulated in or emitted from the body to store data; a bit line connected to the drain layer, and extending in the first direction; a first gate dielectric film provided on a first side surface of the body; a first gate electrode provided on the first side surface of the body via the first gate dielectric film; a first gate line extending in the first direction, connected to a bottom of the first gate electrode, and formed integratedly with the first gate electrode using same material; a second gate dielectric film provided on a second side surface of the body, the second side surface being opposite to the first side surface; a second gate electrode provided on the second side surface of the body via the second gate dielectric film, and isolated from the first gate electrode; and a second gate line extending in a second direction crossing the first direction, connected to an upper portion of the second gate electrode, and formed integratedly with the second gate electrode using same material.

A semiconductor memory device according to an embodiment of the present invention comprises a supporting substrate; a semiconductor layer provided above the supporting substrate, and extending in a first direction; a source layer provided in the semiconductor layer; a drain layer provided in the semiconductor layer; a body provided between the source layer and the drain layer in the semiconductor layer, the body being in an electrically floating state, electric charges being accumulated in or emitted from the body to store data; a bit line connected to the drain layer, and extending in the first direction; a first gate dielectric film provided on a first side surface of the body; a first gate electrode provided on the first side surface of the body via the first gate dielectric film and connected to the supporting substrate; a second gate dielectric film provided on a second side surface of the body, the second side surface being opposite to the first side surface; a second gate electrode provided on the second side surface of the body via the second gate dielectric film, and isolated from the first gate electrode; and a second gate line extending in a second direction crossing the first direction, connected to an upper portion of the second gate electrode, and formed integratedly with the second gate electrode using same material.

A semiconductor memory device according to an embodiment of the present invention comprises a supporting substrate; a semiconductor layer provided above the supporting substrate, and extending in a first direction; a source layer provided in the semiconductor layer; a drain layer provided in the semiconductor layer; a body provided between the source layer and the drain layer in the semiconductor layer, the body being in an electrically floating state, electric charges being accumulated in or emitted from the body to store data; a bit line connected to the drain layer, and extending in the first direction; a first gate dielectric film provided on a first side surface of the body; a first gate electrode provided on the first side surface of the body via the first gate dielectric film and including a first part and a second part; a second gate dielectric film provided on a second side surface of the body, the second side surface being opposite to the first side surface; a second gate electrode provided on the second side surface of the body via the second gate dielectric film, and isolated from the first gate electrode; and a second gate line extending in a second direction crossing the first direction, connected to an upper portion of the second gate electrode, and formed integratedly with the second gate electrode using same material, wherein the first part is provided below the second gate line and includes two side surfaces facing to the first direction, and the second part includes a top surface located lower than a top surface of the first part.

BRIEF DESCRIPTION OF THE DRAWINGS

FIGS. 8 to 27 show a method of manufacturing the FBC memory device according to the first embodiment;

FIGS. 28 to 43 show a method of manufacturing the FBC memory device according to the second embodiment;

FIGS. 55 to 57 show a method of manufacturing the FBC memory device according to the fourth embodiment;

FIGS. 58 and 59 are cross-sectional views of an FBC memory device according to a modification of the fourth embodiment of the present invention;

DETAILED DESCRIPTION OF THE INVENTION

Embodiments of the present invention will be explained below in detail with reference to the accompanying drawings. Note that the invention is not limited thereto.

First Embodiment

Figure 1:
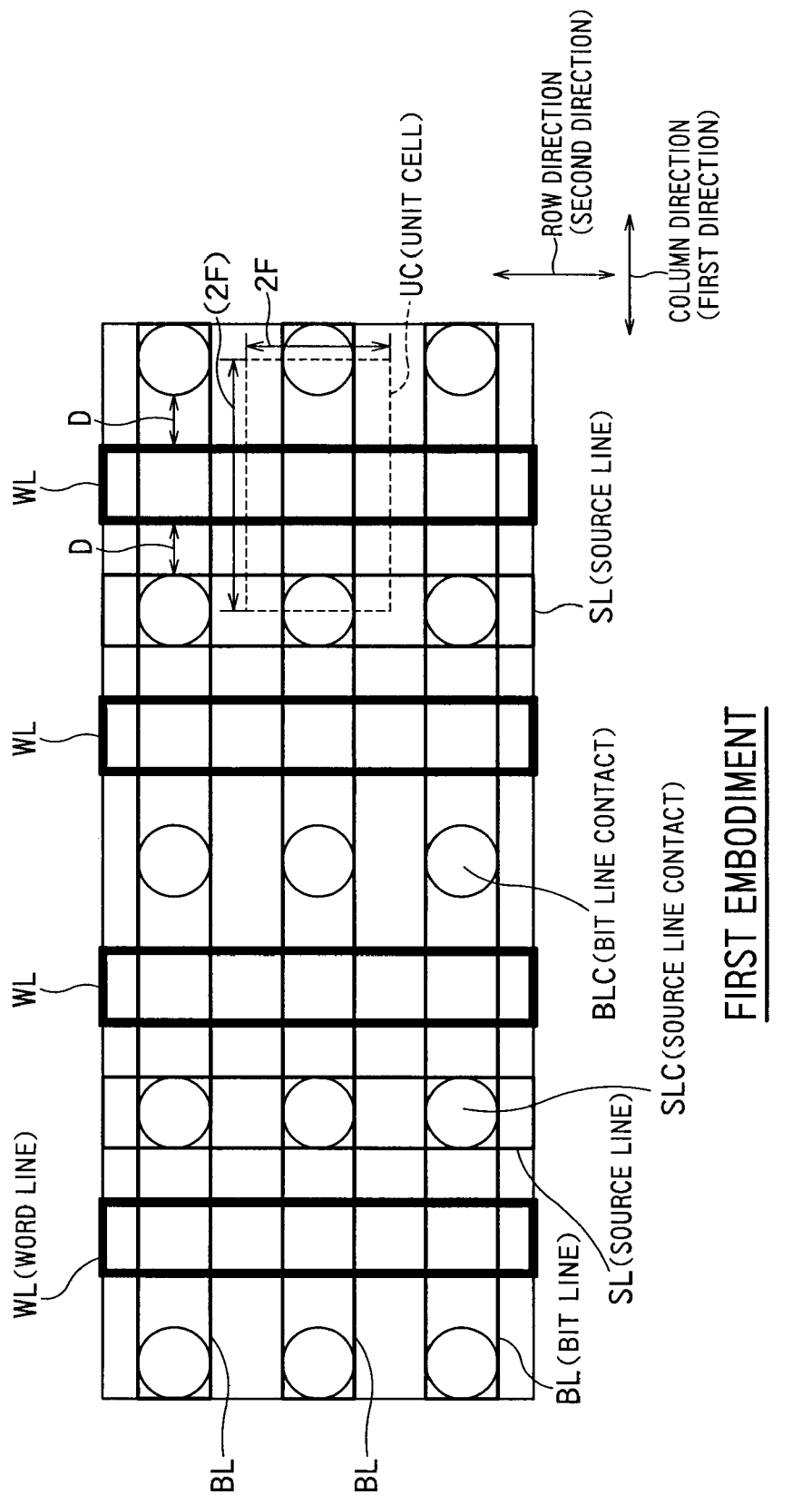
FIG. 1 is a plan view showing wirings of an FD-FBC memory device according to a first embodiment of the present invention.

FIG. 1 is a plan view showing wirings of an FD-FBC memory (hereinafter, simply "FBC memory") device according to a first embodiment of the present invention. A plurality of bit lines BLs is formed into stripes and extends in a column direction that is a first direction. Each of the bit lines BLs is connected to a drain layer of each of memory cell MCs via a bit line contact BLC. A plurality of word lines WLs extends in a row direction that is a second direction orthogonal to the column direction. Each of the word lines WLs serving as second gate lines is connected to a second gate electrode GE2 (see FIG. 2) of each memory cell MC. Each memory cell MC is arranged in a point of intersection of a bit line and a word line. The memory cells MCs are arranged in a matrix, thereby constituting memory cell arrays. Source lines SLs extend in the row direction similarly to the word lines WLs. Each of the source lines SLs is connected to a source layer of each memory cell MC via a source line contact SLC.

Note that no contacts are formed in the word lines WLs and that no plate lines and no plate line contacts appear in the plan view of FIG. 1. It is thereby possible to set a distance D between each word line WL and the corresponding source line contact SLC (or bit line contact BLC) considerably small. If self-aligned contacts are employed as the source line contacts SLCs and the bit line contacts BLCs, the distance D can be made almost zero. In this case, a size of a unit cell UC can be reduced to $4F^2$, where F (Feature Size) means a minimum line width of a resist pattern that can be formed by lithography of a certain generation.

Figure 2:
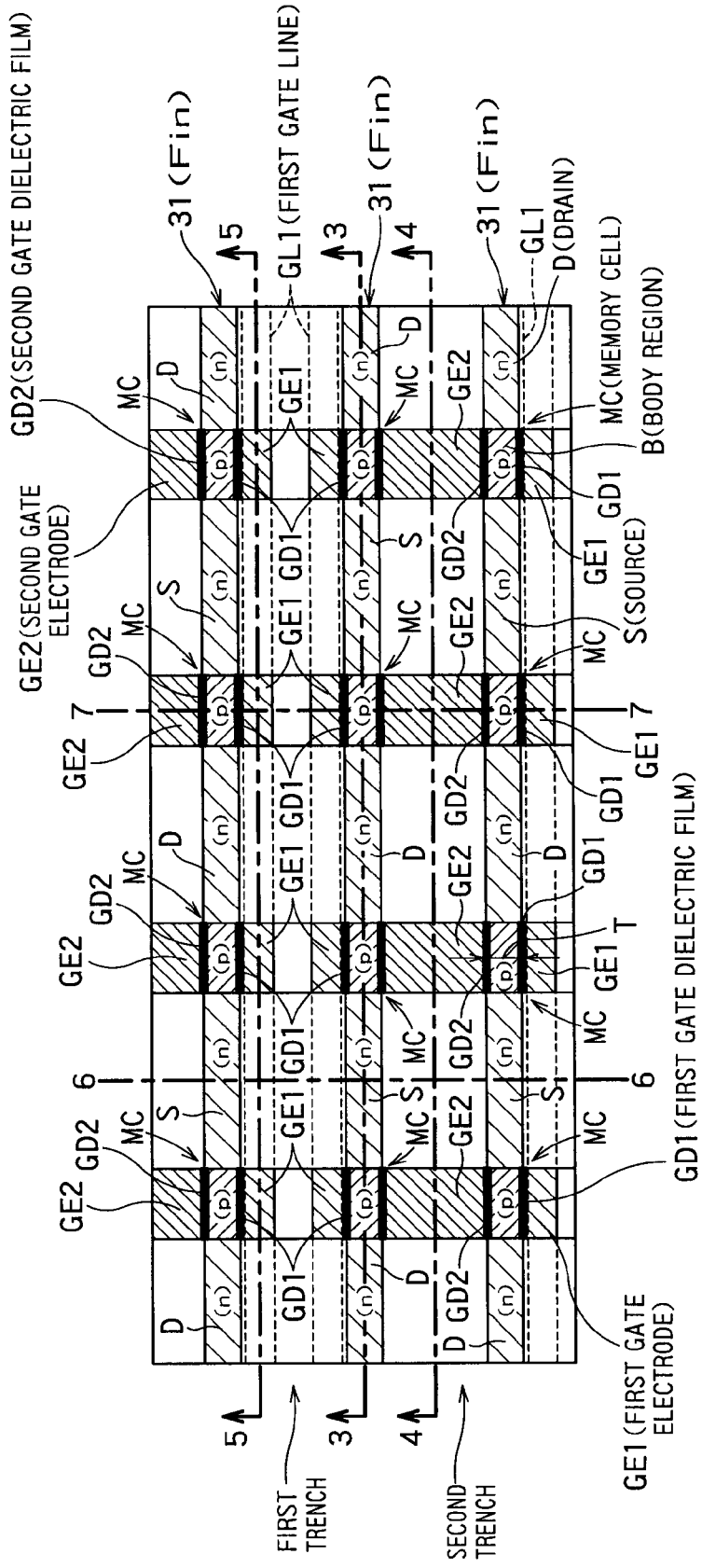
FIG. 2 is a plan view showing configurations of first and second gate electrodes GE1 and GE2 in the FBC memory device according to the first embodiment.

FIG. 2 is a plan view showing configurations of first and second gate electrodes GE1 and GE2 in the FBC memory device according to the first embodiment. FIG. 2 shows a lower layer plane than FIG. 1.

Fin semiconductor layers 31 are formed below the bit lines BLs to extend in the column direction. A plurality of Fin semiconductors 31 is formed into stripes. N-source layers S are provided in the respective Fin semiconductor layers 31 below the source lines SL. N-drain layers D are provided in the respective Fin semiconductors 31 below the bit lines BL. A p⁻ body B is provided in each Fin semiconductor 31 between the source layer S and the drain layer D of the Fin semiconductor 31. The bodies B are provided below the word lines WL. A first gate dielectric film GD1 is provided on a first side surface of each body B. A second gate dielectric film GD2 is provided on a second side surface of each body B opposite to the first side surface. One P-body B is surrounded by the N-source layer S, the N-drain layer D, the first gate dielectric film GD1, the second gate dielectric film GD2, and a BOX layer 20 (see FIG. 3), and is in an electrically floating state. Each memory cell MC stores therein data by accumulating electric charges in the body B or emitting the charges from the body B. If each of the memory cells MCs is, for example, nMISFET (Metal-Insulator Semiconductor Field Effect Transistor) as shown in FIG. 2, then each memory cell MC stores therein data by accumulating holes in the body B or emitting the accumulated holes from the body B. In the case of the FD-FBC, the body B is not necessarily the P-body but can be made of an intrinsic semiconductor.

A first gate electrode GE1 is provided on the first side surface of each body B via the first gate dielectric film GD1.

A plurality of first gate electrodes GE1 arranged in the column direction is connected to one another by one first gate line GL1 indicated by a broken line. The first gate line GE1 is connected to a bottom of each first gate electrode GE1 and extends in the column direction. The first gate electrodes GE1 and the first gate lines GL1 are, for example, plate electrodes and plate lines, respectively.

A second gate electrode GE2 is provided on the second side surface of each body B via the second gate dielectric film GD2. A plurality of second gate electrodes GE2 arranged in the row direction is connected to one another by one word line WL shown in FIG. 1. The second gate electrode GE2 and the word line WL are electrically isolated from the first gate electrode GE1 and the first gate line GL1, and different potentials can be applied to the first gate electrode GE1 and the first gate line GL1, respectively. As described later, the second gate electrodes GE2 and the word lines WL are formed integratedly, so that no contact is formed between one second gate electrode GE2 and the corresponding word line WL.

First side surfaces of the two adjacent Fin semiconductor layers 31 are opposed to each other and second side surfaces thereof are opposed to each other. If a trench between the two Fin semiconductor layers 31 having the first side surfaces opposed to each other is a first trench, and that between the two Fin semiconductor layers 31 having the second side surfaces opposed to each other is a second trench, both the first and second trenches extend in the column direction and alternately appear in the row direction. The first gate electrode GE1 and the first gate line GL1 are formed in one first trench. The second gate electrode GE2 and the word line WL are formed in the second trench.

Figure 3:
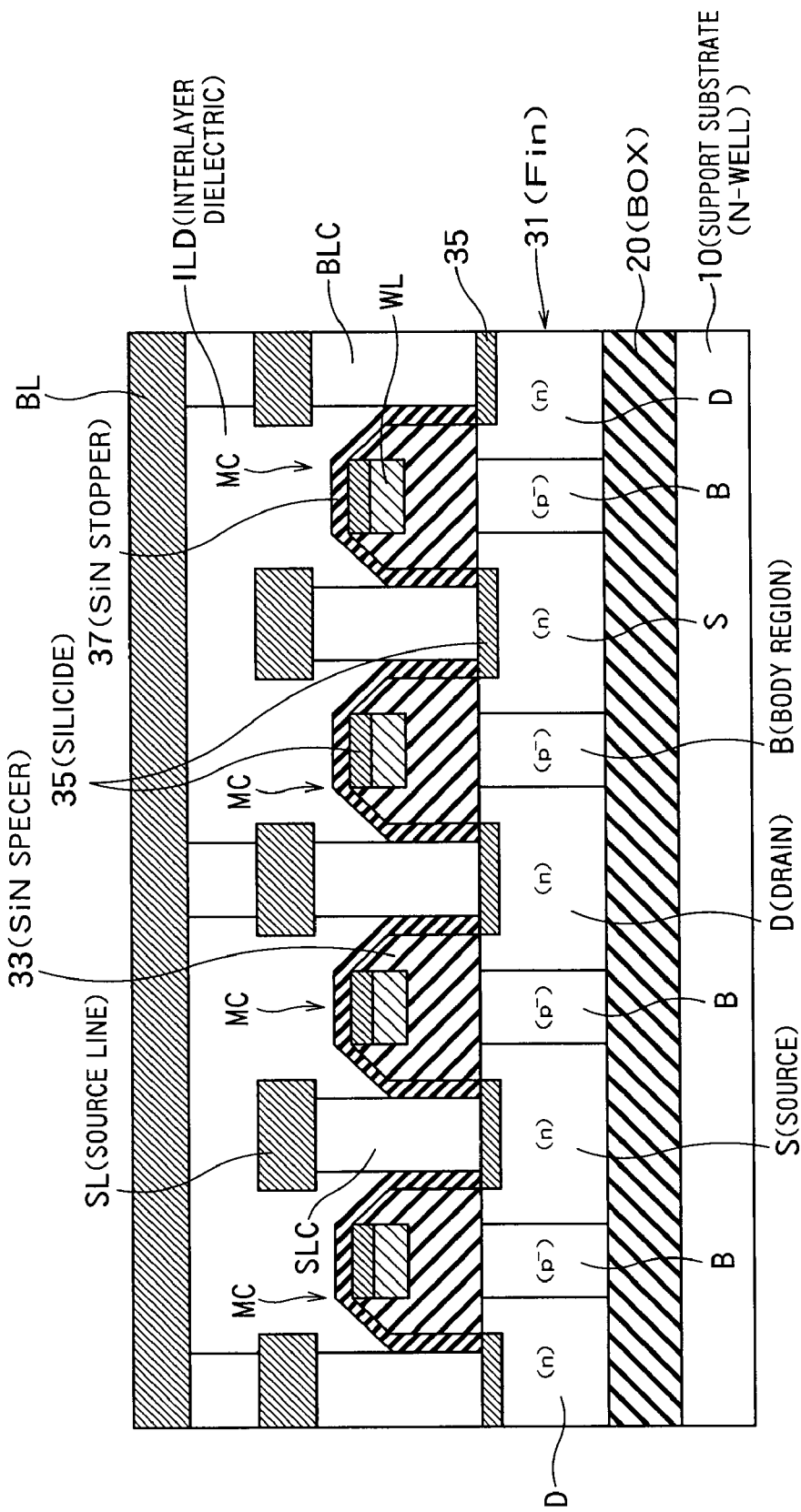
FIG. 3 is cross-sectional view taken along a line 3-3 of FIG. 2.

FIG. 3 is cross-sectional view taken along a line 3-3 of FIG. 2 (along one Fin semiconductor layer 31). As shown in FIG. 3, the memory cells MCs are formed in the Fin semiconductor layer 31. The Fin semiconductor layer 31 is provided on a buried insulating film (BOX (Buried Oxide) layer) 20. The BOX layer 20 is provided on a supporting substrate 10 (or an N-well formed in the supporting substrate 10).

The source layers S, the drain layers D, and the bodies B are formed in the Fin semiconductor layer 31 in order of S, B, D, B, S, B, D, B . . . . Since channels are formed on the respective side surfaces of each body B, an SiN spacer 33 thicker than the gate dielectric films GD1 and GD2 is formed on a top surface of the body B. The word line WL is buried in each SiN spacer 33.

A silicide layer 35 is provided on each word line WL to reduce a resistance of the word line WL. An SiN stopper 37 is provided to cover up the silicide layer 35 and the SiN spacer 33. The silicide layer 35 is also formed on surfaces of the source layers S and the drain layers D to reduce contact resistance.

Each source line contact SLC is connected between the silicide layer 35 on each source layer S and the corresponding source line SL. Each bit line contact BLC is connected between the silicide layer 35 on each drain layer D and the corresponding bit line BL. The source lines SLs and the bit lines BLs are surrounded by an interlayer dielectric film ILD.

Figure 4:
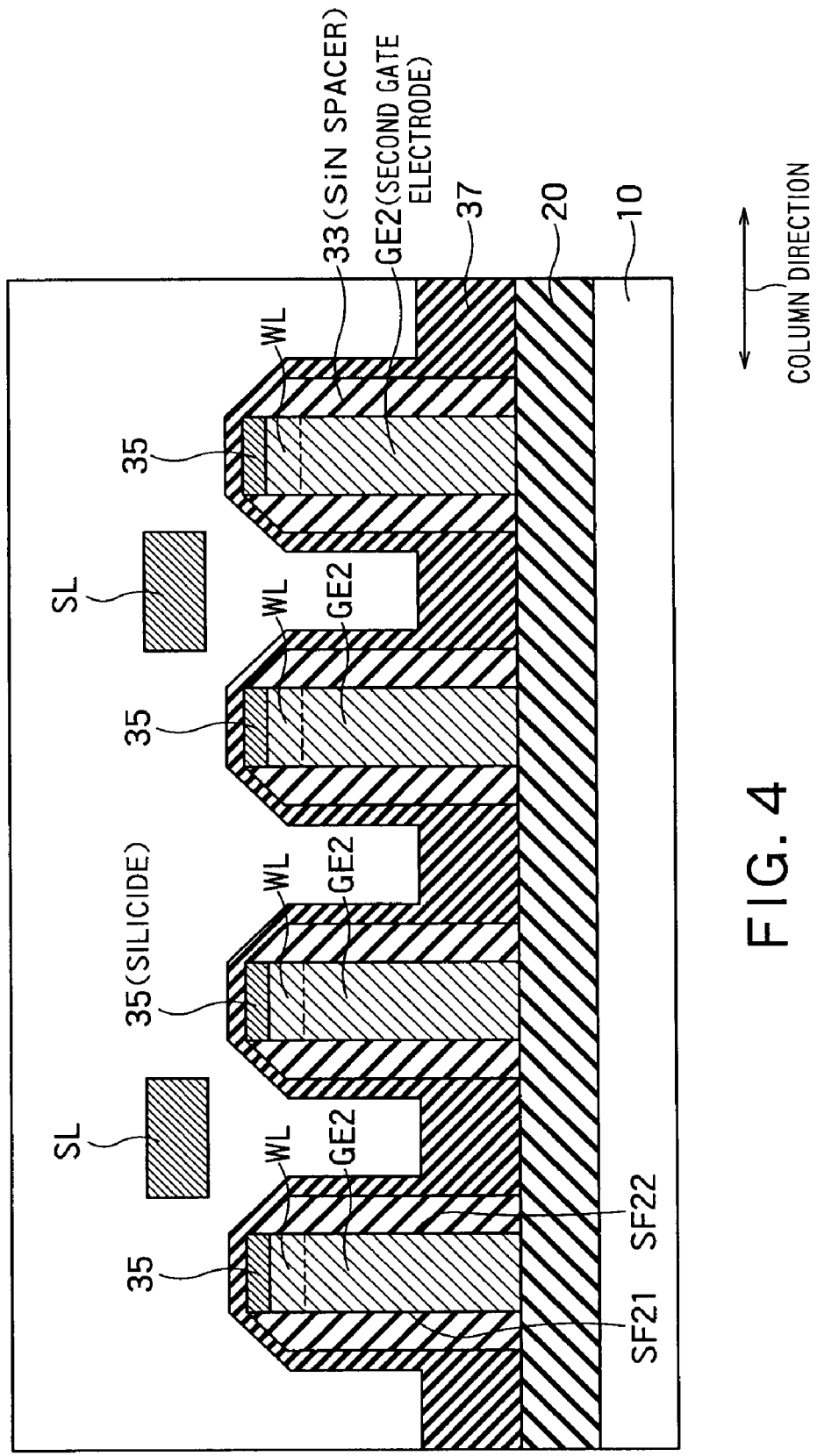
FIG. 4 is a cross-sectional view taken along a line 4-4 of FIG. 2.

FIG. 4 is a cross-sectional view taken along a line 4-4 of FIG. 2 (along the second trenches). The second gate electrodes GE2 and the word lines WLs appear in FIG. 4. Each second gate electrode GE2 is provided to correspond to one body B and filled up in the second trench so as to cover the entire second side surface of the body B with the second gate electrode GE2. Each second gate electrode GE2 has two side surfaces SF21 and SF22 oriented in the first direction (corresponding to a longitudinal direction in FIG. 4). One word line WL extends on the second gate electrode GE2 in the second direction (a direction toward a sheet of FIG. 4). Each second gate electrode GE2 and the word line WL extending thereon are formed integratedly using the same material (e.g., polysilicon or silicide). Accordingly, a boundary between the second gate electrode GE2 and the word line WL is indicated by a broken line in FIG. 4. The side surfaces SF21 and SF22 of each second gate electrode GE2 and the corresponding word line WLs are covered with the SiN spacer 33.

Figure 5:
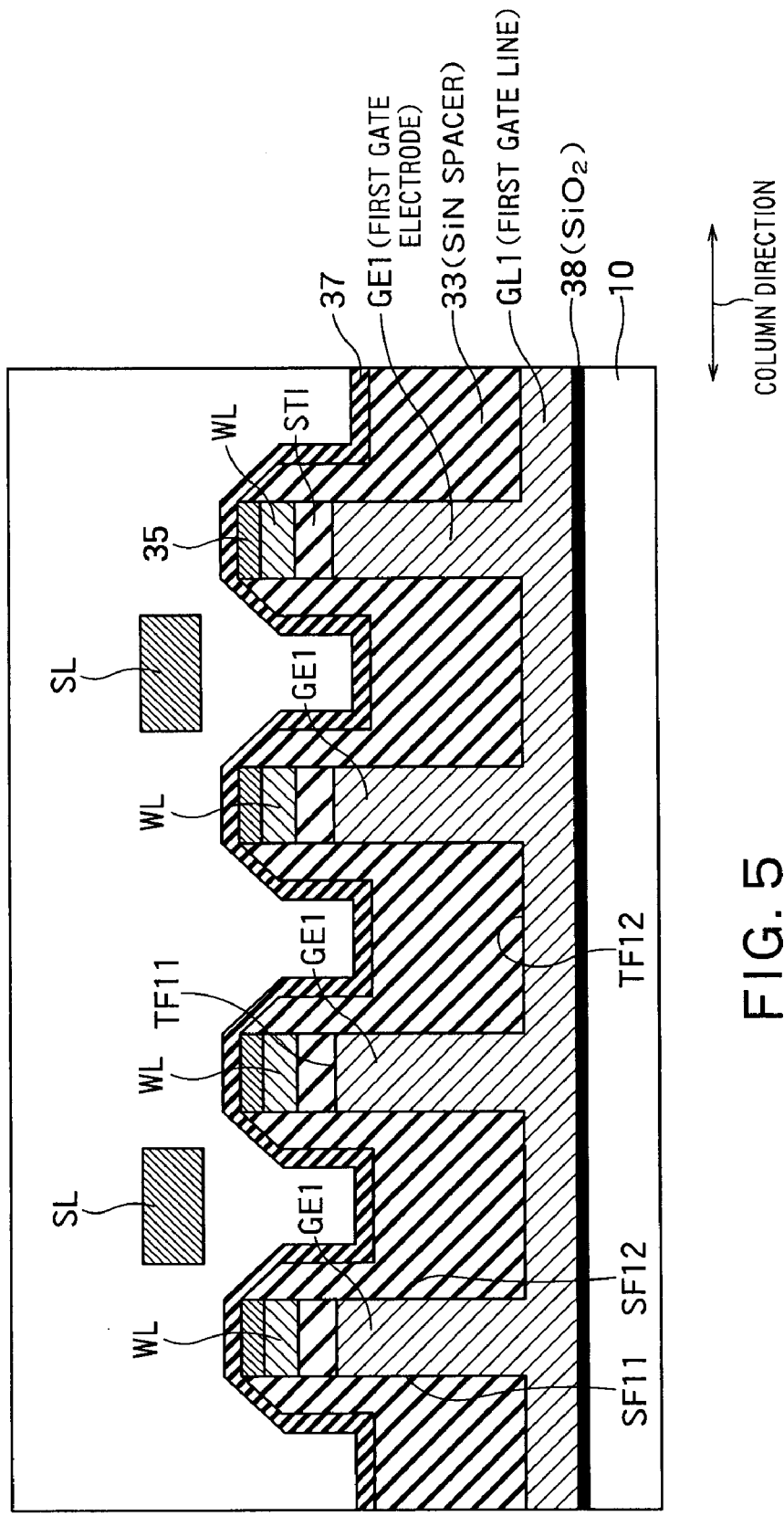
FIG. 5 is a cross-sectional view taken along a line 5-5 of FIG. 2.

FIG. 5 is a cross-sectional view taken along a line 5-5 of FIG. 2 (along the first trenches). The first gate electrodes GE1 and the first gate lines GL1 appear in FIG. 5. Each of the first gate electrodes GE1 includes a first part and a second part. In the first embodiment, the first part and the second part are often and simply referred to as the "first gate electrode GE1" and the "first gate line GL1", respectively. The first part of the first gate electrode GE1 is provided along the first side surface of each body B and entirely covers up the first side surface of the body B. The first part of the first gate electrode GE1 has two side surfaces SF11 and SF12 oriented in the first direction (corresponding to a longitudinal direction in FIG. 5). A distance between the two surfaces SF11 and SF12 is equal to a length of one word line WL along the first direction. This is because the first part of the first gate electrode GE1 is formed by burying the first trench with a first gate electrode material and partially removing the first gate electrode material in regions other than the word lines WL by etching. The first gate line GL1 (second part of the first gate electrode GE1) extends below the first part of the first gate electrode GE1 in the first direction. A top surface TF12 of the second part is lower than a top surface TF11 of the first part. Each first gate electrodes GE1 and the corresponding first gate lines GL1 are formed integratedly using the same material (e.g., polysilicon or silicide). Accordingly, a boundary between the first gate electrode GE1 and the first gate line GL1 is indicated by a broken line in FIG. 5. A part of an element isolation STI (Shallow Trench Isolation), which is provided on each first gate electrode GE1, isolates the word line WL from the first gate electrode GE1. Side surfaces of each first gate electrode GE1 and the corresponding word line WLs are covered with the SiN spacer 33.

Figure 6:
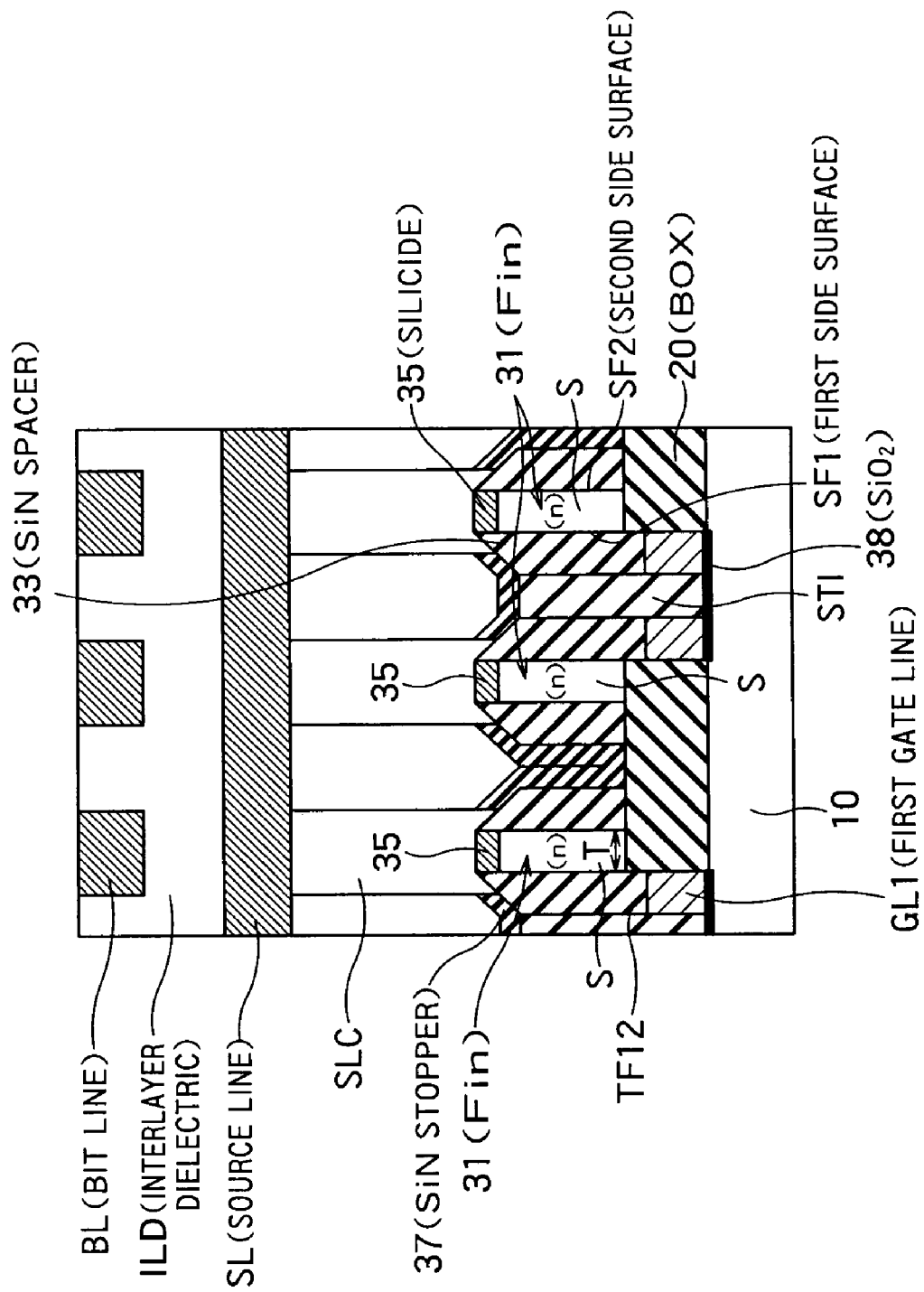
FIG. 6 is a cross-sectional view taken along a line 6-6 of FIG. 2.

FIG. 6 is a cross-sectional view taken along a line 6-6 of FIG. 2 (along one source line SL). The source line SL is connected to the silicide layer 35 on the source layer S via the source line contact SLC. A first side surface SF1 and a second side surface SF2 of the Fin semiconductor layer 31 are covered with the SiN spacer 33.

One first gate line GL1 is provided below the SiN spacer 33 provided on the first side surface SF1. Therefore, the top surface TF12 of the first gate line GL1 is formed at a position lower than a top surface of the BOX layer 20. That is, the top surface TF12 of the first gate line GL1 is located at the position lower than a bottom surface of the Fin semiconductor layer 31 (source layer S). Due to this, the first gate line GL1 does not front on the first side surface of the Fin semiconductor layer 31 (source layer S). Further, the first part of each first gate electrode GE1 fronts only on the first side surface of the corresponding body B and does not front on the first side surface of the source layer S. The same is true for the drain layer D. Namely, although not shown, the top surface TF12 of the first gate line GL1 is located at the lower position than a bottom surface of the drain layer D. Accordingly, the first gate line GL1 does not front on the first side surface of the Fin semiconductor layer 31 (drain layer D). Further, the first part of the first gate electrode GE1 fronts on the body B but does not front on the drain layer D. Due to this, there is no increase in a parasitic capacitance between the first gate electrode GE1 and the drain layer D. As a result, the FBC can be operated at high speed and power consumption of the FBC can be kept low. In the first embodiment, a silicon oxide film 38 is formed between each first gate line GL1 and the supporting substrate 10. The first gate electrodes GE1 are thereby electrically separated from the supporting substrate 10, so that a potential independent of a potential of the supporting substrate 10 can be applied to the first gate electrodes GE1. Moreover, since a parasitic capacitance between each first gate electrode GE1 and the corresponding source layer S is also small, the FBC can be operated at high speed even if a source potential is driven.

Furthermore, since the top surface TF12 of the first gate line GL1 is located at the lower position than the bottom surface of the corresponding Fin semiconductor layer 31, it is possible to prevent a short circuit between the first gate line GL1 and either the source layer S or the drain layer D of the Fin semiconductor layer 31 via the source line contact SLC or the bit line contact BLC. By setting the top surface TF12 of the first gate line GL1 lower than the bottom surface of the Fin semiconductor layer 31, there is no need to locate the first gate line GL1 and the Fin semiconductor layer 31 apart from each other. According to the first embodiment, therefore, it is possible to suppress increases in a source-gate capacitance and a gate-drain capacitance, prevent the short circuit between each first gate line GL1 and either the source layer S or the drain layer D of the corresponding Fin semiconductor layer 31, and reduce the size of the unit cell UC.

Figure 7:
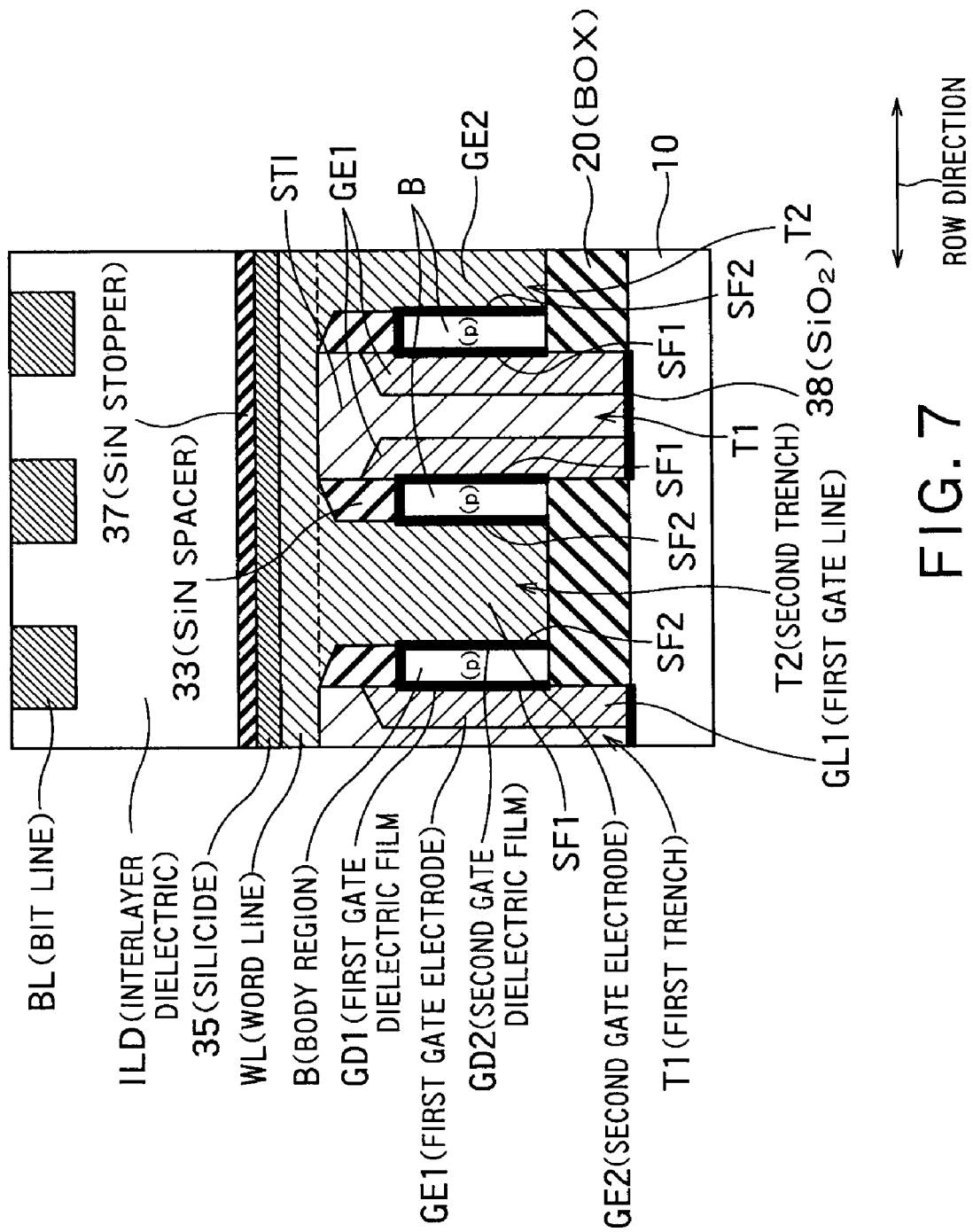
FIG. 7 is a cross-sectional view taken along a line 7-7 of FIG. 2.

FIG. 7 is a cross-sectional view taken along a line 7-7 of FIG. 2 (along one word line WL). The first parts of the first gate electrodes GE1, the second gate electrodes GE2, and cross-sections of the bodies B are shown in FIG. 7. Each second gate electrode GE2 is filled up in a region of each second trench T2, the region being interposed between the second side surfaces SF2 of the two adjacent bodies B. The two side surfaces SF2 of the bodies are opposed to each other, and the second gate electrode GE2 fronts on the second side surface of the body B via the second gate dielectric film GD2. Each of the second gate electrodes GE2 is provided to be common to and shared by the two adjacent bodies B. Further, the second gate electrodes GE2 extend downward from the word line WL. In other words, the word line WL passes and strides over the bodies B, extends in the row direction, connects the adjacent second gate electrodes GE2 to each other, and keeps isolated from the bodies B.

With reference to FIGS. 5 and 7, it is seen that each first gate line GL1 is formed integratedly with each of the first gate electrodes GE1 and extends in the column direction, and that each word line WL is formed integratedly with each of the second gate electrodes GE2 and extend in the row direction. Furthermore, the first gate lines GL1 and the word lines WLs extend in directions orthogonal to each other, and are formed in layers having different heights, respectively. Therefore, the first gate lines GL1 and the word lines WLs can extend without being in contact with each other. Namely, the first gate lines GL1 and the first gate electrode GE1 can be formed to be electrically separated from the word lines WLs and the second gate electrodes GE2. This can dispense with contact holes and contact plugs between the first gate lines GL1 and the first gate electrodes GE1 and between the word lines WLs and the second gate electrodes GE2. That is, according to the first embodiment, there is no need to provide word line contacts and plate line contacts. As a result, the distance D shown in FIG. 1 can be reduced, as already described.

As shown in FIG. 3, in the first embodiment, the word lines WLs extend in the row direction orthogonal to the extension direction of the Fin semiconductor layers 31 (column direction). Due to this, even if the two adjacent memory cells MCs share one bit line contact BLC and one source line contact SLC therebetween, no word line WL is shared therebetween. Due to this, selectivity for data write or read can be ensured between the two adjacent memory cells MCs. Since the two adjacent memory cells MCs can share one bit line contact BLC and one source line contact SLC therebetween, the cell size can be further reduced.

In the first embodiment, the first gate electrode GE1 is provided to entirely cover up the first side surface of each body B. Namely, the top surface TF11 of the first gate electrode GE1 is higher than the top surface of the body B below the word line WL. Due to this, a capacitance between the first gate electrode GE1 and the body B is made large, so that the threshold voltage difference increases between the "1" cell and the "0" cell.

In general, a threshold voltage of one FD-FBC does not depend on an impurity concentration of the body B but is decided by potentials applied to the body B by the first gate electrode GE1 and the second gate electrode GE2, respectively. If the impurity concentration of the body B is reduced, it is possible to effectively suppress junction leakage current and fluctuation in threshold voltage. Accordingly, by reducing the impurity concentration of the body B and making a thickness between the first side surface SF1 and the second side surface SF2 (a thickness of the Fin semiconductor layer 31) smaller, it is possible to suppress the leakage current and the fluctuation in the threshold voltage, and increase a threshold voltage difference $\Delta Vth$ between the "1" cell and the "0" cell.

In a FinFET, a channel is formed on each side surface of the body B. Due to this, even if the cell size is reduced and an area of the top surface of the body B is reduced, there is no need to decrease the height of the body B. If a source-drain distance (gate length or channel length) is made smaller while keeping the height of the body B constant, drain current increases. Data discrimination is made by a drain current difference between the "0" cell and the "1" cell. The FinFET can, therefore, easily maintain the signal difference between the "0" cell and the "1" cell.

If an area of the body portion facing the plate electrode decreases, the number of holes accumulated in the body B decreases. If the number of holes decreases, the problem occurs that fluctuation in threshold voltages of the "0" cells and the "1" cells among the memory cells MCs increase. However, in the FinFET, if the cell size is reduced and the source-drain distance is narrower, an area of each side surface of the body B can be easily kept constant by increasing the height of the body B (the Fin semiconductor layer 31). It is, therefore, possible to easily keep the number of holes accumulated in the body B.

The first gate lines GLs are provided to correspond to respective columns. It is thereby possible to independently control potentials of the first gate electrodes GE1 according to the columns. Needless to say, a common potential can be applied to all the first gate electrodes GE1.

A thickness T of each Fin semiconductor layer 31 in the second direction (see FIG. 6) is, for example, 0.5F smaller than F. In this way, by reducing the thickness T, the signal difference between the "1" cell and the "0" cell increases. As described later with reference to a manufacturing method, the thickness T according to the first embodiment is decided not by lithography but by a thickness of the spacer 33. In the first embodiment, therefore, there is no need to execute high-accuracy lithographic steps to downsize the Fin semiconductor layers 31.

A specific example of operation performed by each of the memory cells MCs will be described. It is assumed that the memory cell MC is an NMISFET. It is defined that a state in which the number of holes accumulated in the body B of the memory cell MC is large is data "1" and that a state in which the number of holes accumulated in the body B thereof is small is data "0". It is also assumed that the first gate electrode GE1 and the first gate line GL1 are the plate electrode and the plate line, respectively.

To write data "1" to the memory cell MC, the memory cell MC is set to operate in a saturation region. A voltage of the word line WL connected to the memory cell MC is biased to 1.5 V and that of the bit line BL connected to the memory cell MC is biased to 1.5 V. A source voltage is equal to a ground voltage (0 V). A plate voltage is kept to, for example, −3 V. By doing so, impact ionization takes place near the drain D of the memory cell MC and many pairs of electrons and holes are generated. The electrons generated by the impact ionization are emitted to the drain D whereas the holes generated by the impact ionization are accumulated in the lower-potential body B. If a balance is held between a hole current generated by the impact ionization and a forward current at a pn junction between the body B and the source S, the body voltage turns into an equilibrium state. The body voltage in the equilibrium state is about 0.7 V. The plate electrode acts to accumulate the holes in the body B by forming a potential well in a surface of the body B opposed to the plate electrode. In the FD-FBC, if the plate voltage is near 0 V, the number of holes that can be accumulated in the surface of the body B is small. Due to this, the threshold voltage difference is small between the "0" cell and the "1" cell. If the plate voltage is large negative value, more holes can be accumulated in the surface of the body B, thus increasing the threshold voltage difference.

To write data "0" to the memory cell MC, the voltage of the bit line BL connected to the memory cell MC is reduced to negative voltage. For example, a potential of the bit line BL is reduced to −1.5 V. By doing so, a pn junction between the body B and the drain D is biased largely in forward direction. The holes accumulated in the body B are emitted to the drain D and the data "0" is stored in the memory cell MC.

In a data read operation for reading data from the memory cell MC, the word line WL connected to the memory cell MC is activated similarly to a data write operation but the voltage of the bit line BL connected to the memory cell MC is set lower than that during the data write operation. For example, the voltage of the word line WL is set to 1.5 V and that of the bit line BL is set to 0.2 V. The memory cell MC is set to operate in a linear region. The "0" cell and the "1" cell differ in threshold voltage due to the difference in the number of holes accumulated in the body B. By sensing this threshold voltage difference, it is discriminated whether the data stored in the memory cell MC is "1" or "0". The reason for setting the voltage of the bit line BL low when the data "1" is read from the memory cell MC is as follows. If the voltage of the bit line BL is set high and the memory cell MC is biased into a saturation region, data "0" is possibly changed to data "1" by the impact ionization when the data "0" is read from the memory cell MC.

A method of manufacturing the FBC memory device according to the first embodiment will next be described. FIGS. 8 to 11 show cross sections corresponding to FIG. 7. First, an SOI substrate is prepared. The SOI substrate is configured to include the supporting substrate 10 made of silicon, the BOX layer 20 provided on the supporting substrate 10, and an SOI layer 30 provided on the BOX layer 20. The BOX layer 20 is a silicon oxide film and has a thickness of about 150 nanometers (nm). The SOI layer 30 is made of monocrystalline silicon and has a thickness of about 300 nm.

As described later, the SOI layer 30 is to serve as the Fin semiconductor layer 31 after being patterned.

As shown in FIG. 8, a silicon oxide film 41 is formed on the SOI layer 30. An SiN mask 43 is deposited on the silicon oxide film 41. The SiN mask 43 is patterned into a shape of the first trenches T1. Using the SiN mask 43 as a mask, the SOI layer 30 and the BOX layer 20 are etched by RIE (Reactive Ion Etching). As a result, the first trenches T1 extending in the column direction are formed into stripes. At this step, the first side surface SF1 of each Fin semiconductor layer 31 is formed. One first trench T1 is formed to correspond to two bit lines BLs.

Figure 9A:
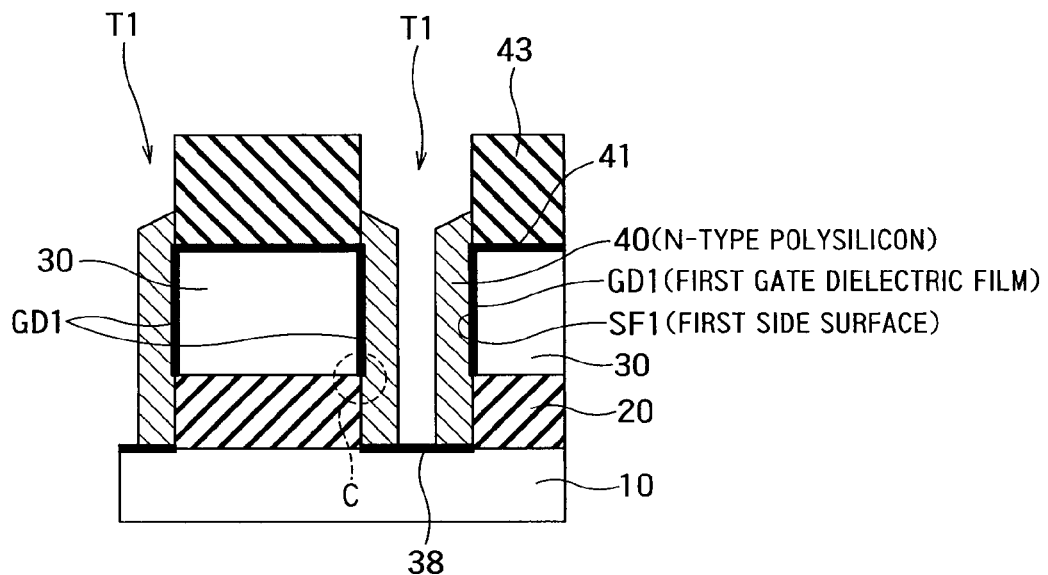
Figure 9B:
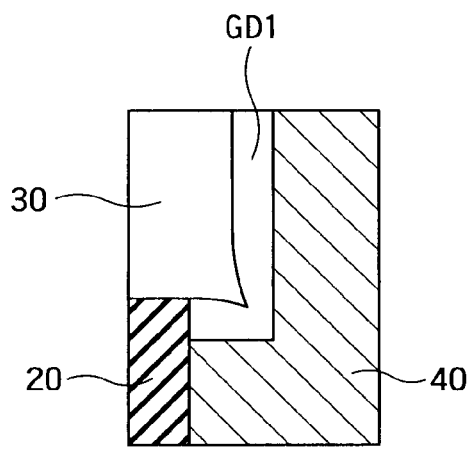
Figure 9C:
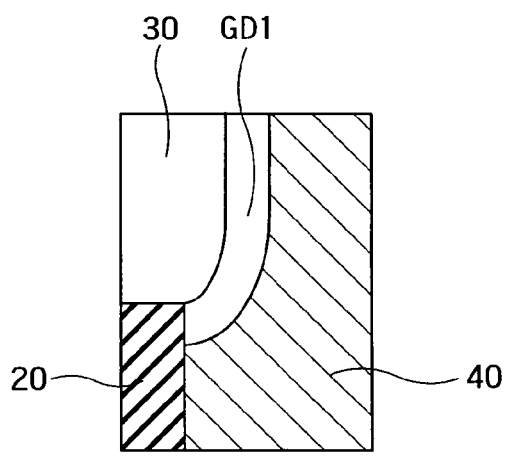
Figure 10:
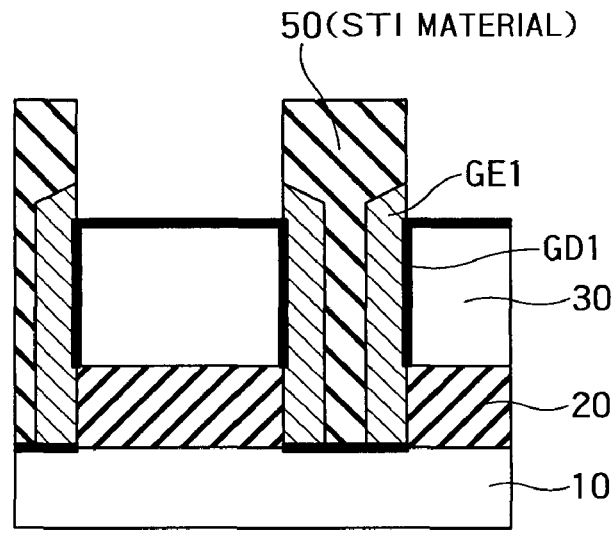

As shown in FIGS. 9A to 9C, the first gate dielectric film GD1 is formed on side surfaces of the SOI layer 30. The first gate dielectric film GD1 is, for example, a silicon oxide film an ONO film, or is made of a dielectric film with high dielectric constant such as hafnium silicate. At the time of forming the first gate dielectric film GD1, the dielectric film 38 is also formed on a surface of the exposed supporting substrate 10. The dielectric film 38 isolates the first gate electrodes GE1 from the supporting substrate 10.

A first gate electrode material 40 is deposited on inside surfaces of the first trenches T1 and on the SiN mask 43. The first gate electrode material 40 is, for example, N-type-doped polysilicon. By etching back the first gate electrode material 40 by anisotropic etching, the first gate electrode material 40 is left only on side surfaces of the first trenches T1. As a result, the first electrode material 40 is formed as shown in FIG. 9A. At this time, the first gate electrode material 40 is formed to entirely cover up the first side surfaces SF1 in a range from a top to a bottom of the SOI layer 30. As shown in FIG. 9B, if the bottom corner of the SOI layer 30 is angular, then electric field concentrates on corners, and a breakdown voltage between each first gate electrode GE1 and the corresponding body B decreases. In the first embodiment, as shown in FIG. 9C, the bottom corner of the SOI layer 40 is formed to be rounded. It is thereby possible to relax the concentration of the electric field and suppress a leakage current between the first gate electrode GE1 and the body B.

Next, an STI material 50 that is a silicon oxide film is deposited in the first trenches T1 and on the SiN mask 43. The STI material 50 on the SiN mask 43 is polished by CMP (Chemical Mechanical Polishing). Further, the SiN mask 43 is removed using a hot phosphoric acid solution, thereby obtaining a structure shown in FIG. 10.

Figure 11:
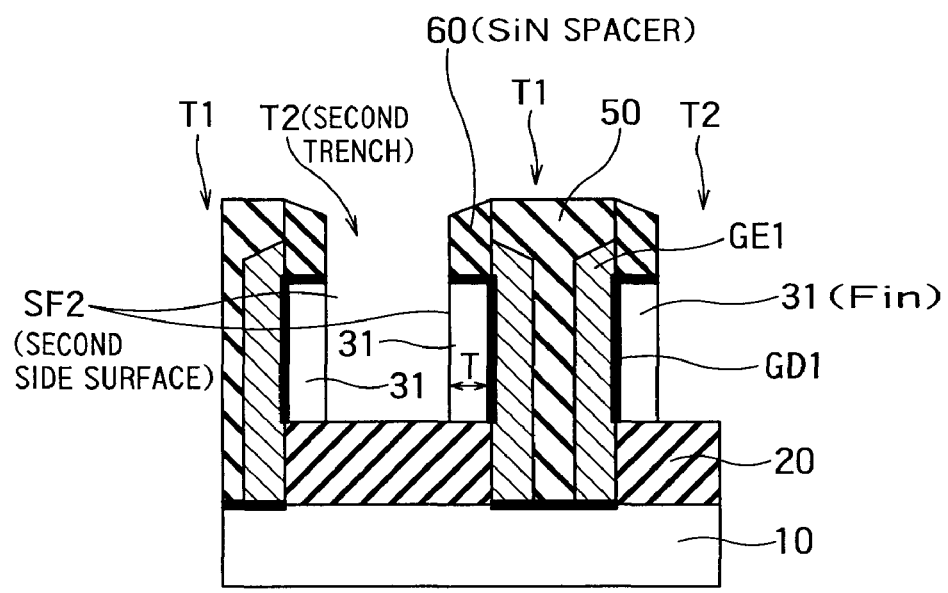

As shown in FIG. 11, SiN spacers 60 are formed on side surfaces of the STI material 50 and the first gate electrode material 40. At this time, a silicon nitride film having a thickness smaller than F is deposited on an entire surface of the structure and etched back by anisotropic etching. By doing so, the SiN spacers 60 are left only on the side surfaces of the STI material 50 and the first gate electrode material 40. A width (thickness) of each SiN spacer 60 in the row direction is T smaller than F. Using the SiN spacers 60 and the STI material 50 as a mask, the SOI layer 30 is anisotropically etched. As a result, the second trenches T2 extending in the first direction are formed so that each of the second trenches T2 is present between the two adjacent first trenches T1. At the same time, the Fin semiconductor layer 31 having the thickness T (<F) is formed between one first trench T1 and one second trench T2. The second side surface SF2 of each Fin semiconductor layer 31 is also formed. As can be seen, the thickness T of the Fin semiconductor layer 31 is decided by the thickness T of each SiN spacer 60. It is thereby possible to make the thickness T of the Fin semiconductor layer 31 smaller than F without using the lithography.

Figure 12:
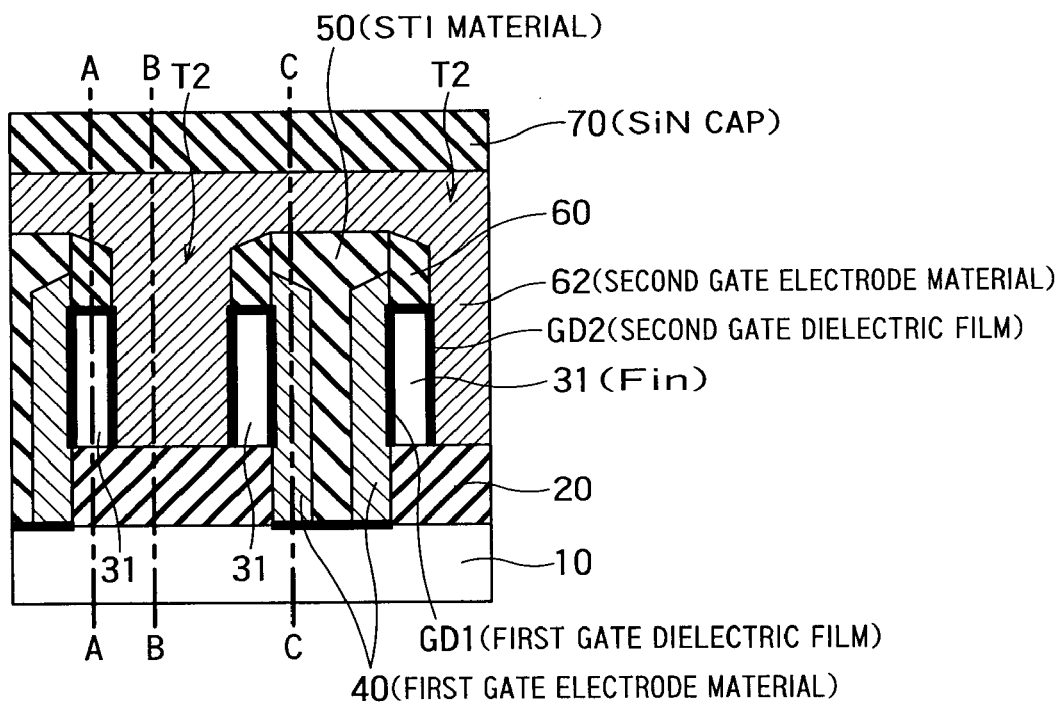

As shown in FIG. 12, the second gate dielectric film GD2 is formed on each of the second side surfaces SF2. A material of the second gate dielectric films GD2 can be similar to that of the first gate dielectric films GD1. A second gate electrode material 62 is deposited in the second trenches T2 and above the Fin semiconductor layers 31. The second gate electrode material 62 is, for example, N-type-doped silicon.

Figure 13:
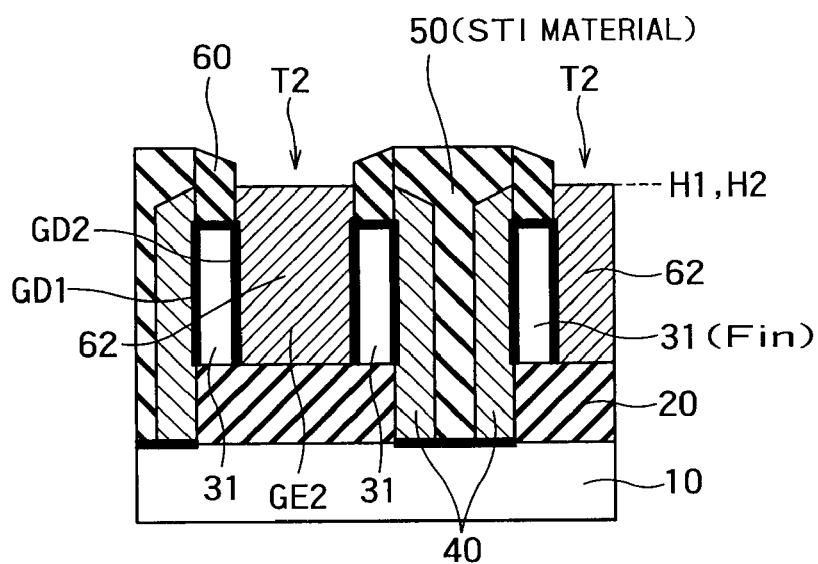
Figure 14A:
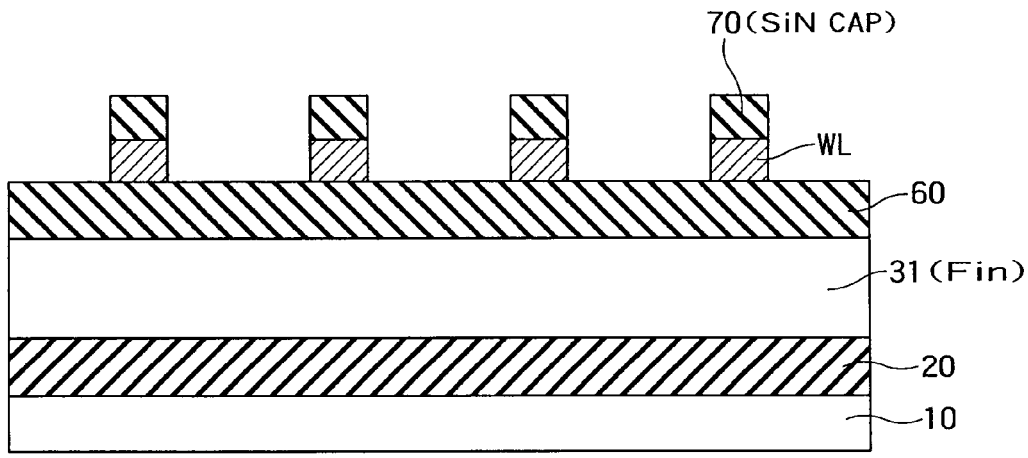
Figure 14B:
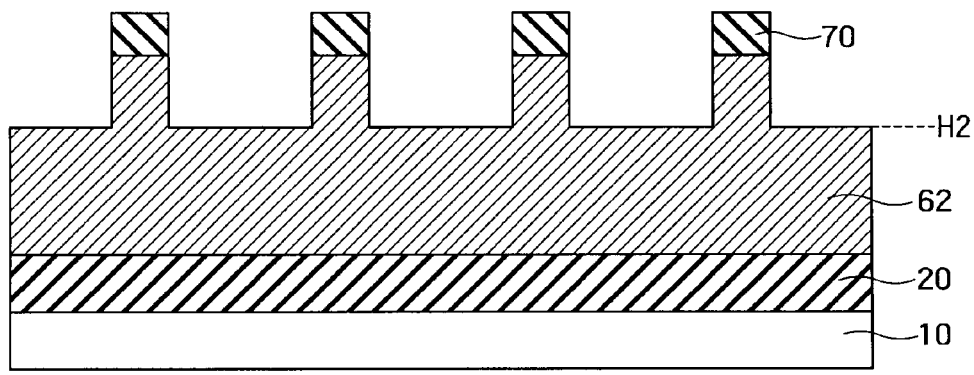
Figure 14C:
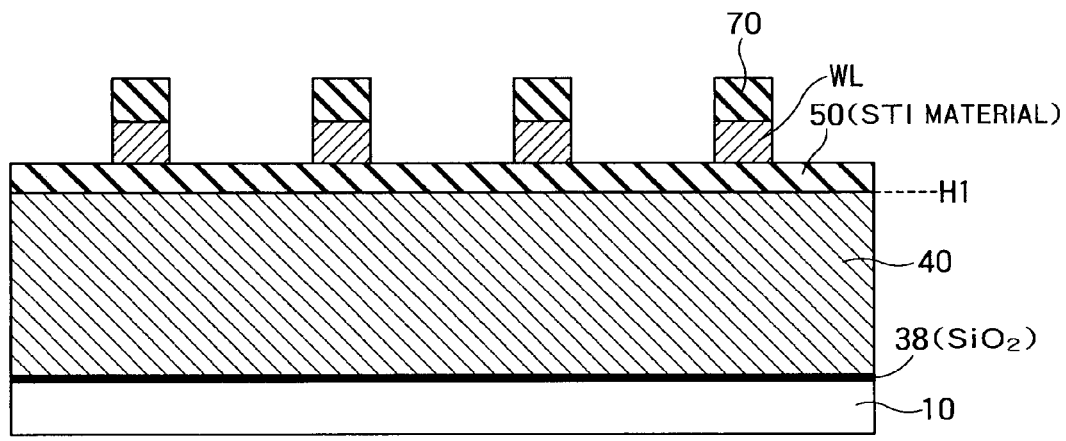

A silicon nitride film is deposited on the second gate electrode material 62 and patterned into a shape of word lines WLs. As a result, an SiN cap 70 shown in FIG. 12 is formed. Using the SiN cap 70 as a mask, the second gate electrode material 62 is etched. At this time, the second gate electrode material 62 is etched so that a height of a top surface of the second gate electrode material 62 is between those of the STI material 50 and the Fin semiconductor layers 31 in regions other than the word lines WLs. Typically, a height H2 of the top surface of the second gate electrode material 62 is almost equal to a height H1 of the top surface of the first gate electrode GE1. FIG. 13 is a cross-sectional view in the row direction showing a cross section of the regions other than the word line WLs. The cross section along the word line WL is still similar to that shown in FIG. 12. At this step, the word lines WLs are formed. The word lines WL appear in FIGS. 14A to 14C which are cross-sectional views in the column direction. FIGS. 14A to 14C are cross-sectional views taken along a line A-A, a line B-B, and a line C-C of FIG. 12, respectively. As shown in FIGS. 14A and 14C, the word lines WLs are formed on the STI material 50 and the spacers 60. As shown in FIG. 14B, the top surface of the second gate electrode material 62 is etched down to the height H2 in the regions other than the word lines WLs.

While the SiN cap 70 and the SiN spacers 60 remain left, the STI material 50 is etched so that the top surface of the first gate electrode material 40 is exposed.

Figure 60:
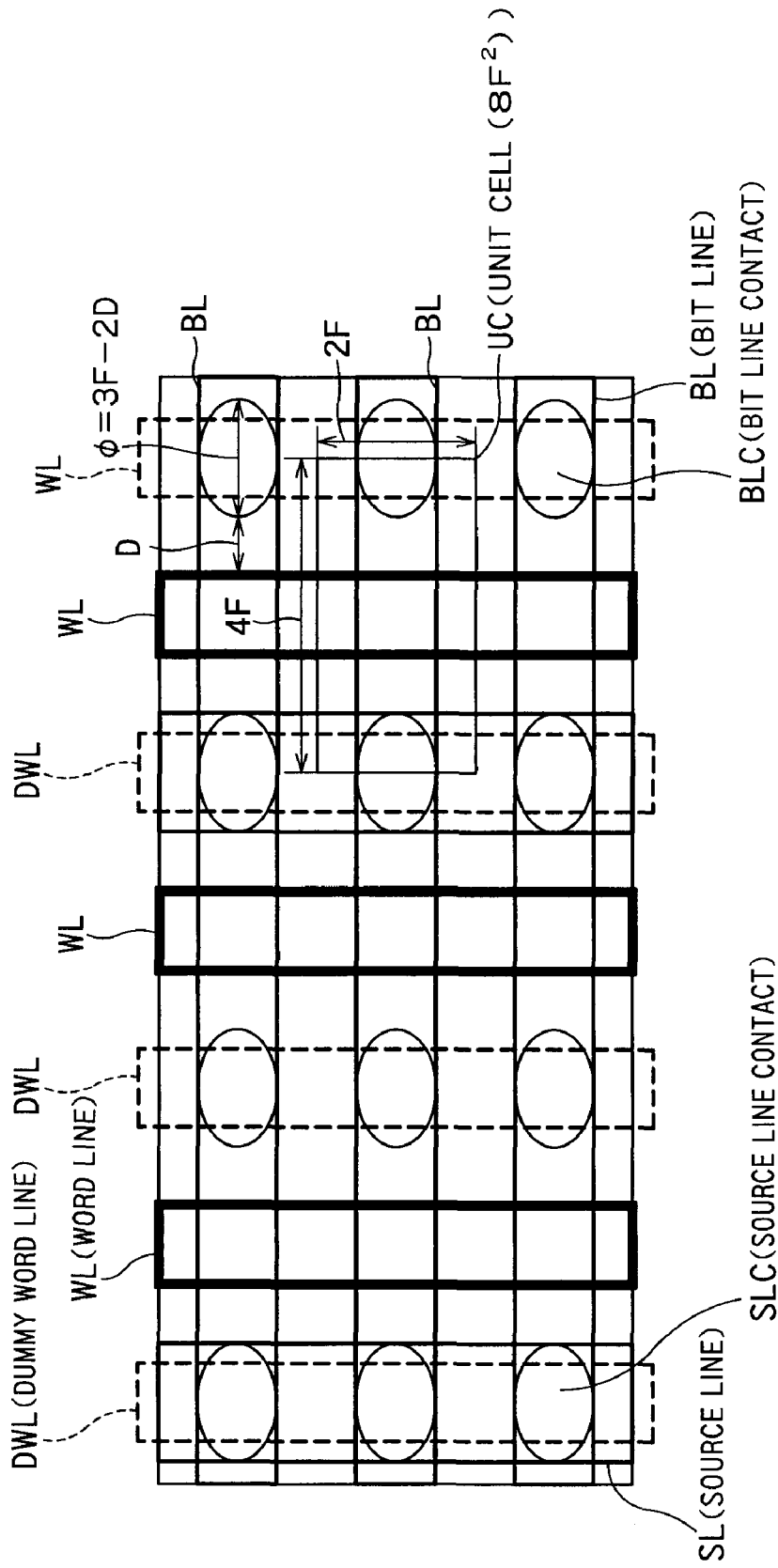
FIG. 60 is a plan view showing wirings of an FBC memory device according to a fifth embodiment of the present invention.

Next, using the SiN cap 70 and the SiN spacers 60 as a mask, the first gate electrode material 40 and the second gate electrode material 62 are anisotropically etched. Since the top surface of the first gate electrode material 40 is exposed, the first gate electrode material 40 is etched as well as the second gate electrode material 62. As a result, as shown in FIGS. 15 to 17C, the first gate electrode GE1 and the second gate electrode GE2 are formed on the first side surface SF1 and the second side surface SF2 of each Fin semiconductor layer 31. FIGS. 15 to 17C are cross-sectional views subsequent to FIGS. 12 to 14C, respectively. Since each of the word lines WLs is covered with the SiN cap 70, the cross section shown in FIG. 15 remains substantially the same as that shown in FIG. 12. However, as shown in FIG. 60, the second gate electrode material 62 is entirely removed in the regions other than the word lines WLs. As a result, a plurality of word lines WLs and second gate electrodes GE2 separated to correspond to respective rows are formed (see FIG. 17A). Furthermore, as shown in FIG. 16, the first gate electrode material 40 is etched down to a lower level than the top surface of the BOX layer 20 (the bottom surfaces of the Fin semiconductor layers 31) in the regions other than the word lines WLs. As a result, the first gate lines GL1 are formed so as not to front on the Fin semiconductor layers 31. Since the first gate lines GL1 do not front on the Fin semiconductor layers 31, the first gate lines GL1 are out of contact with the source layers S or the drain layers D and do not increase gate-source capacitances and gate-drain capacitances.

Figure 15:
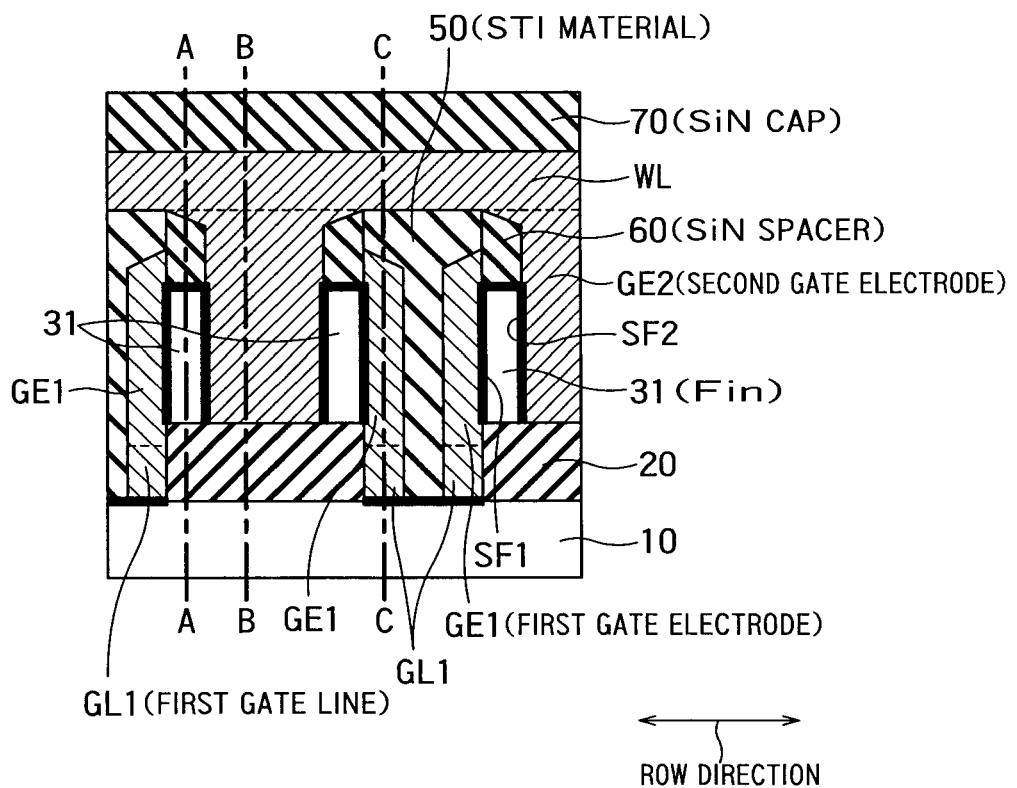
Figure 16:
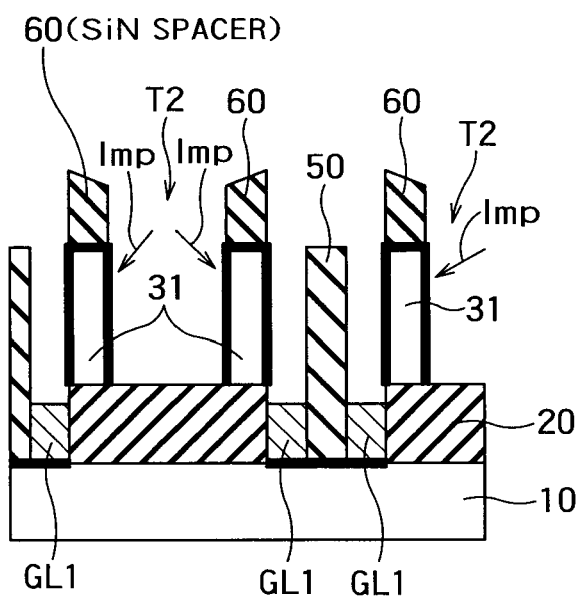
Figure 17A:
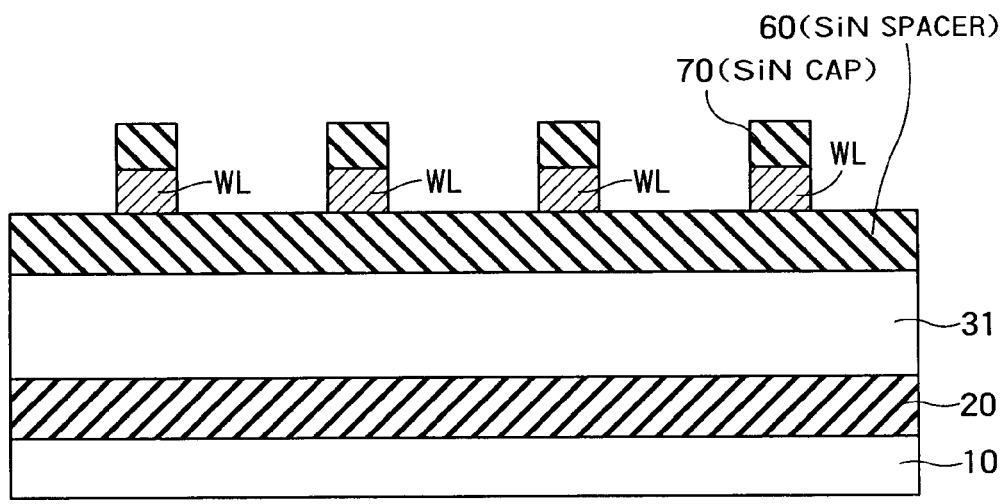
Figure 17B:
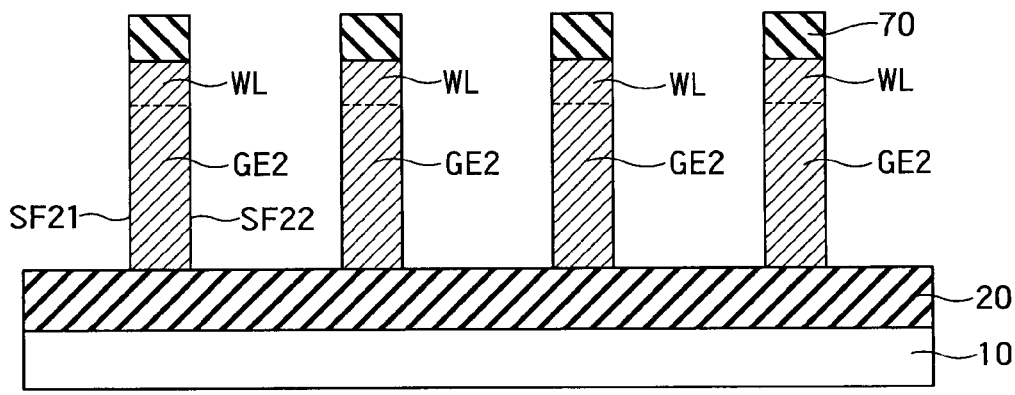
Figure 17C:
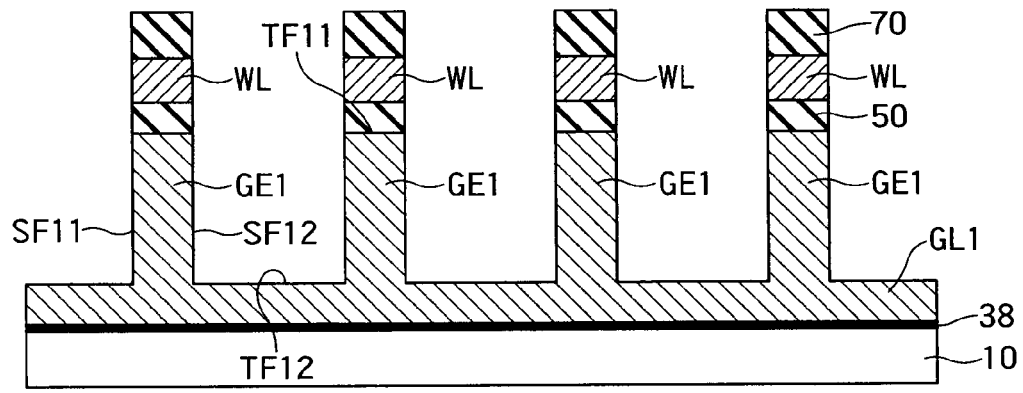
Figure 18:
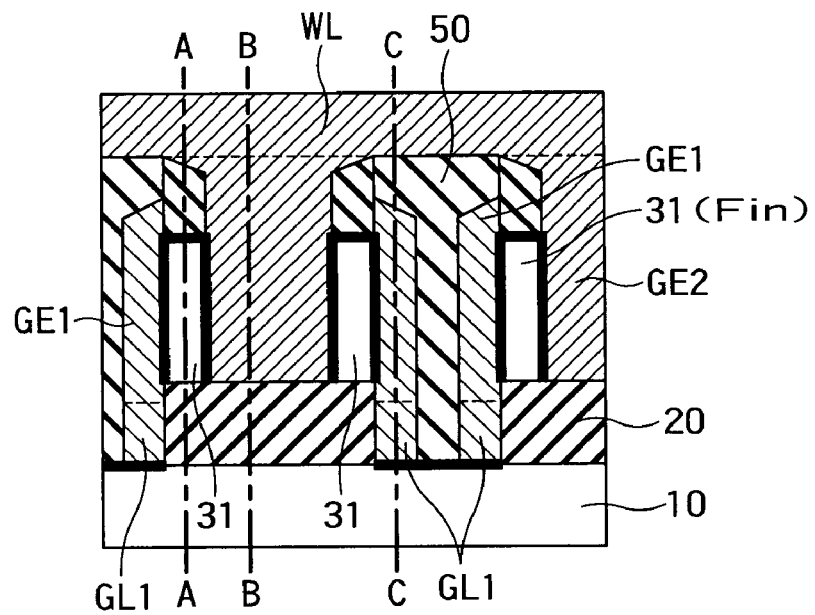

FIGS. 17A to 17C are cross-sectional views in the column direction, which views are taken along a line A-A, a line B-B, and a line C-C of FIG. 15, respectively. As shown in FIGS. 17A and 17C, the word lines WLs are separate from the Fin semiconductor layers 31 and the first gate electrodes GE1. As shown in FIG. 17B, the word lines WLs are connected to upper portions of the second gate electrodes GE2. The second gate electrodes GE2 are separated to correspond to the respective rows. As shown in FIG. 17C, each of the first gate lines GL1 is connected to bottoms of the first gate electrodes GE1.

As can be seen from FIGS. 15 and 17C, the word lines WLs extend and stride above the Fin semiconductor layers 31 in the row direction whereas the first gate lines GL1 extend below the Fin semiconductor layers 31 in the column direction. As can be seen from FIGS. 17B and 17C, positions of the two side surfaces SF21 and SF22 of each second gate electrode GE2 oriented in the first direction coincide with those of the two side surfaces SF11 and SF12 of each first gate electrode GE1 oriented in the first direction, respectively. In this manner, according to the first embodiment, the first gate electrodes GE1, the first gate lines GL1, the second gate electrodes GE2, and the word lines WLs can be formed in a self-aligned fashion using the same mask (the SiN spacers 60 and the SiN cap 70). As a result, the fluctuation in threshold voltage resulting from a deviation in formation position between the first gate electrodes GE1 and the second gate electrodes GE2 can be suppressed.

A conventional method of manufacturing a Fin-MISFET includes steps of forming Fin semiconductor layers, forming a gate dielectric film simultaneously on two side surfaces of each of the Fin semiconductor layers, depositing gate electrode materials, and patterning gate electrodes (that is, anisotropically etching gate electrodes). With the conventional manufacturing method, the gate dielectric films on the two side surfaces are formed out of the same material to have the same thickness, so that sufficient memory cell characteristics such as data retention time cannot be ensured. Besides, since the gate electrodes on the two respective side surfaces are forced to be made of the same material and to have the same shape, the cell size cannot be reduced while different voltages can be applied to the two electrodes.

By contrast, the manufacturing method according to the first embodiment includes steps of forming the first trenches to expose the first side surfaces, filling the first trenches with the first gate dielectric film and the first gate electrode material, forming the second trenches to expose the second side surfaces, filling the second trenches with the second gate dielectric film and the second gate electrode material, and patterning the first gate electrode material and the second gate electrode material using the same mask (SiN cap 70) having the pattern of word lines WLs. As a result, each memory cell MC can include the first and second gate dielectric films different in thickness. Furthermore, each memory cell MC can include the first and second gate electrodes different in material and shape. By using the second gate dielectric film having a relatively small thickness from 3 nm to 6 nm, high drain current can be obtained. By using the first gate dielectric film having a relatively large thickness from 10 nm to 20 nm, the electric field can be reduced during data holding time and long data retention time can be obtained. Further, by forming the first gate electrode GE1 using P-type polysilicon, a state in which many holes can be accumulated in the surface of the body B of each memory cell MC at lower negative plate voltage can be realized. Therefore, there is no need to provide a circuit for generating high negative plate voltage and to drive the circuit. As can be seen, the manufacturing method according to the first embodiment enables each memory cell MC to have optimum structures for the first gate electrode GE1 and the second gate electrode GE2, respectively.

Next, N-impurity ions are implanted from an oblique direction indicated by arrows Imp shown in FIG. 16 or plasma doping is performed. By implanting the impurity ions from the side surfaces of the Fin semiconductor layers 31, an extension layer is formed in each of the source and drain regions in each of the Fin semiconductor layers 31. At this time, the first and second side surfaces of the body B of each Fin semiconductor layer 31 are covered with the first gate electrode GE1 and the second gate electrode GE2, respectively. Due to this, no impurity ions are implanted into the body B. To be more strict, since the first and second side surfaces of the body B are covered with the first gate electrode GE1 and the second gate electrode GE2, respectively, the region in the Fin semiconductor layer 31 into which no N-impurity ions are implanted serves as the body B. The body B is formed in a self-aligned fashion to the positions of the first gate electrode GE1 and the second gate electrode GE2.

Next, the SiN spacers 60 on the Fin semiconductor layers 31 and the SiN cap 70 on the word lines WLs are removed. As shown in FIG. 18 to 20C, the SiN spacers 60 are formed. FIGS. 18 to 20C are cross-sectional views subsequent to FIGS. 15 to 17C, respectively. FIGS. 20A to 20C are cross-sectional views in the column direction which views are taken along a line A-A, a line B-B, and a line C-C of FIG. 18, respectively. The SiN spacers 33 are formed to cover up side surfaces of the source and drain regions, side surfaces and bottoms of the word lines WLs, side surfaces of the second gate electrodes GE2, side surfaces of the first gate electrodes GE1, and top surfaces of the first gate lines GL1.

Figure 19:
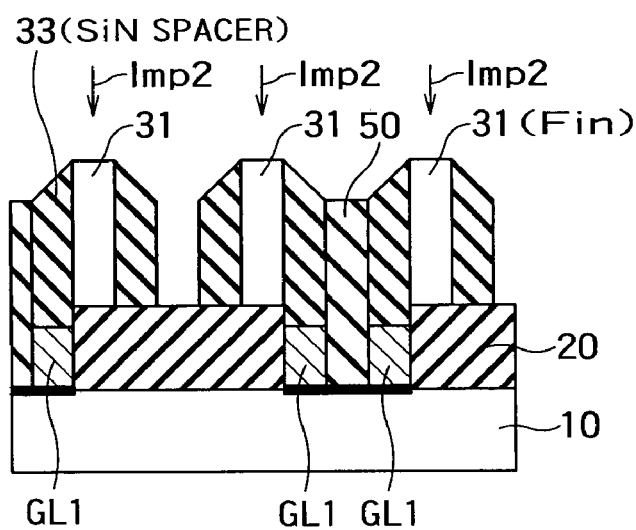
Figure 20A:
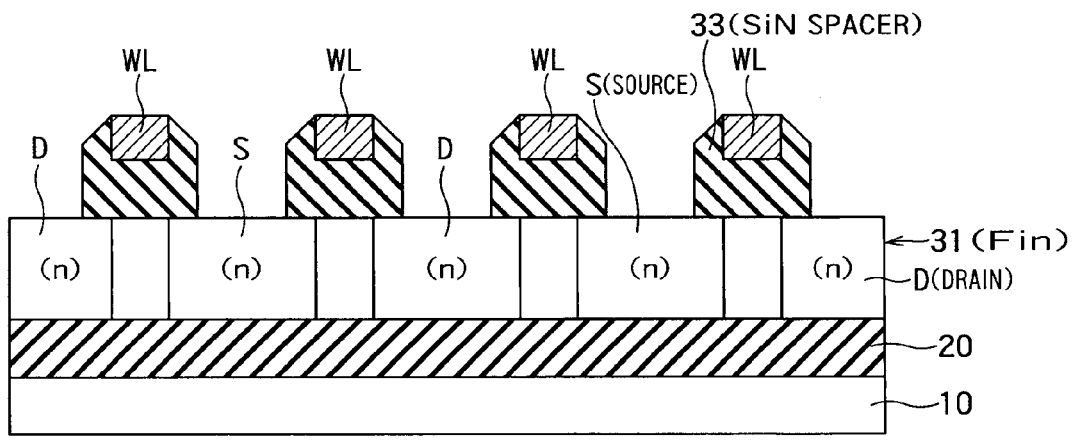
Figure 20B:
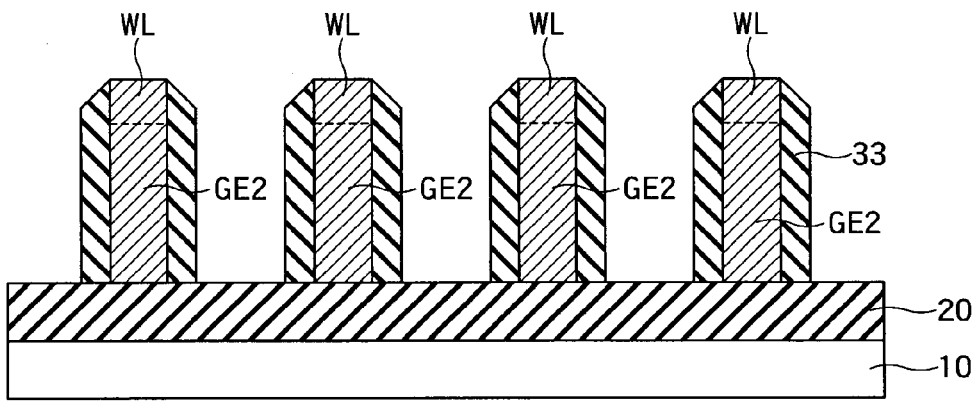
Figure 20C:
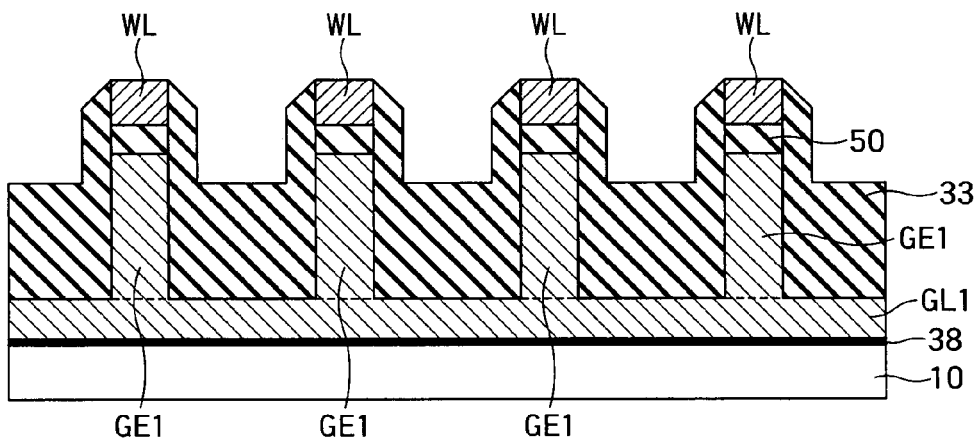

As indicated by arrows Imp2 shown in FIG. 19, impurity ions are implanted into the Fin semiconductor layers 31 from the top surfaces thereof. Heavily doped regions of the source layers S and the drain layers D are thereby formed. An impurity concentration of the heavily doped regions is higher than that of the extension layers.

Figure 21A:
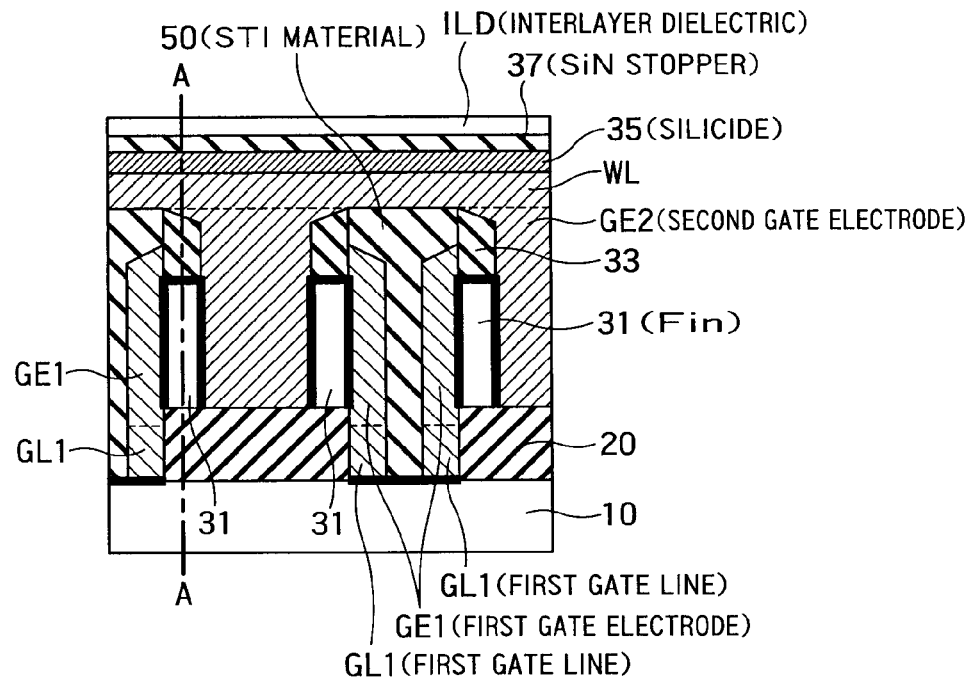
Figure 21B:
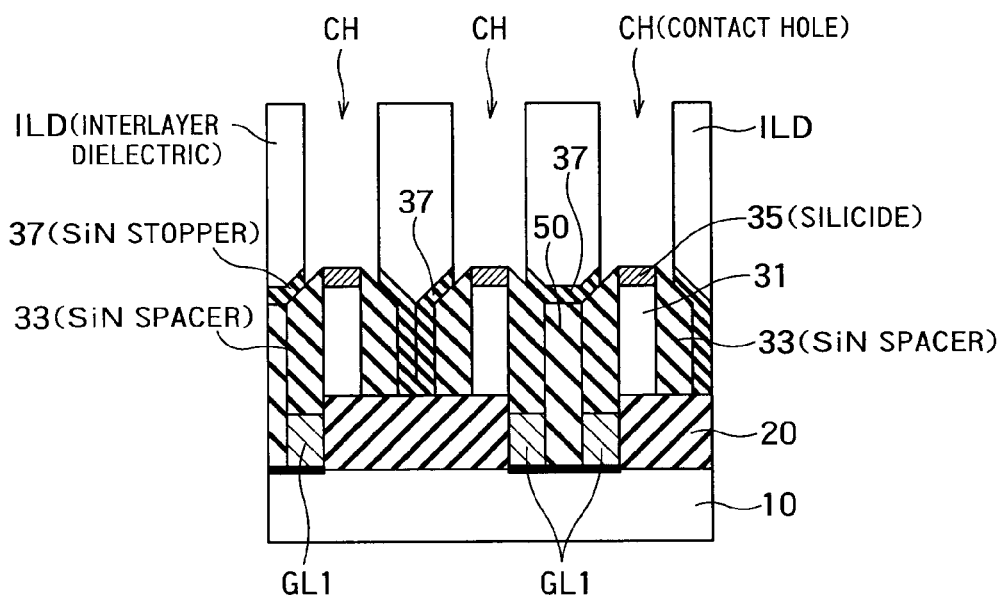
Figure 22:
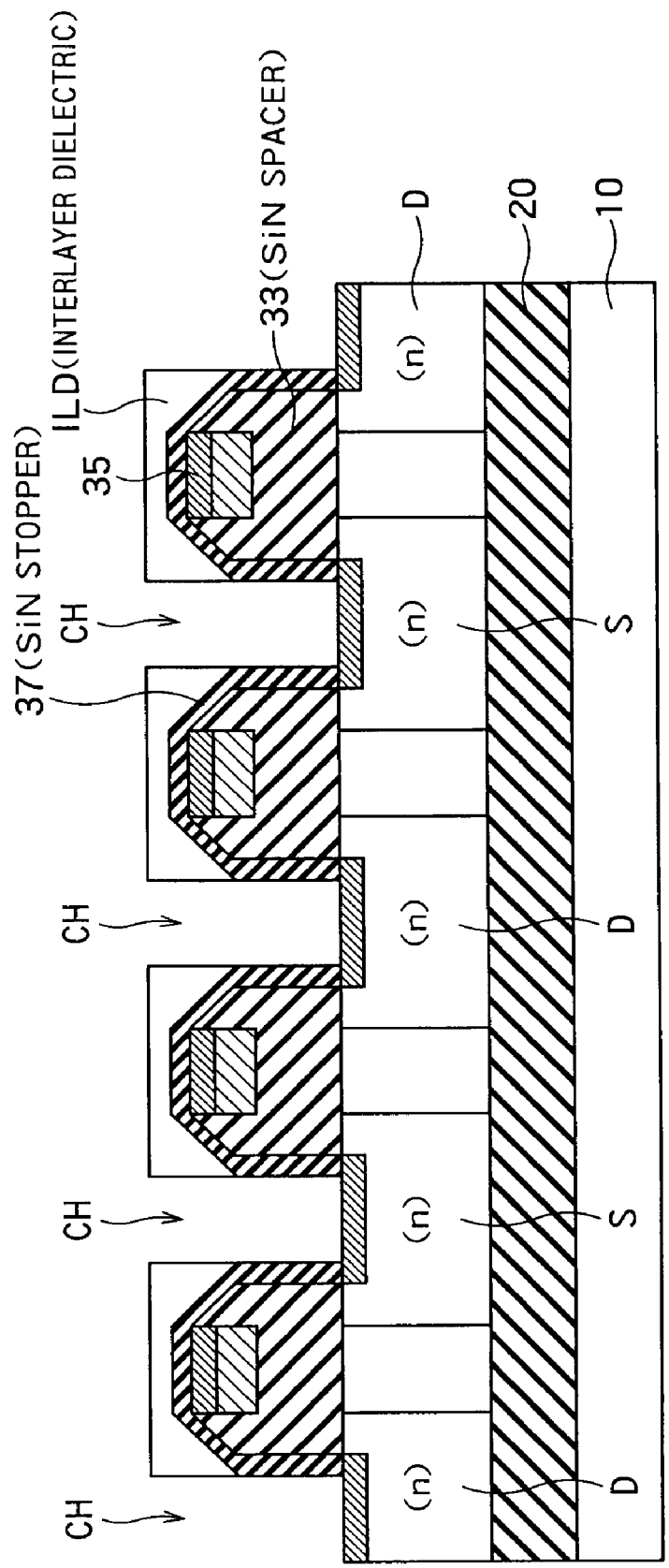

Next, as shown in FIGS. 21A to 22, a silicide layer 35 is formed on surfaces of the word lines WLs, the source layers S, and the drain layers D. FIGS. 21A and 21B are cross-sectional views subsequent to FIGS. 18 and 19, respectively. FIG. 22 is a cross-sectional view taken along a line A-A of FIG. 20. The thin-film SiN stopper 37 and the interlayer dielectric film ILD are sequentially deposited on the structure and flattening is performed by the CMR Contact holes CHs are formed in the interlayer dielectric film ILD to form the source line contacts SLCs and the bit line contacts BLCs. First, to form the contact holes CHs, the interlayer dielectric film ILD is etched down to a top surface of the SiN stopper 37. At this time, the interlayer dielectric film ILD in the contact holes CHs can be sufficiently over-etched and removed since the silicon oxide film has high selectivity relative to the silicon nitride film. Using the interlayer dielectric film ILD as a mask, the thin-film SiN stopper 37 is etched. The contact holes CHs are thereby formed.

An opening diameter of each contact hole CH is larger than the width (thickness) of each Fin semiconductor layer 31. However, the source line contacts SLCs and the bit line contacts BLCs are away and separated from contact with the first gate lines GL1 since the first gate lines GL1 are formed at lower positions than the Fin semiconductor layers 31.

A metal material such as tungsten is buried into the contact holes CHs, thereby forming contact plugs. Next, the source lines SLs are formed by using such a metal material as copper, aluminum or tungsten. At this time, an intermediate layer for connecting lower plugs to upper plugs of the bit line contacts BLCs is formed out of the same metal material as that of the source lines SLs. After further depositing the interlayer dielectric film ILD, the upper plugs of the bit line contacts BLCs are formed. Thereafter, the bit lines BLs are formed. In this way, the FBC memory device shown in FIGS. 1 to 7 is completed.

Second Embodiment

Figure 23:
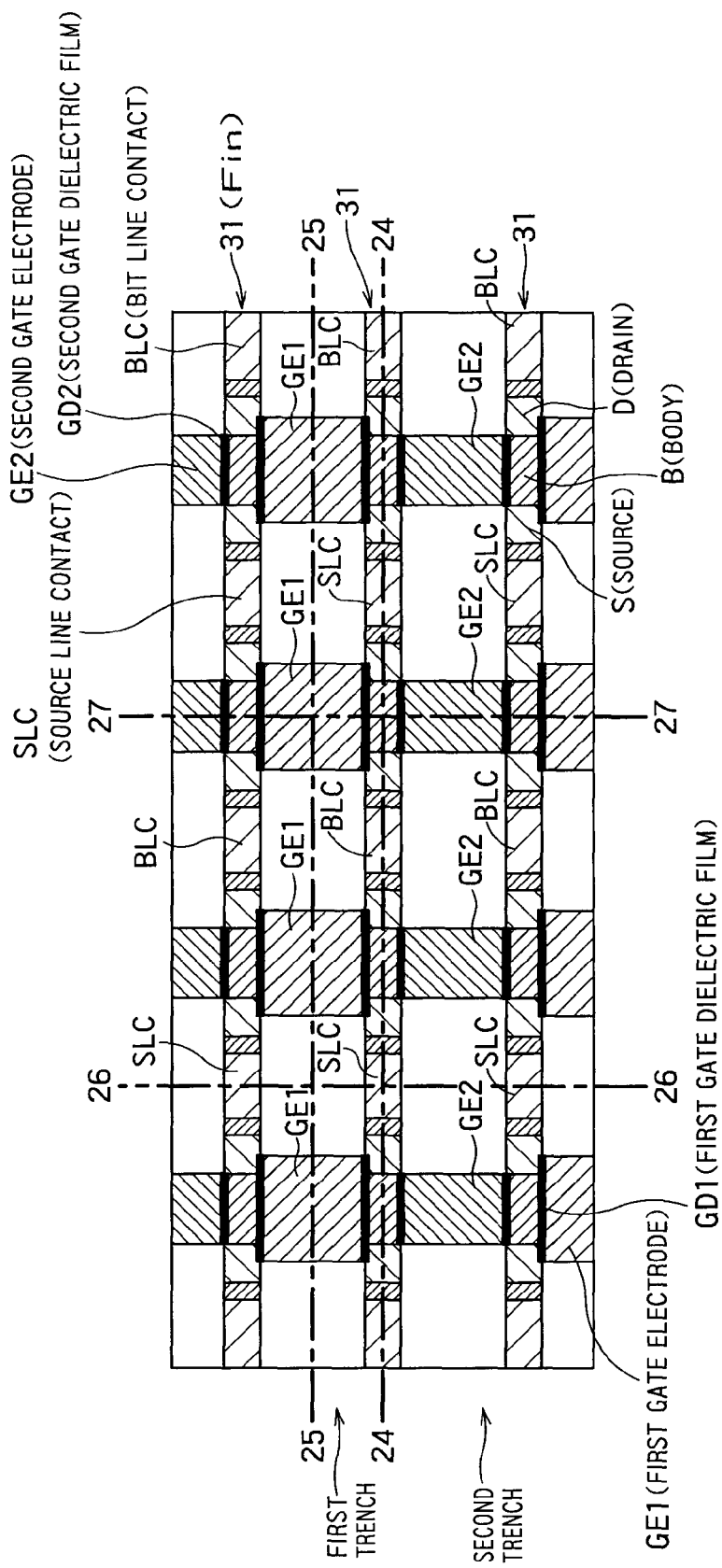
Figure 24:
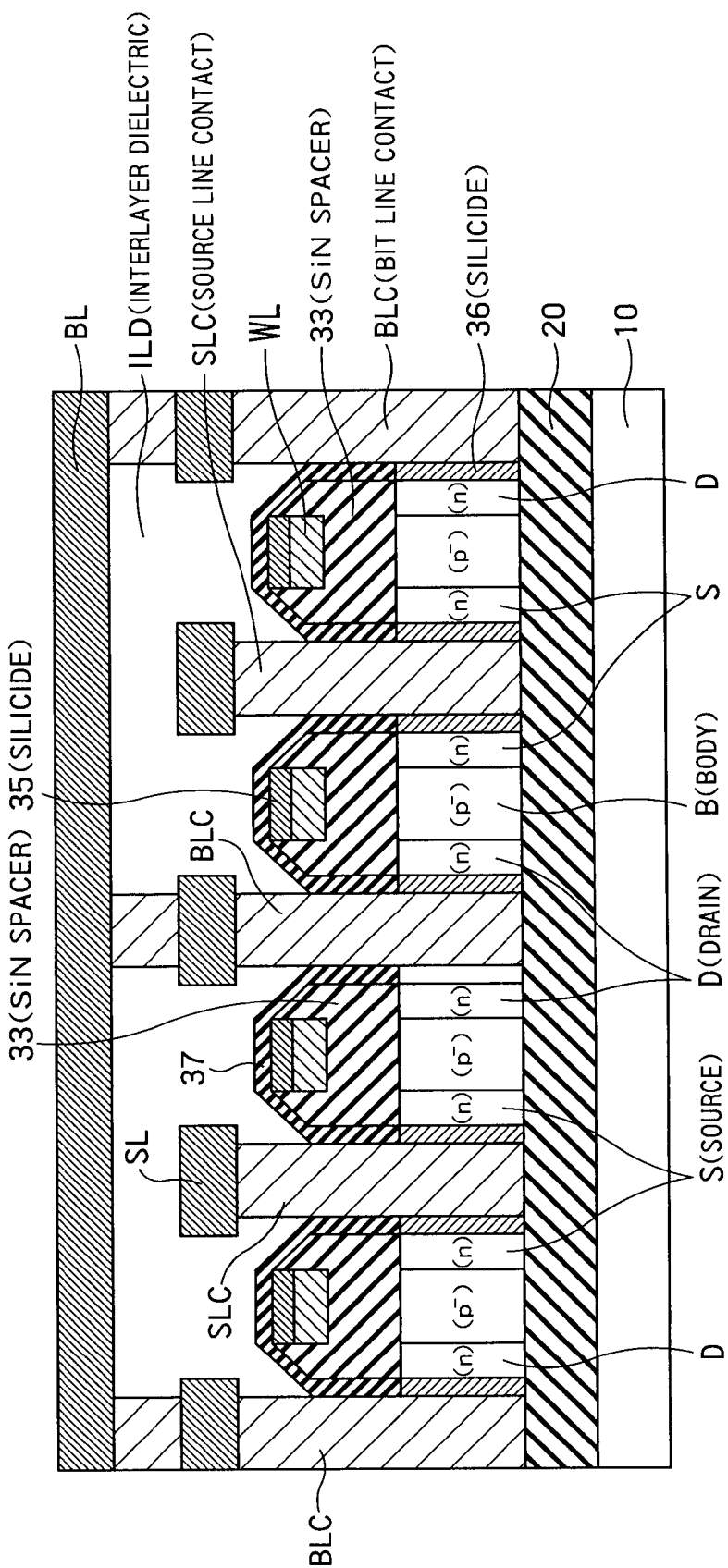
Figure 25:
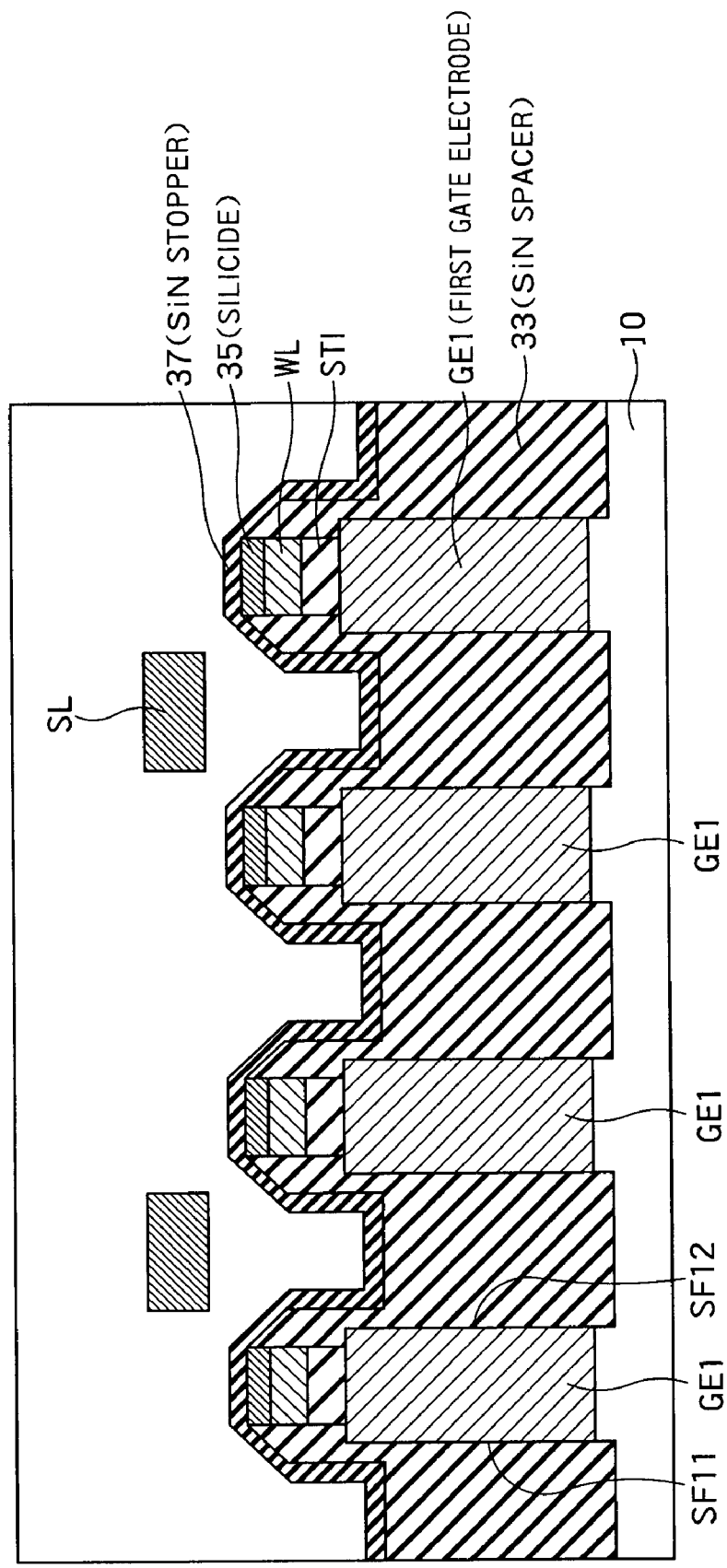
Figure 26:
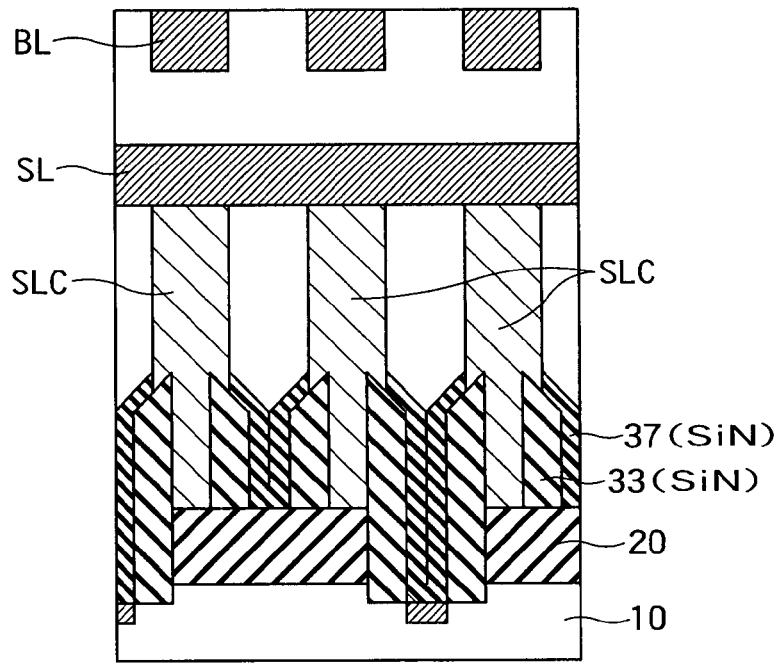
Figure 27:
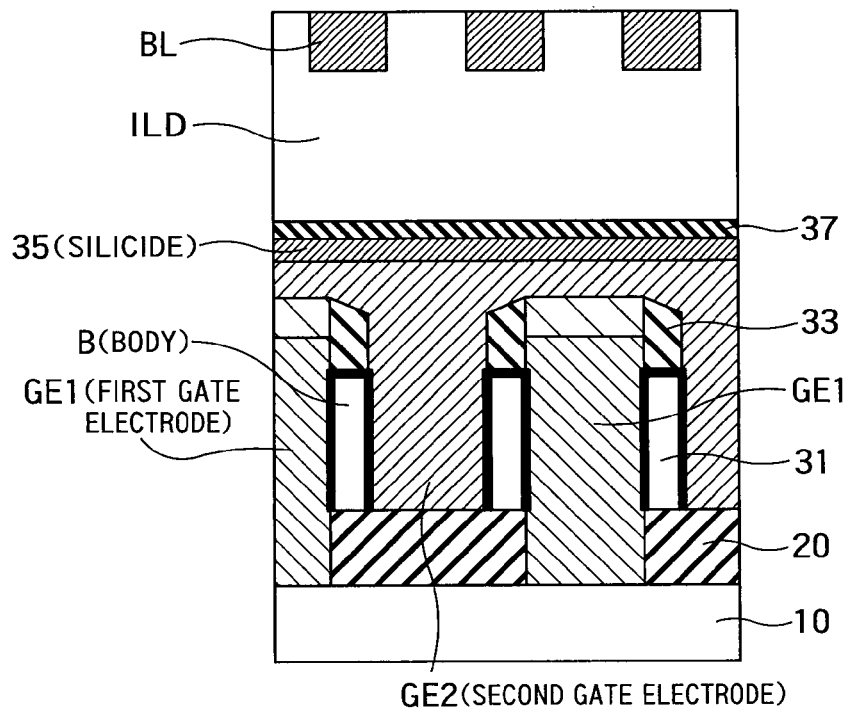
Figure 28:
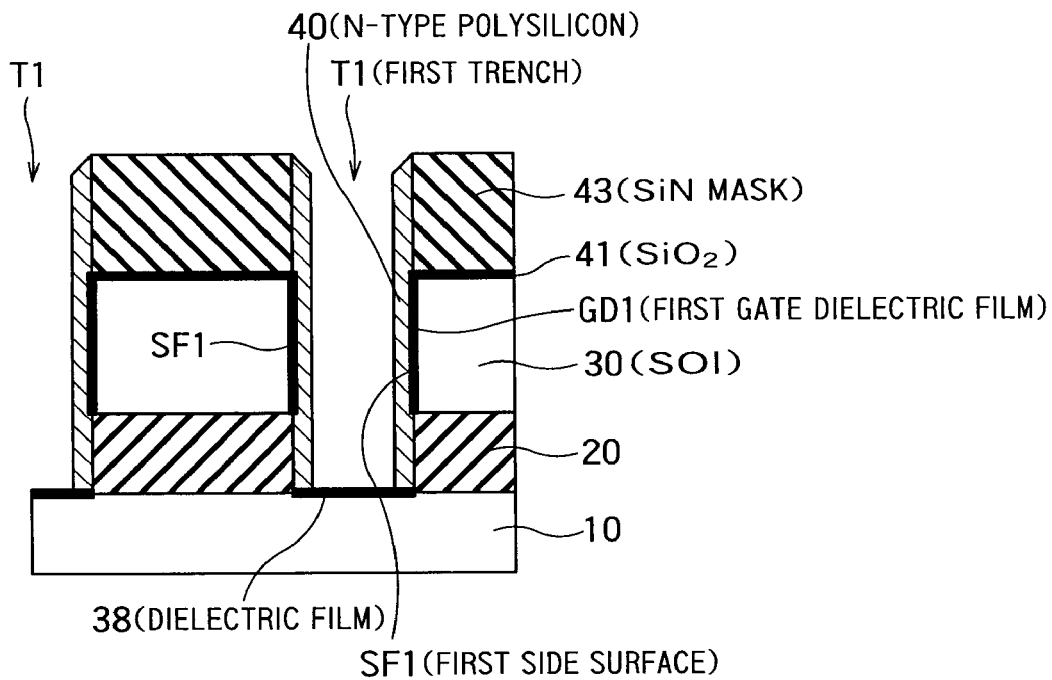

FIG. 23 is a plan view of an FBC memory device according to a second embodiment of the present invention. FIG. 24 is a cross-sectional view taken along a line 24-24 of FIG. 23. FIG. 25 is a cross-sectional view taken along a line 25-25 of FIG. 23. FIG. 26 is a cross-sectional view taken along a line 26-26 of FIG. 23. FIG. 27 is a cross-sectional view taken along a line 27-27 of FIG. 23.

In the second embodiment, one first gate electrode GE1 is shared between the two adjacent columns as shown in FIGS. 23 and 27. Namely, the first gate electrodes GE1 are not separated according to the respective Fin semiconductor layers 31 in the first trench but connected to one another in the first trench.

As shown in FIG. 25, each first gate electrode GE1 has two side surfaces SF11 and SF12 oriented in the first direction (corresponding to a longitudinal direction in FIG. 25). A distance between the two surfaces SF11 and SF12 is almost equal to a length of one word line WL along the first direction. This is because the first gate electrode GE1 is formed by filling the first trench with the first gate electrode material and completely removing the first gate electrode material in the regions other than the word line WL by anisotropic etching. Differently from the first embodiment, the etching is performed after a spacer is formed on sidewalls of each first gate electrode GE1. Due to this, the distance between the two side surfaces SF11 and SF12 is larger than the length of the word line WL by a thickness of the spacer. However, positions of ends of the word line WL and those of the two side surfaces SF11 and SF12 are formed in a self-aligned fashion by the spacer. Another difference of the second embodiment from the first embodiment is that the first gate electrodes GE1 are not left in the regions other than the word lines WLs in the second embodiment while the first gate electrodes GE1 are partially left in these regions in the first embodiment.

As shown in FIGS. 25 and 27, the supporting substrate 10 (N-well) according to the second embodiment functions as the first gate lines according to the first embodiment. Namely, the first gate electrodes GE1 penetrate through the BOX layer 20 and are connected to the supporting substrate 10 (N-well). Therefore, potentials of the first gate electrodes GE1 in all the columns are controlled in common through the supporting substrate 10. By controlling the first gate electrodes GE1 through the N-well in common, the first gate lines are unnecessary. On the other hand, similarly to the first embodiment, the word lines WLs are formed integratedly with the respective second gate electrodes GE2 and extend in the row direction. The supporting substrate 10 (N-well) is formed in a layer different in height from that in which the word lines WL are formed. This can facilitate forming the first gate electrode GE1 and the second gate electrode GE2 formed on the respective side surfaces of each of the Fin semiconductor layer 31 while being electrically separated from each other. This can dispense with contact holes and contact plugs between the supporting substrate 10 (N-well) and the first gate electrodes GE1 and between the word lines WLs and the second gate electrodes GE2. That is, according to the second embodiment, similarly to the first embodiment, there is no need to provide word line contacts and plate line contacts. As a result, the distance D shown in FIG. 1 can be reduced.

Furthermore, according to the second embodiment, the contact plugs pass through the Fin semiconductor layers 31 and reach the BOX layer 20 as shown in FIGS. 24 and 26. The source line contacts SLCs and the bit line contacts BLCs are thereby in contact with side surfaces of the source layers S and those of the drain layers D, respectively.

In FIG. 24, the source line contacts SLCs and the bit line contacts BLCs penetrate through the Fin semiconductor layers 31 in regions of the source layers S and the drain layers D, respectively. A silicide layer 35 is formed on each side surface of the source layers S and the drain layers D. One source line contact SLC and one bit line contact BLC are connected to one source layer S and one drain layer D via the silicide layers 35, respectively. Other configurations of the second embodiment can be similar to those of the first embodiment.

In general, if two adjacent memory cells MCs share one drain layer D or source layer S therebetween, holes accumulated in the body B of one of the memory cells MCs often flow into the other memory cell MC through the drain layer D or the source layer S. This phenomenon is referred to as "bipolar disturbance".

In the second embodiment, the two adjacent memory cells MCs share the drain layer D or the source layer S. However, the source line contact SLC and the bit line contact BLC made of such a metal material as tungsten are interposed between the adjacent source layers S and between the adjacent drain layers D, respectively. Since the minority carrier density is zero on a silicon-metal interface, the bipolar disturbance is suppressed in the second embodiment.

Since each of the source layer S and the drain layer S is of a Fin shape, an area of a side surface of each of the source layer S and the drain layer D is larger than an area of a top surface thereof. Due to this, in the second embodiment, a contact area between one source line contact SLC and one source layer S and that between one bit line contact BLC and one drain layer D are larger. As a result, contact resistance can be reduced.

As shown the cross section along the source line SL of FIG. 26, in the second embodiment, the first gate electrodes GE1 and the first gate lines GL do not remain on the supporting substrate 10 (N-well) supplying plate voltage in place of the first gate lines GL1. The supporting substrate 10 (N-well) is formed so that a top surface of the supporting substrate 10 (N-well) is located at a lower position than that of a top surface of the BOX layer 20 for the following reason. As shown in FIG. 25, the first gate electrodes GE1 are formed so that the first electrode material can remain below the word lines WLs and can be completely removed below the source lines SLs. The same is true for the drain layers D. Namely, although not shown, in a cross section along a plurality of drain layers D, the first gate electrodes GE1 and the first gate lines GL1 do not remain on the supporting substrate 10. The supporting substrate 10 is formed so that the top surface of the supporting substrate 10 is located at the lower position than that of the top surface of the BOX layer 20. By so forming, the parasitic capacitance between each first gate electrode GE1 and the supporting substrate 10 (N-well) for supplying the plate voltage to the gate electrode GE1 and the corresponding drain layer D is smaller than that according to the first embodiment. As a result, the FBC can be operated at high speed and power consumption of the FBC can be kept low.

Furthermore, since the top surface of the supporting substrate 10 for supplying the plate voltage to each first gate electrode GE1 is located at the lower position than that of the bottom surface of the corresponding Fin semiconductor layer 31, it is possible to prevent a short circuit between the supporting substrate 10 and either the source layer S or the drain layer D via the source line contact SLC or the bit line contact BLC. By supplying the plate voltage from the supporting substrate 10, there is no need to locate the first gate line GL1 and the Fin semiconductor layer 31 apart from each other, thereby making it possible to reduce the size of the unit cell UC.

A method of manufacturing the FBC memory device according to the second embodiment will be described. After forming the structure shown in FIG. 8, the first gate dielectric film GD1 is formed on the side surface SF1 of the SOI layer 30. At the same time, the dielectric film 38 is also formed on the surface of the exposed supporting substrate 10. The first gate electrode material 40 is deposited on inside surfaces of the first trenches T1 and on the SiN mask 43. At this time, the thickness of the first gate electrode material 40 is made thin so as not to close openings of the first trenches T1. By etching back the first gate electrode material 40 by anisotropic etching, the first gate electrode material 40 is left only on side surfaces of the first trenches T1.

Figure 29:
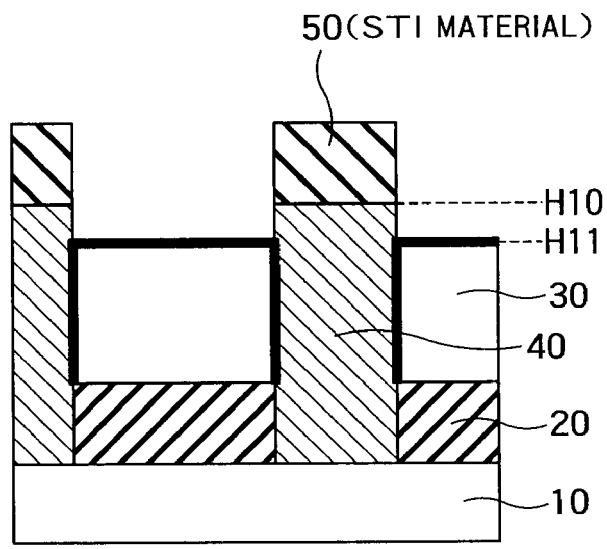

Next, the dielectric film 38 formed on the supporting substrate 10 is removed using an ammonium fluoride solution. The first gate electrode material 40 is deposited to fill up the first trenches T1 and etched back. At this time, as shown in FIG. 29, the top surface H10 of the first gate electrode material 40 is higher than the top surface H11 of the SOI layer 30. The STI material 50 is deposited and then etched back to a top surface level of the SiN mask 43. The STI mask 43 is removed, thereby a structure shown in FIG. 29 is obtained.

Figure 30:
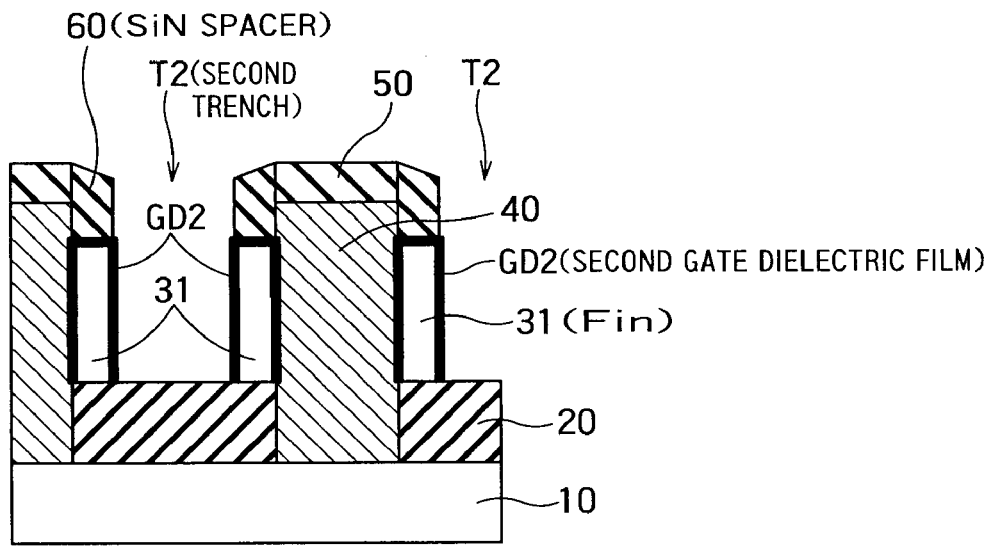

Thereafter, the second trenches T2 are formed similarly to the first embodiment. As a result, the Fin semiconductor layers 31 are formed as shown in FIG. 30. The second gate dielectric film GD2 is formed on each of the second side surfaces SF2 of the respective Fin semiconductor layers 31.

Figure 31:
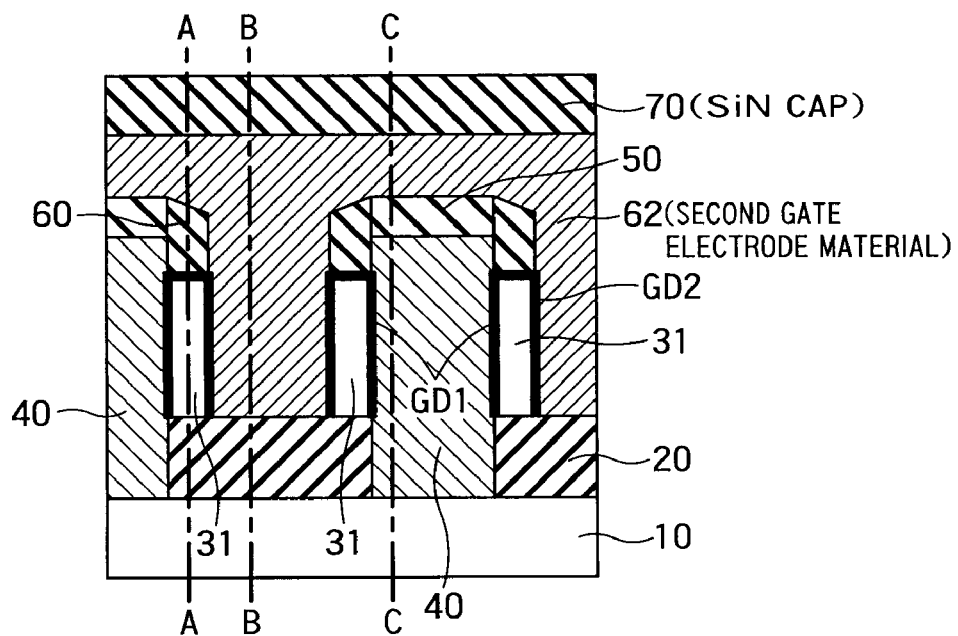

Next, as shown in FIG. 31, the second gate electrode material 62 is deposited in the second trenches T2 and above the Fin semiconductor layers 31. The SiN cap 70 is deposited on the second gate electrode material 62.

Similarly to the first embodiment, the SiN cap 70 is patterned into a shape of word lines WLs. However, in the second embodiment, only the second gate electrode material 62 is etched using the SiN cap 70 as a mask for the following reason. In the second embodiment, a step of implanting impurity ions into the Fin semiconductor layers 31 from the second side surfaces SF2 thereof is separated from a step of implanting impurity ions into the Fin semiconductor layers 31 from the first side surfaces SF1 thereof. Alternatively, the length of each first gate electrode GE1 along the first direction and that of each second gate electrode GE2 along the first direction are adjusted independently.

Figure 32A:
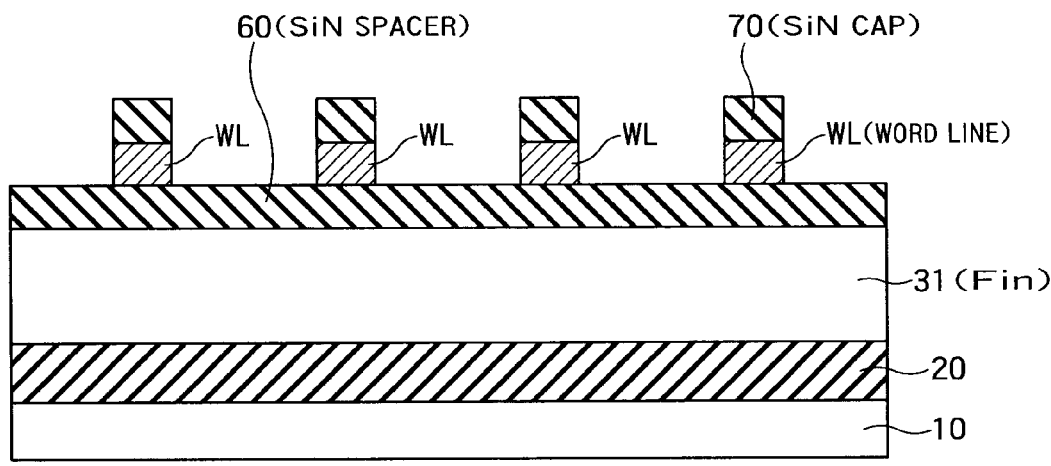
Figure 32B:
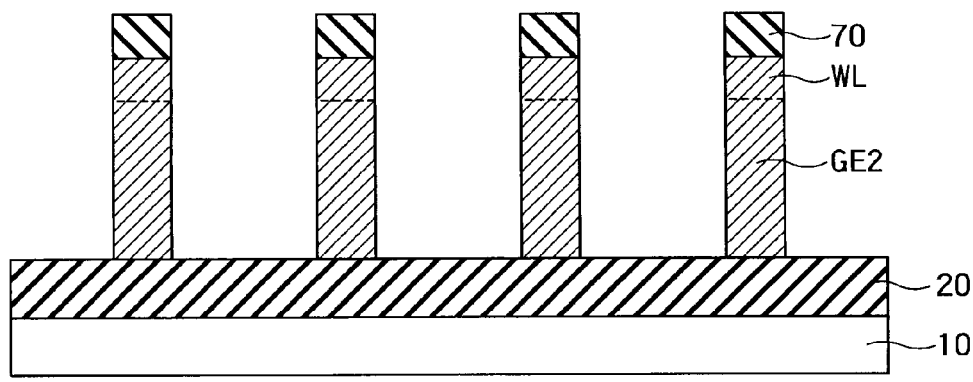
Figure 32C:
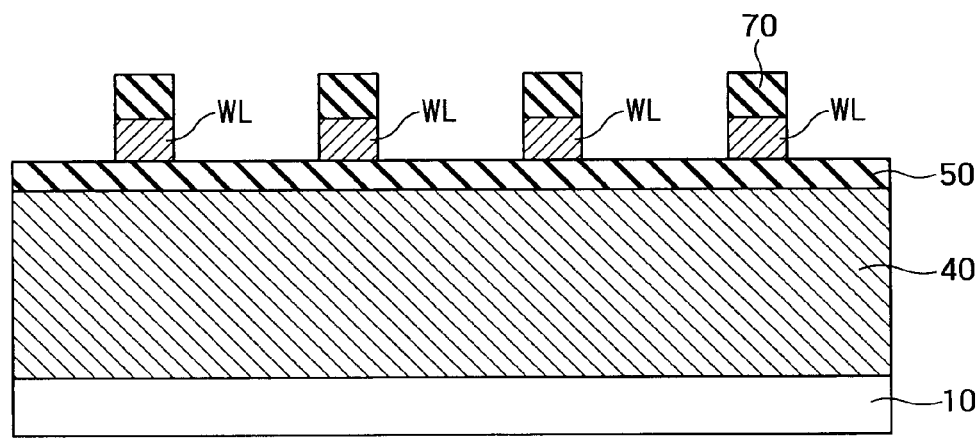

FIG. 31 is a cross-sectional view in the row direction. To show the word lines WLs more clearly, cross sections in the column direction are shown in FIGS. 32A to 32C. FIGS. 32A to 32C are cross-sectional views taken along a line A-A, a line B-B, and a line C-C of FIG. 31, respectively. As shown in FIGS. 32A and 32C, the word lines WLs are formed on the STI material 50 and each SiN spacer 60. As shown in FIG. 32B, the second gate electrode material 62 is etched down to the BOX layer 20 in the regions other than the word lines WLs in the second trenches T2. The second gate electrodes GE2 are thereby formed.

Next, similarly to the first embodiment, N-impurity ions are implanted from an oblique direction or plasma doping is performed. An extension layer is formed in each of the source and drain regions in each of the Fin semiconductor layers 31, respectively. At this stage, however, differently from the first embodiment, the first side surface SF1 of each Fin semiconductor layer 31 is covered with the first gate electrode GE1 (see FIG. 30). Namely, in the second embodiment, each body B is formed in a self-aligned fashion to the position of the second gate electrode GE2.

Figure 34A:
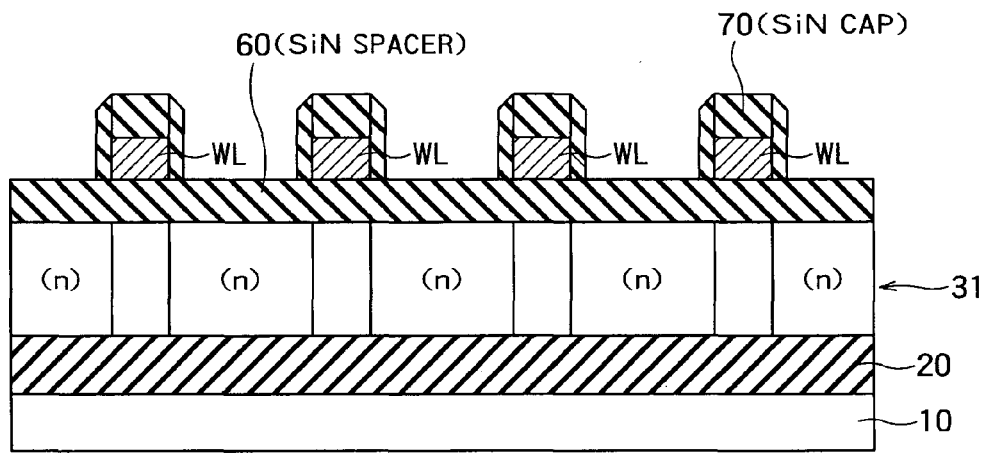
Figure 34B:
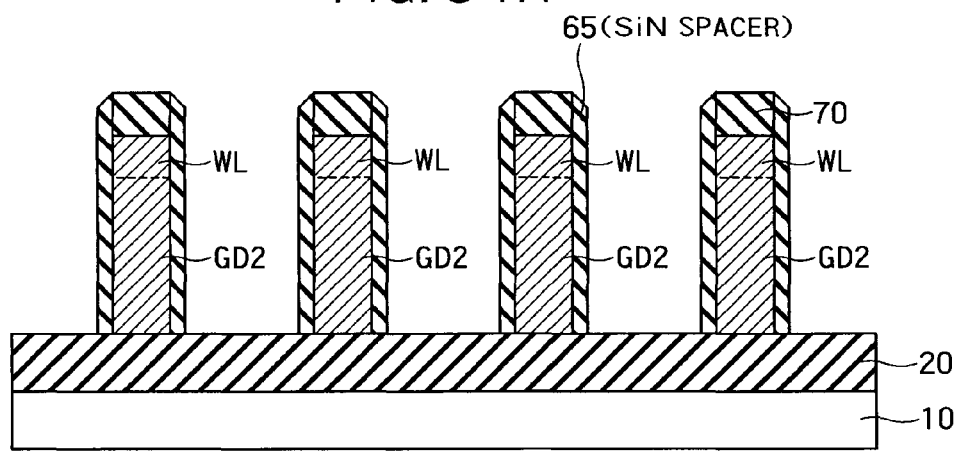
Figure 34C:
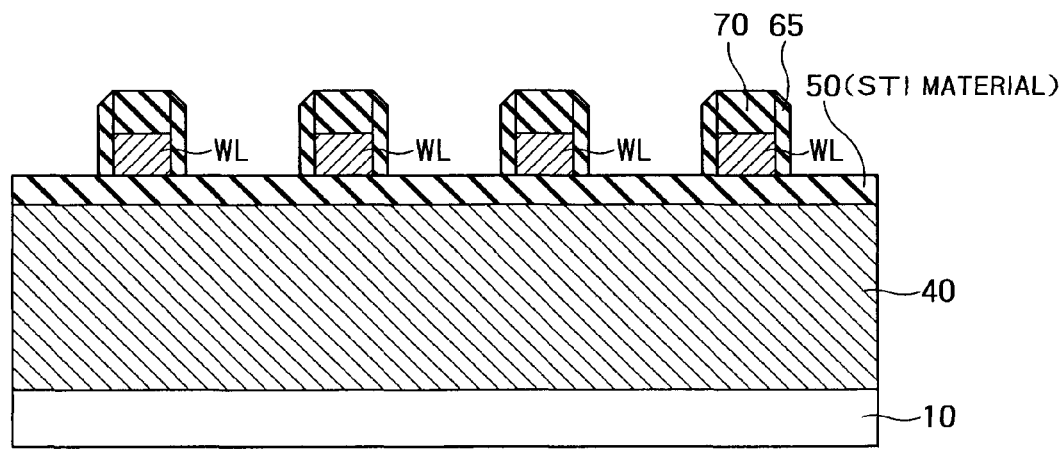

As shown in FIGS. 33 to 34C, SiN spacers 65 are formed on the second side surfaces SF2 of the Fin semiconductor layers 31, the side surfaces of the word lines WLs, and the side surfaces of the second gate electrodes GE2, respectively. While FIG. 33 is a cross-sectional view in the row direction cut along the regions other than the word lines WLs. FIGS. 34A to 34C are cross-sectional views taken along a line A-A, a line B-B, and a line C-C of FIG. 33, respectively.

Figure 35:
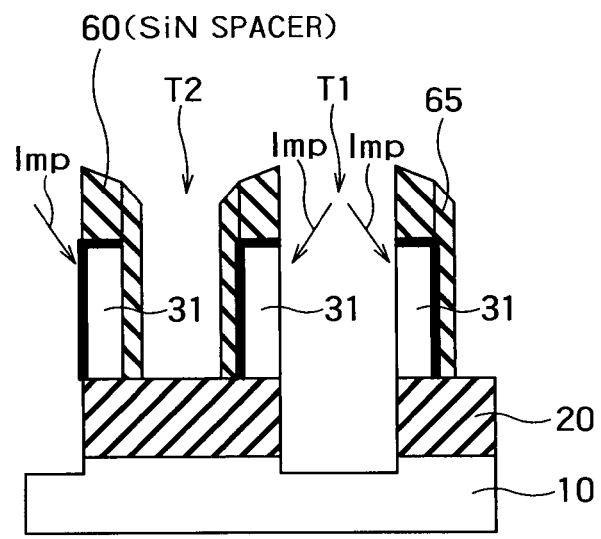
Figure 36:
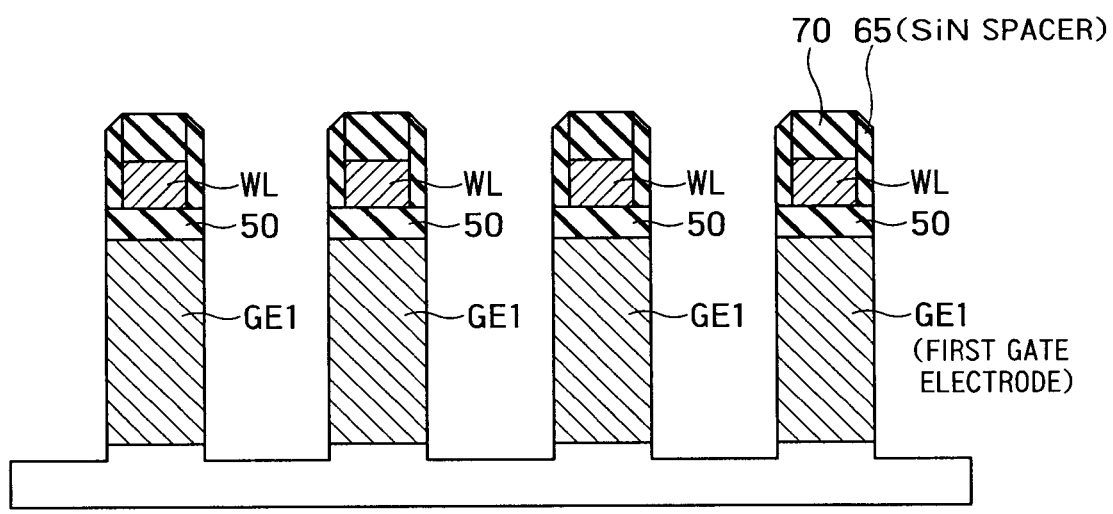
Figure 37:
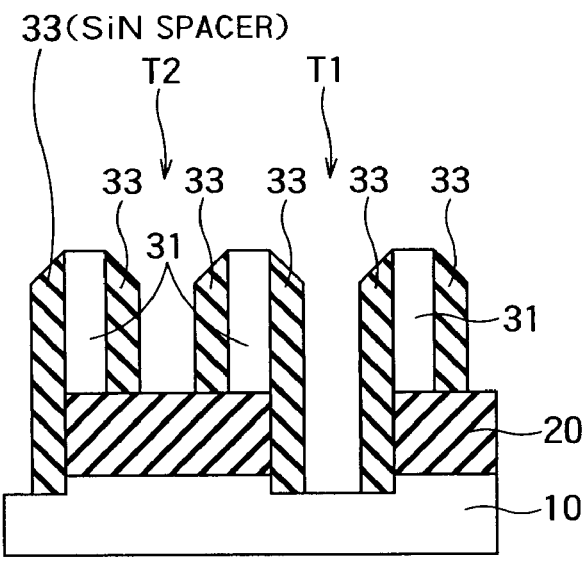
Figure 38:
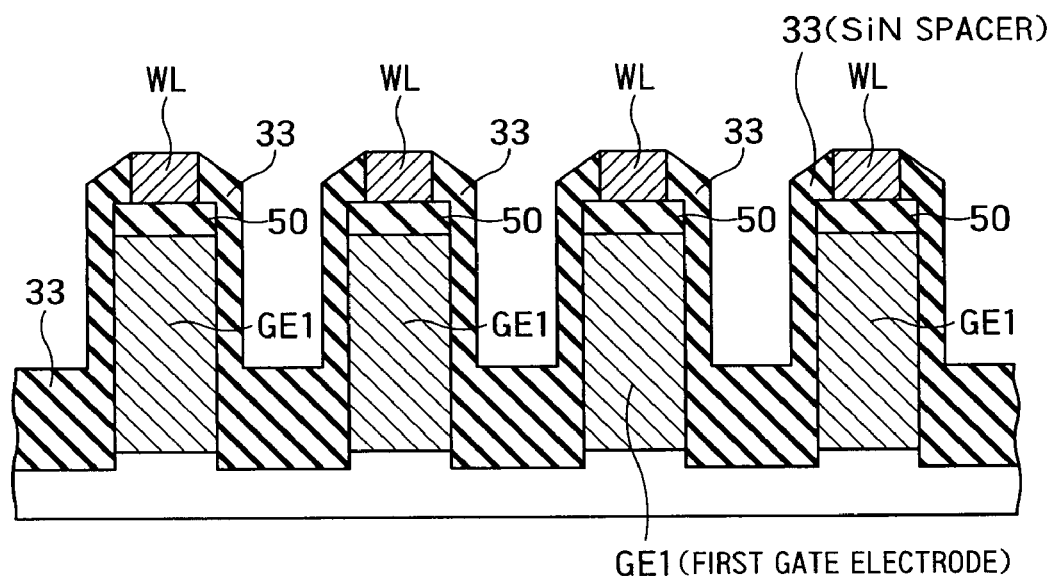

Using the SiN cap 70 and the SiN spacers 65 as a mask, the STI material 50 is anisotropically etched (see FIGS. 33 and 34C). As a result, the top surface of the first electrode material 40 in the regions other than the word lines WLs is exposed. Furthermore, using the SiN cap 70 and the SiN spacers 65 as a mask, first gate electrode material 40 is anisotropically etched. As a result, as shown in FIGS. 35 and 36, the first gate electrode material 40 in the regions other than the word lines WLs is removed, thereby forming the first gate electrodes GE1. As can be seen from FIGS. 34B and 34C, positions of two side surfaces of each first gate electrode GE1 are displaced from those of two side surfaces of each second gate electrode by a thickness of each SiN spacer 65. However, the first gate electrodes GE1 and the second gate electrodes GE2 are formed in a self-aligned fashion to the mask (SiN cap 70) on the word lines WLs formed by the same lithography and etching. As a result, the first gate electrodes GE1 are formed in a self-aligned fashion to positions of the respective bodies B. As shown in FIG. 36, the first gate electrodes GE1 are connected to the supporting substrate 10 (N-well). FIG. 35 is a cross-sectional view subsequent to FIG. 33 and FIG. 36 is a cross-sectional view subsequent to FIG. 34C.

At this stage, as shown in FIG. 35, impurity ions can be implanted from the oblique direction or plasma doping can be performed. In this case, because of the presence of the SiN spacers 65 on the second side surfaces SF2 of the Fin semiconductor layers 31, it is possible to prevent impurity ions from being implanted into the second side surfaces SF2. By appropriately adjusting a conduction type and a dosage of impurities and an acceleration energy at each of the step of implanting the impurity ions into the second side surfaces SF2 and the step of implanting the impurity ions into the first side surfaces SF1 shown in FIG. 35, it is possible to realize an optimum impurity profile for each of the first and second side surfaces SF1 and SF2 and improve memory cell characteristics.

After removing the SiN spacers 60 and 65 and the SiN cap 70, the SiN spacers 33 are formed to cover up the side surfaces of the Fin semiconductor layers 31, the side surfaces and bottoms of the word lines WLs, the side surfaces of the second gate electrodes GE2, and the side surfaces of the first gate electrodes GE1. As a result, a structure shown in FIGS. 37, 38, 20A, and 20B is obtained.

Figure 39:
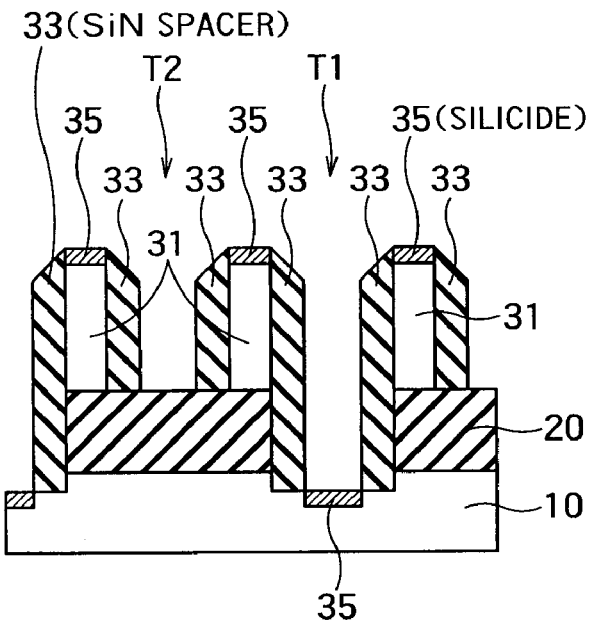
Figure 40:
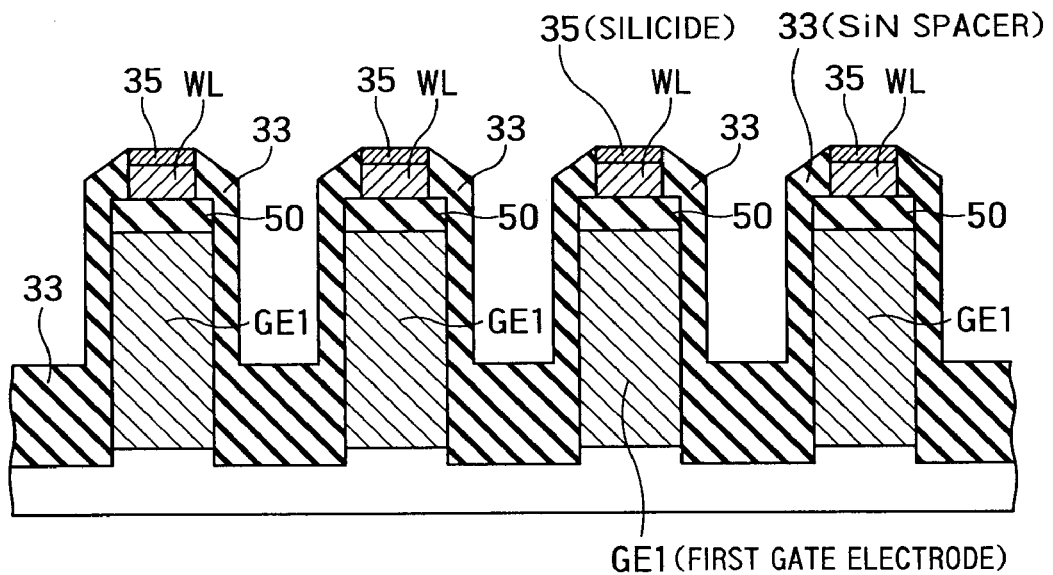

As shown in FIGS. 39 and 40, the silicide layer 35 is formed on the word lines WLs, the source layers S, and the drain layers D.

Figure 41:
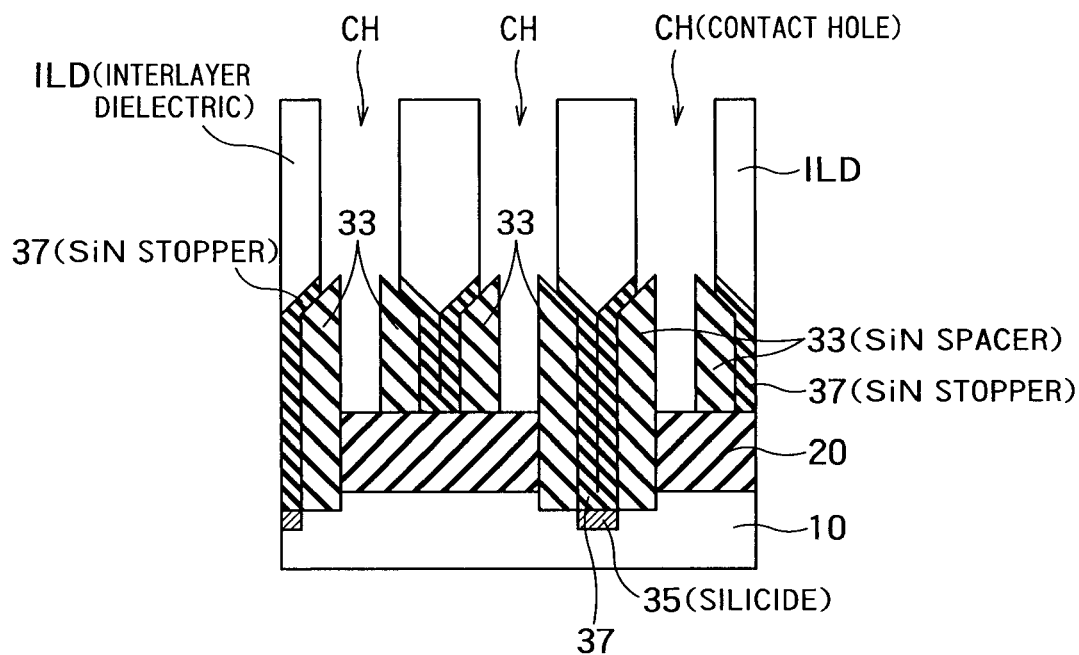
Figure 42:
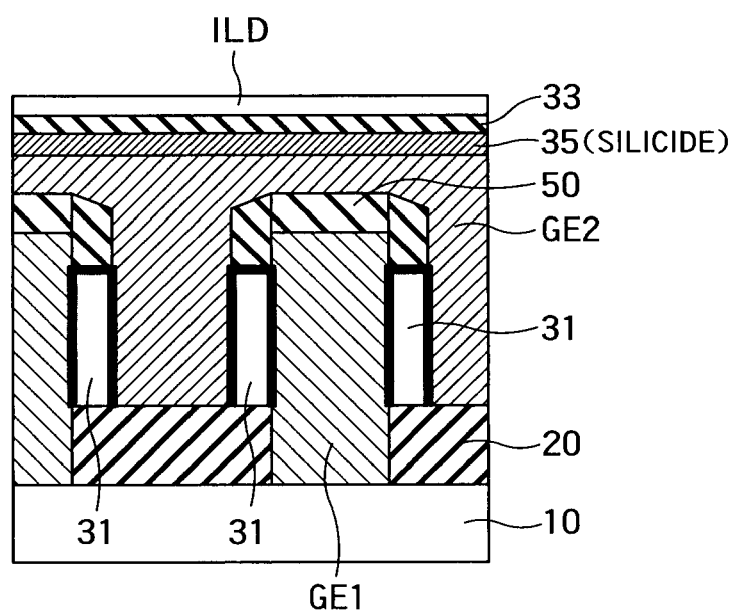
Figure 43:
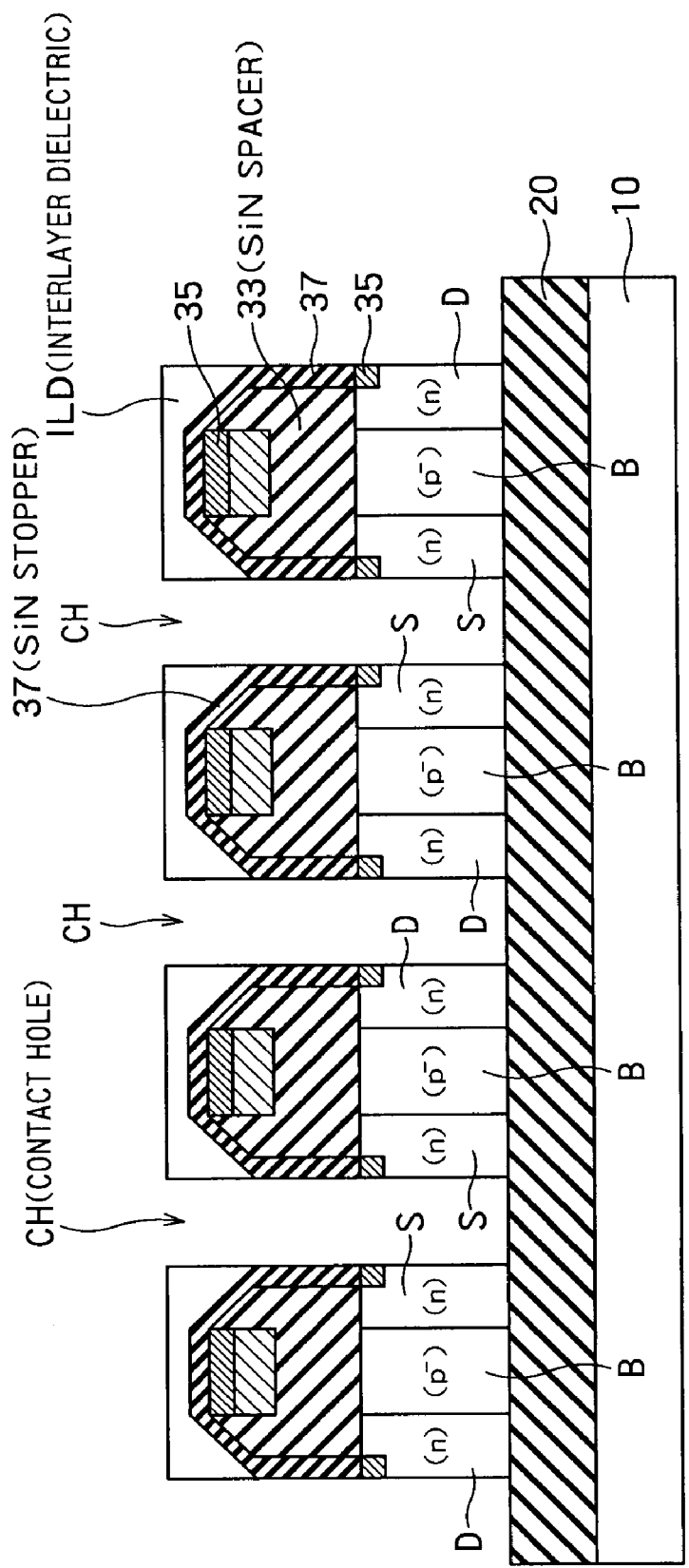

Similarly to the first embodiment, the SiN stopper 37 and the interlayer dielectric film ILD are formed. Further, the contact holes CHs are formed in the interlayer dielectric film ILD. At this time, as shown in FIGS. 41 to 43, the contact hole CHs are formed to penetrate through the Fin semiconductor layers 31. After silicide layers are formed on the side surfaces of the respective Fin semiconductor layers 31, a metal material is buried in the contact holes CHs. As a result, as shown in FIG. 24, the source line contacts SLCs and the bit line contacts BLCs in contact with the side surfaces of the source layers S and those of the drain layers D, respectively are formed. Thereafter, the source lines SLs and the bit lines BLs are formed, thereby completing the FBC memory device according to the second embodiment.

Third Embodiment

Figure 44:
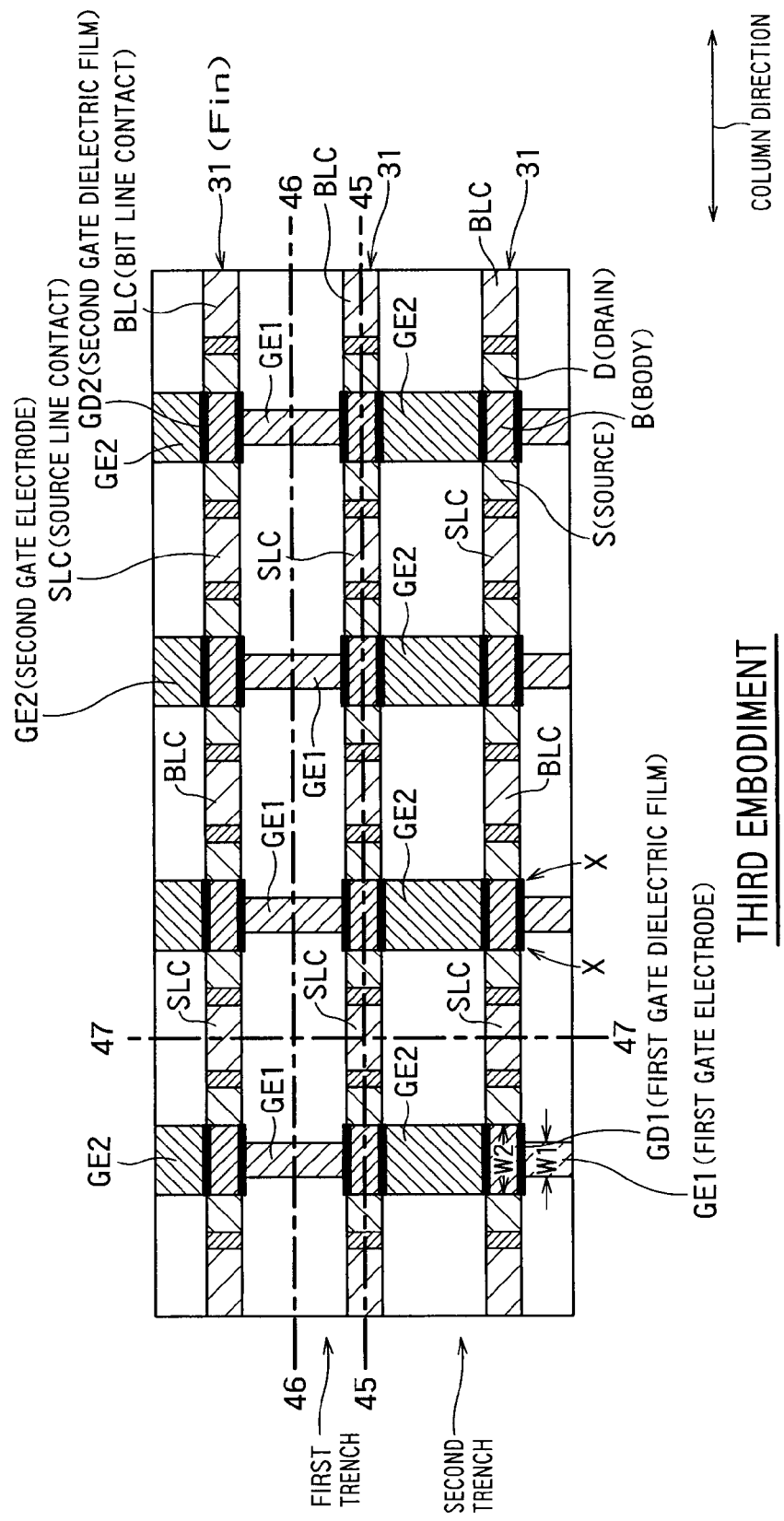
FIG. 44 is a plan view showing an FBC memory device according to a third embodiment of the present invention.
Figure 45:
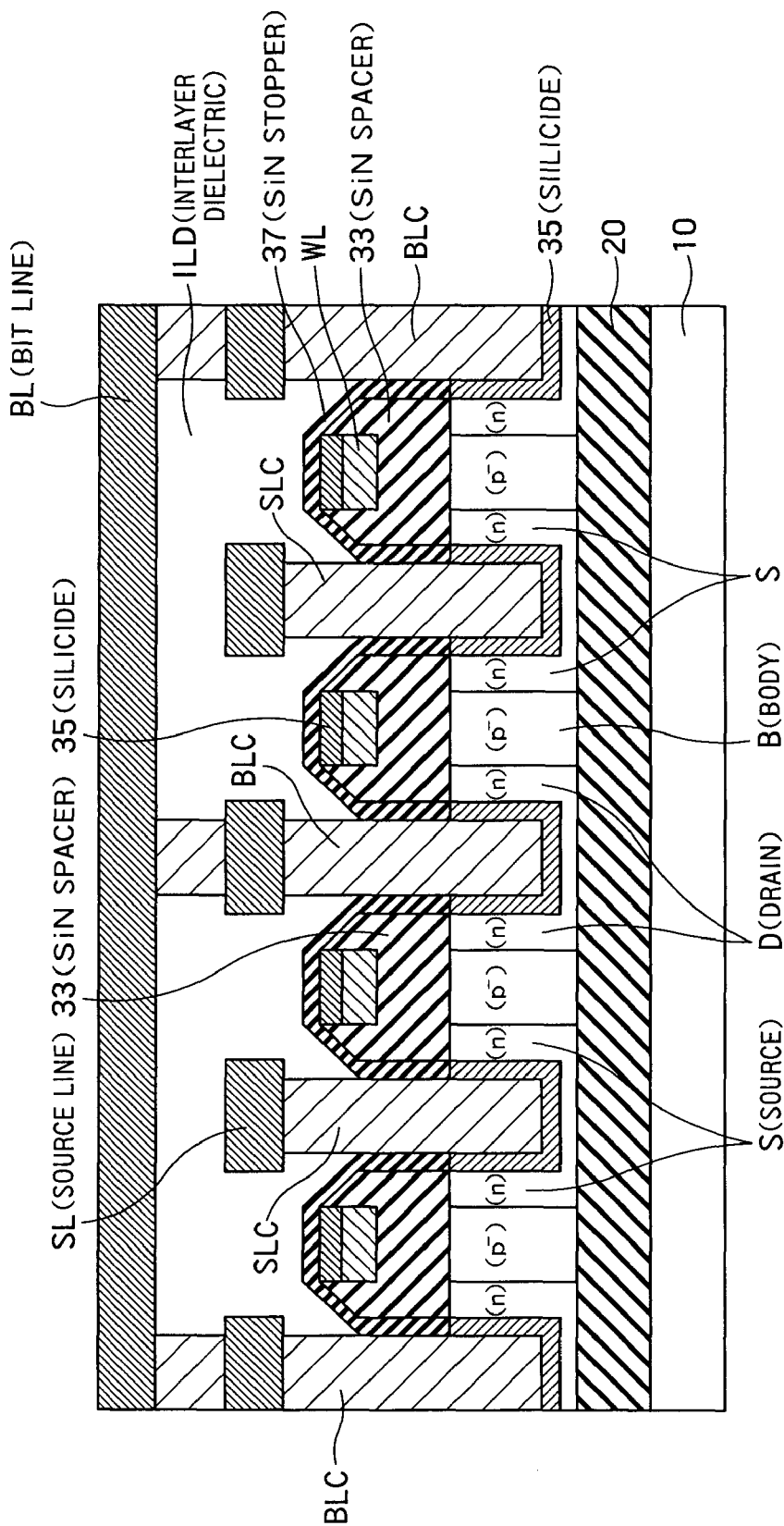
FIG. 45 is a cross-sectional view taken along a line 45-45 of FIG. 44.
Figure 46:
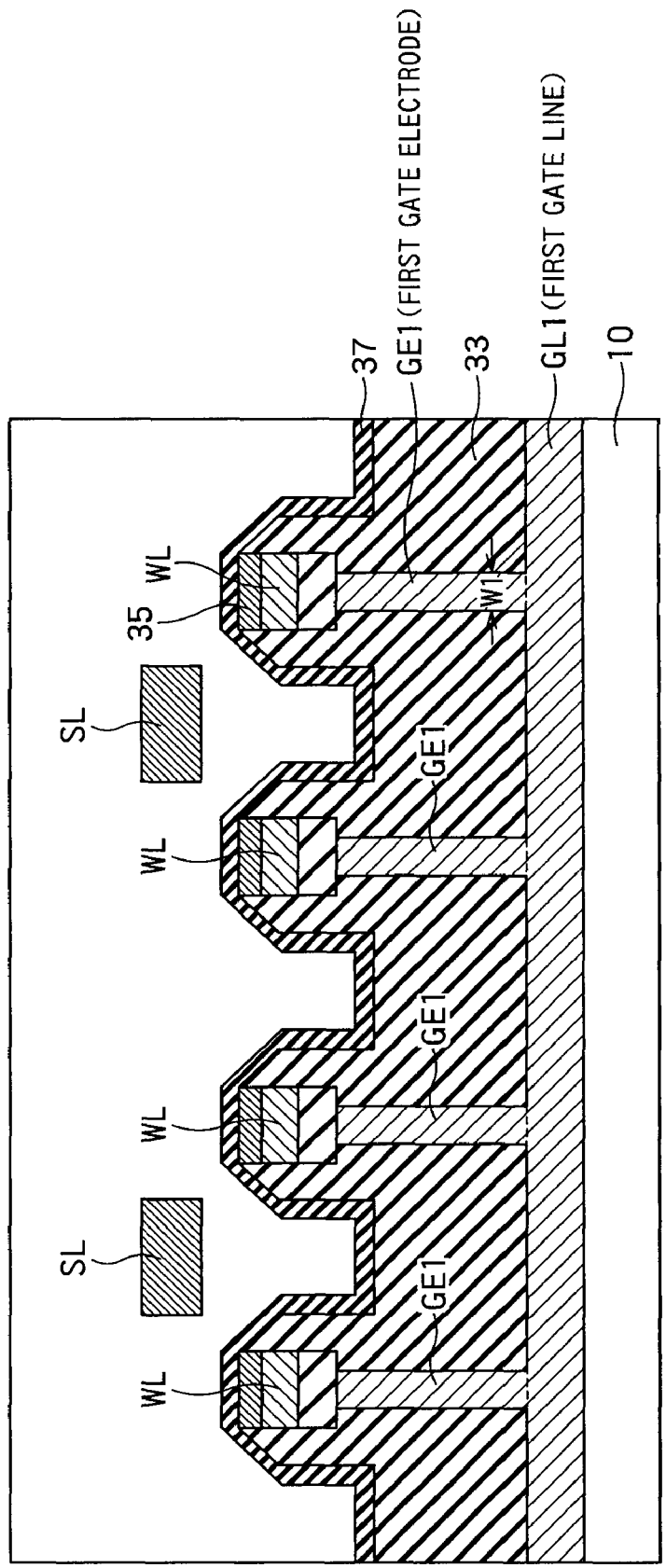
FIG. 46 is a cross-sectional view taken along a line 46-46 of FIG. 44.
Figure 47:
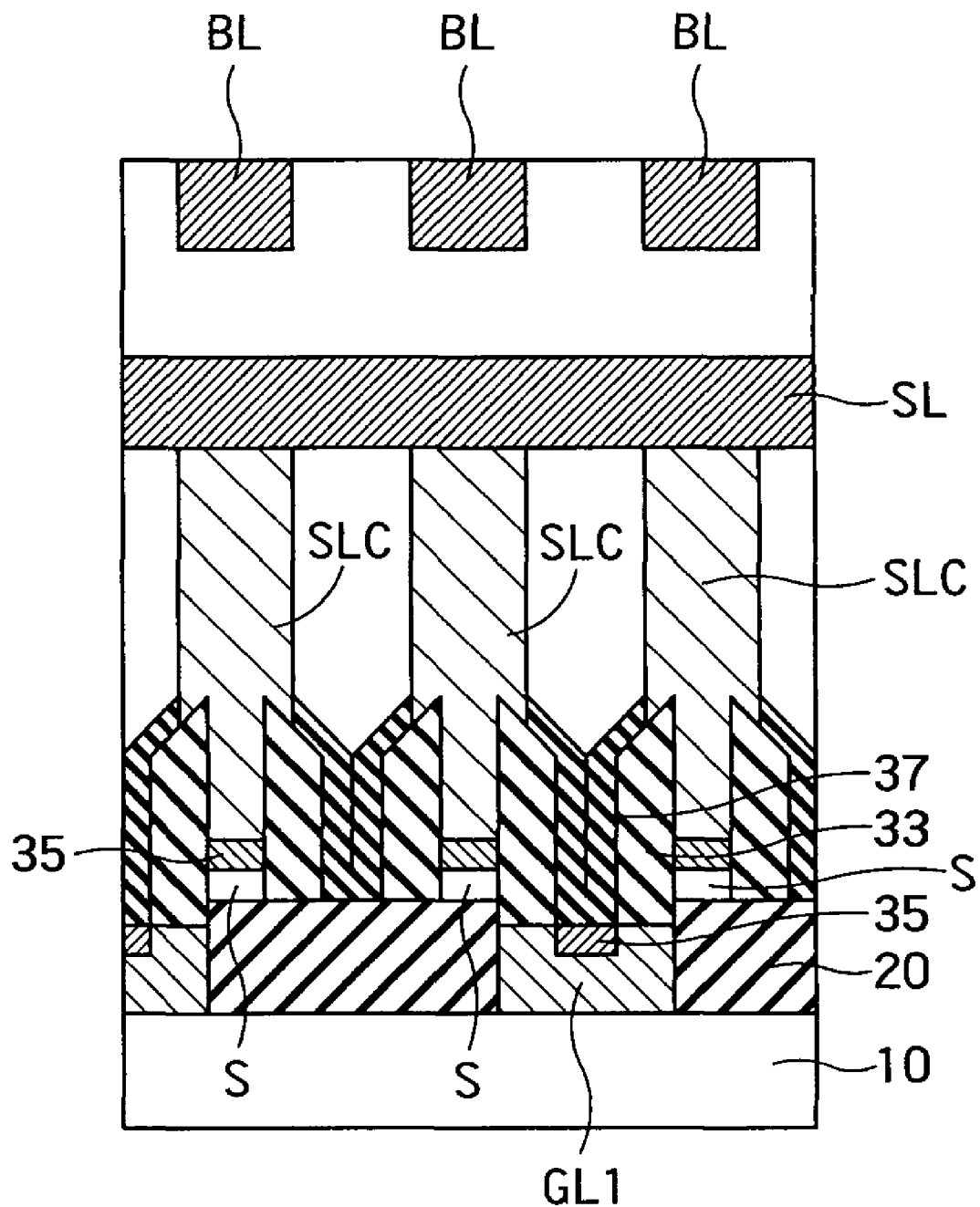
FIG. 47 is a cross-sectional view taken along a line 47-47 of FIG. 44.

FIG. 44 is a plan view of an FBC memory device according to a third embodiment of the present invention. FIG. 45 is a cross-sectional view taken along a line 45-45 of FIG. 44. FIG. 46 is a cross-sectional view taken along a line 46-46 of FIG. 44. FIG. 47 is a cross-sectional view taken along a line 47-47 of FIG. 44. A cross section taken along one word line WL is similar to that shown in FIG. 27.

The third embodiment differs from the second embodiment in that each first gate electrode GE1 is formed so that a width W1 of the first gate electrode GE1 in the column direction is smaller than a width W2 of each body B in the column direction. The third embodiment also differs from the second embodiment in that the source line contacts SLCs and the bit line contacts BLCs do not reach the BOX layer 20. Furthermore, the third embodiment differs from the second embodiment in that the first gate lines GL1 are provided as shown in FIG. 46. The first gate lines GL1 are formed at positions lower than those of the Fin semiconductor layers 31 similarly to the first embodiment. Other configurations of the third embodiment can be similar to those according to the second embodiment.

As described above, each of the first gate electrodes GE1 is formed so that the width W1 of the first gate electrode GE1 is smaller than the width W2 of each body B. Due to this, the first gate electrode GE1 does not front on a junction between the body B and the drain D and a junction between the body B and the source S (indicated by X in FIG. 44). If the first gate electrode GE1 fronts on the junction between the body B and the drain D and the junction between the body B and the source S, GIDL (Gate Inducted Drain Leakage) occurs when a high negative potential (e.g., −3 V) is applied to the first gate electrode GE1. The GIDL causes shorter data retention time. In the third embodiment, the first gate electrode GE1 does not front on the junction between the body B and the drain D and the junction between the body B and the source S. This can prevent the GIDL and lengthen the data retention time.

In the third embodiment, the source line contacts SLCs and the bit line contacts BLCs do not reach the BOX layer 20. However, since the SOI layer 30 remaining below the source line contacts SLCs and the bit line contacts BLCs is thin, an effect of sufficiently suppressing the bipolar disturbance can be produced. The silicide layer 35 is formed not only on the side surfaces of the source line contacts SLCs and the bit line contacts BLCs but also on bottoms thereof. It is thereby possible to further reduce the source-drain contact resistance.

Figure 48:
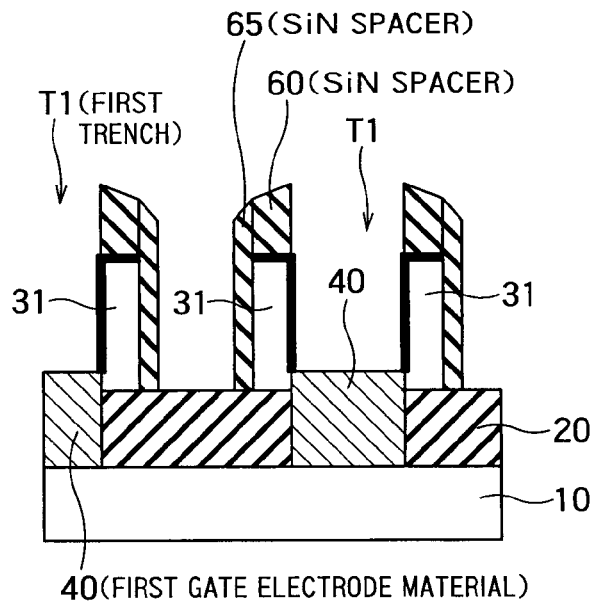
FIGS. 48 to 51 show a method of manufacturing the FBC memory device according to the third embodiment.
Figure 49:
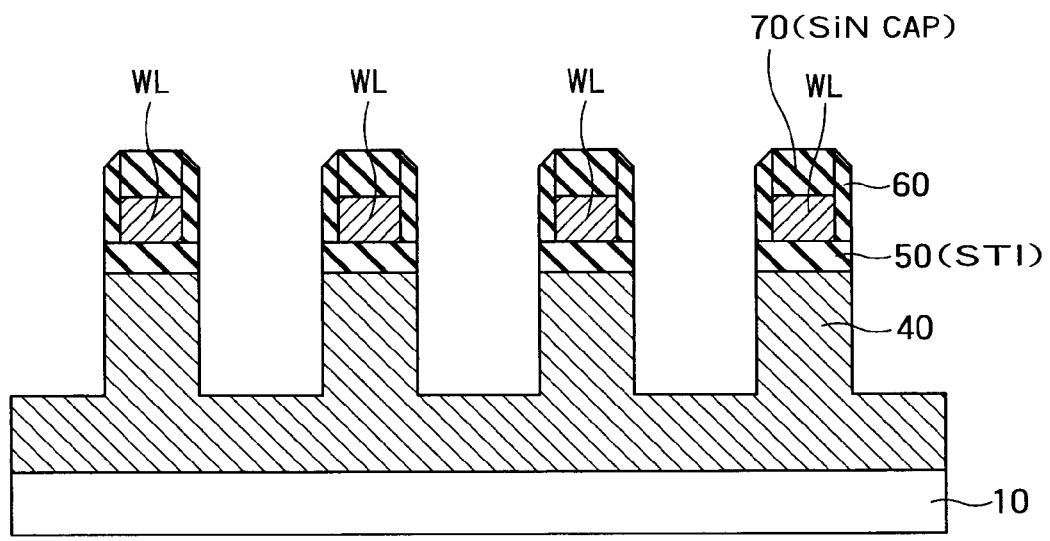
Figure 50:
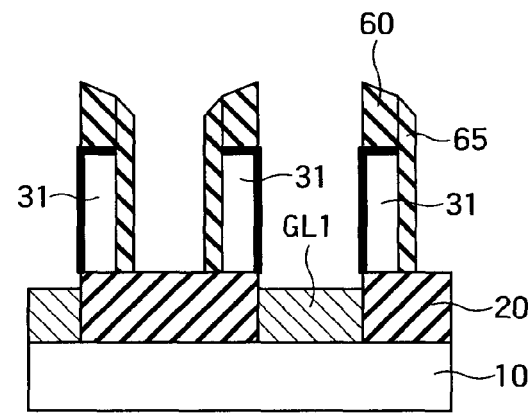
Figure 51:
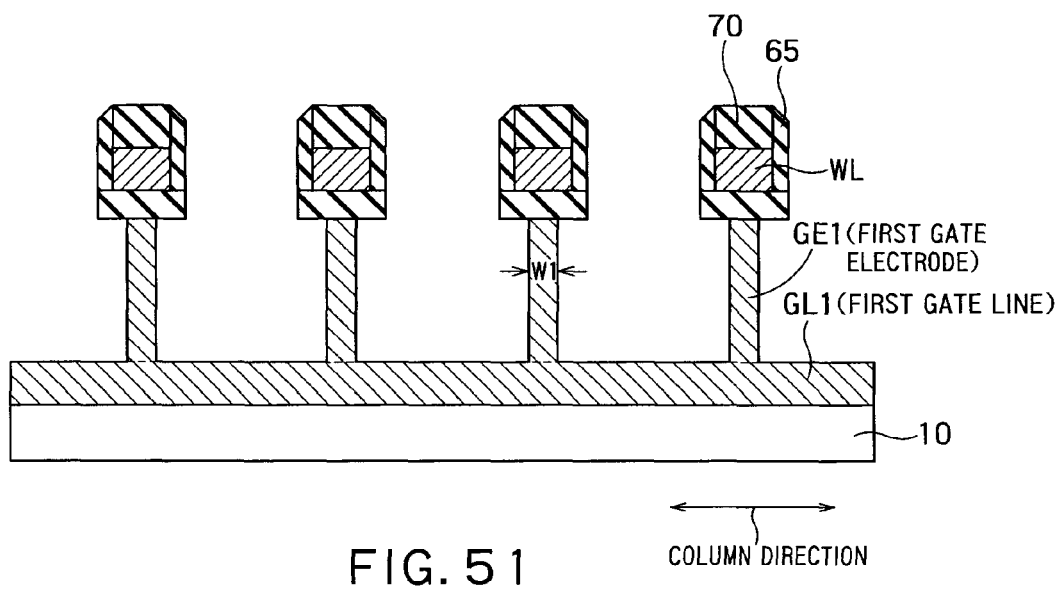

A manufacturing method according to the third embodiment will be described. FIGS. 48 and 50 are cross-sectional views taken along a line 47-47 of FIG. 44 and showing steps, and FIGS. 49 and 51 are cross-sectional views taken along a line 45-45 of FIG. 44 and showing steps. After forming the structure shown in FIGS. 34A to 34C, the first gate electrode material 40 is anisotropically etched using the SiN spacers 60 and 65 and the SiN cap 70 as a mask as shown in FIG. 49. At this time, the first gate electrode material 40 is etched not down to the supporting substrate 10 but left along the bottoms of the first trenches. At this stage, the top surface of the first gate electrode material 40 in the regions other than the word lines WLs can be located at a higher position than that of the bottoms of the Fin semiconductor layers 31 as shown in FIG. 48.

As shown in FIGS. 50 and 51, the first gate electrode material 40 is isotropically etched by CDE (Chemical Dry Etching). As a result, the first gate electrodes GE1 each having the width W1 smaller than the width of each body B in the column direction are formed. As shown in FIG. 50, the first gate electrode material 40 in the regions other than the word lines WLs (the first gate lines GL1) are etched so that the top surface of the first gate electrode material 40 is lower than the bottom surfaces of the Fin semiconductor layers 31.

Thereafter, similar steps to those according to the second embodiment are executed except that contact holes CHs for forming the source line contacts SLCs and the bit line contacts BLCs do not penetrate the Fin semiconductor layers 31 (stop halfway along the Fin semiconductor layers 31). As a result, the source line contacts SLCs and the bit line contacts BLCs shown in FIG. 45 can be formed.

Fourth Embodiment

Figure 52:
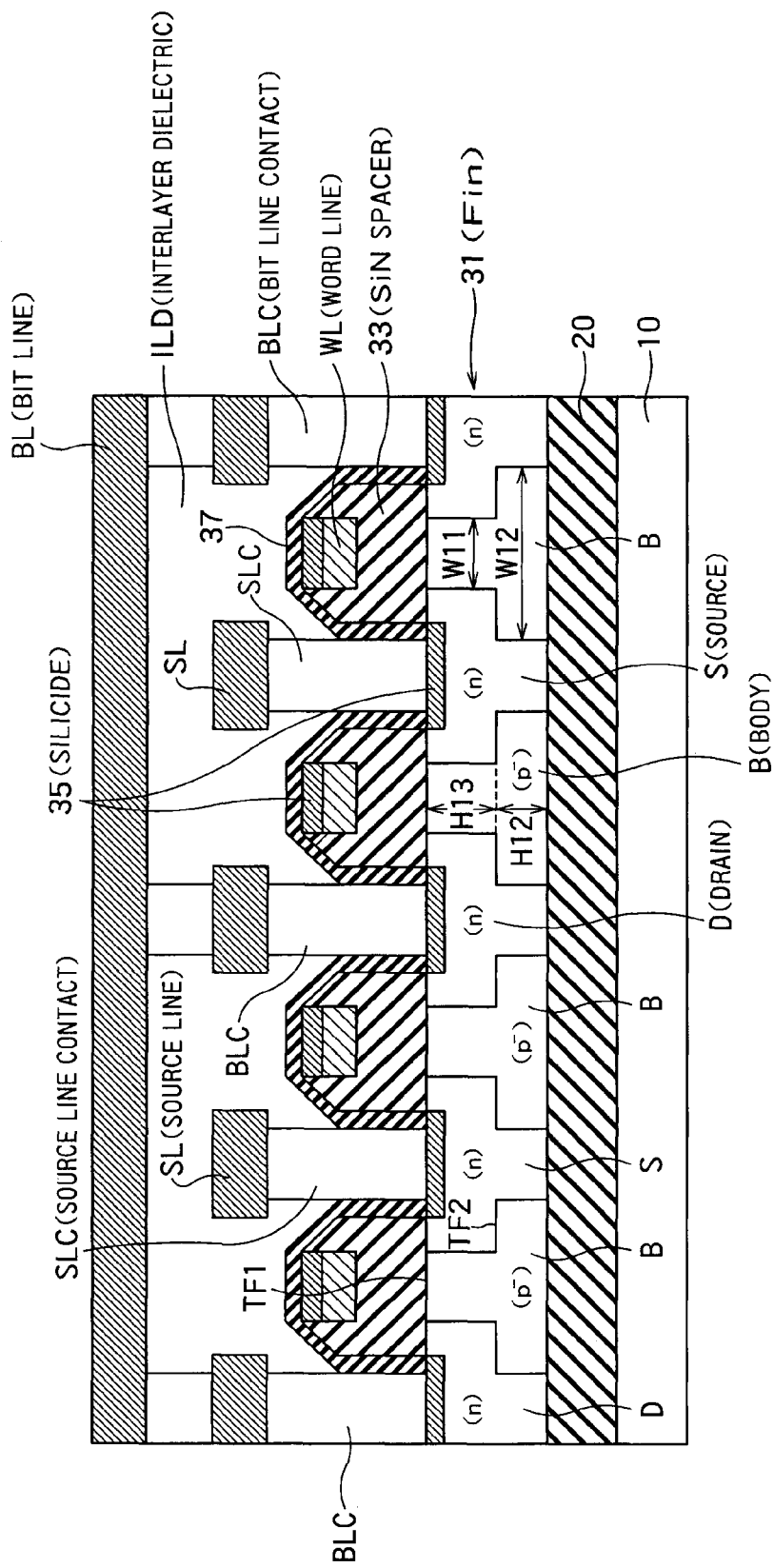
FIGS. 52 to 54 are cross-sectional views of an FBC memory device according to a fourth embodiment of the present invention.
Figure 53:
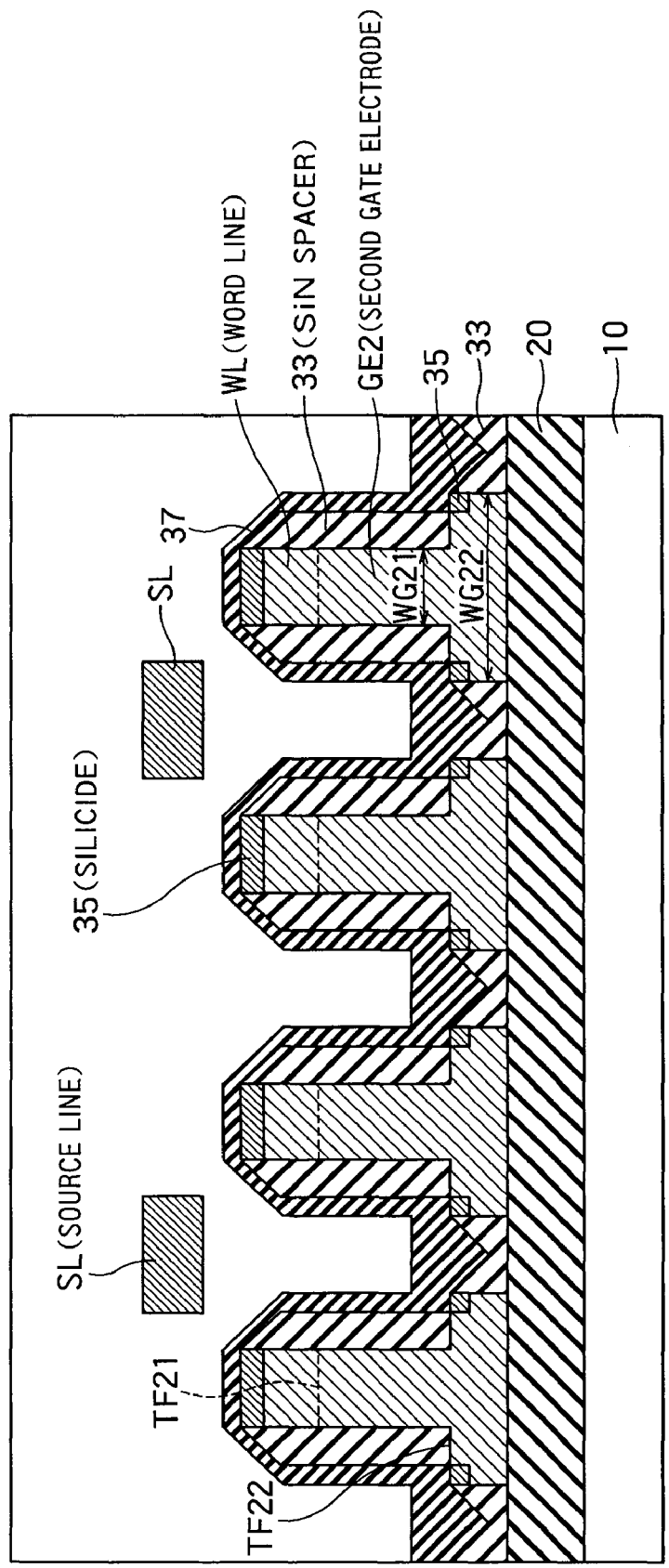
Figure 54:
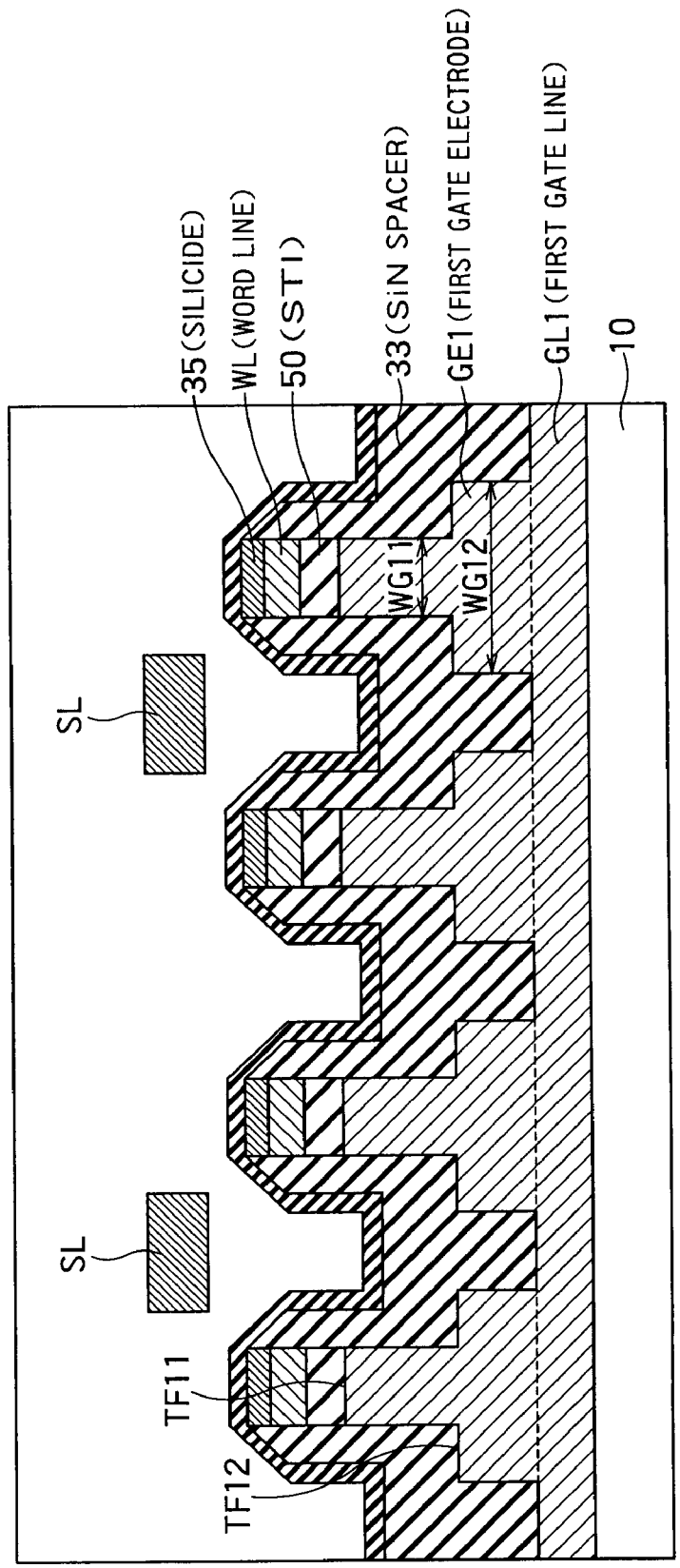

FIGS. 52 to 54 are cross-sectional views of an FBC memory device according to a fourth embodiment of the present invention. FIGS. 52 and 54 correspond to FIGS. 24 and 25 according to the second embodiment, respectively. A plan view of the FBC memory device according to the fourth embodiment is similar to that shown in FIG. 23. However, differently from the second embodiment, the source line contacts SLC and the bit line contacts BLCs do not penetrate the Fin semiconductor layers 31 similarly to the first embodiment.

As shown in FIGS. 52 to 54, the fourth embodiment differs from the second embodiment in that each of the bodies B, the first gate electrodes GE1, and the second gate electrodes GE2 is formed into an inverse T shape. In other words, each of the bodies B, the first gate electrodes GE1, and the second gate electrodes GE2 is formed so that a portion thereof spreads in a step-shape relatively to an upper portion thereof.

As shown in FIG. 52, in a cross section perpendicular to the row direction, a width of an upper portion of each body B (width in the column direction) is W11 and a width of a lower portion thereof is W12 (>W11). The body B has two top surfaces TF1 and TF2 different in height. As shown in FIG. 54, in a cross section perpendicular to the row direction, a width of an upper portion of each first gate electrode GE1 is WG11 and a width of a lower portion thereof is WG12 (>WG11). Each of the first gate electrodes GE1 includes the first part and the second part. The first part of the first electrode GE1 is formed below the word lines WLs and has the top surface TF11. The second part of the first electrode GE1 has the top surface TF12 lower than the top surface TF11. Differently from the preceding embodiments, the top surface TF12 is located between the top surface and the bottom surface of the corresponding Fin semiconductor layer 31. As shown in FIG. 53, in a cross section perpendicular to the row direction, a width of an upper portion of each second gate electrode GE2 is WG21 and a width of a lower portion thereof is WG22 (>WG21). Each of the second gate electrodes GE2 includes a first part and a second part. The first part of the second electrode GE2 extends downward from the word lines WLs and has a top surface TF21. The second part of the second electrode GE2 has a top surface TF22 lower than the top surface TF21 of the first part. The top surface TF22 is located between the top surface and the bottom surface of the corresponding Fin semiconductor layer 31.

Since the width W11 of the upper portion of each body B is smaller than the width W12 of the lower portion thereof, drain current can be made high. If the drain current is high, impact ionization current increases and a speed of writing data "1" is accelerated. If the drain current is high, data read speed is also accelerated. If a height H13 in a region of the body B having the width W13 is increased, it is possible to increase the drain current and reduce the fluctuation in threshold voltage without increasing the cell size, as already described in the first embodiment. However, even if the height H13 is increased, the threshold voltage difference between the "0" cell and the "1" cell does not increase but, as described in the "BACKGROUND OF THE INVENTION" part, decreases according to a reduction in gate length (width W11 of the body B).

On the other hand, since the width W12 of the lower portion of the body B is larger than the width W11 of the upper portion thereof, the lower portion of the body B acts as a region having a large gate length. Specifically, an area of the body portion facing the plate electrode increases, and an influence of the capacitance of the plate electrode on the potential of the body B becomes greater than that of the parasitic capacitance of the drain D on the potential of the body B. As a result, the threshold voltage difference between the "0" cell and the "1" cell increases. By increasing a height H12 in a region of the body B having the width W12, the signal difference between the "1" cell and the "0" cell increases even if the size of each memory cell MC is reduced. The heights H12 and H13 can be appropriately decided according to specifications of the FBC memory device.

Each of the first gate electrodes GE1 and the second gate electrodes GE2 is formed to correspond to a shape of the body B. Accordingly, the widths WG11 and WG21 can be set equal to the width W11. The widths WG12 and WG22 can be set equal to the width W12. By so setting, each first gate electrode GE1 fronts on the entire first side surface of each body B, and each second gate electrode GE2 fronts on the entire second side surface thereof. However, each of the first gate electrodes GE1, the second gate electrodes GE2, and the first gate lines GL1 does not front on the source layers S and the drain layers D. By so configuring, the parasitic capacitance of the FBC memory device according to the fourth embodiment is small similarly to the second embodiment.

As can be seen from FIGS. 52 to 54, the top surface TF12 of the second part of the first gate electrodes GE1 formed below the source lines SLs is lower than the top surface of each Fin semiconductor layer 31 by as much as H13. The SiN spacers 33 and the stopper SiN are deposited on the top surface TF12. This can prevent a short circuit between the bottom of each source line contact SLC and the top surface TF12. Likewise, the bottom of each bit line contact BLC is away and isolated from the top surface TF12 of the second part of the first gate electrode GE1 by as much as H13. This can prevent a short circuit between each drain layer D and the plate electrode. Furthermore, the top surface TF22 of the second part of each second gate electrode GE2 is apart from the bottom of each source line contact SLC and that of each bit line contact BLC by as much as H13, thereby making it possible to prevent short circuits between the bottom of the source line contact SLC and the top surface TF22 and between the bottom of the bit line contact BLC and the top surface TF22, respectively.

A distance between the two adjacent word lines WLs according to the fourth embodiment is identical to that according to the second embodiment. Namely, the fourth embodiment can reduce the cell size similarly to the second embodiment and make the signal difference greater than that according to the second embodiment.

A manufacturing method according to the fourth embodiment will be described. First, through similar steps to those according to the second embodiment, the structure shown in FIG. 30 is obtained. Next, the second gate electrode material 62 and the SiN cap 70 are deposited on the structure.

Figure 55:
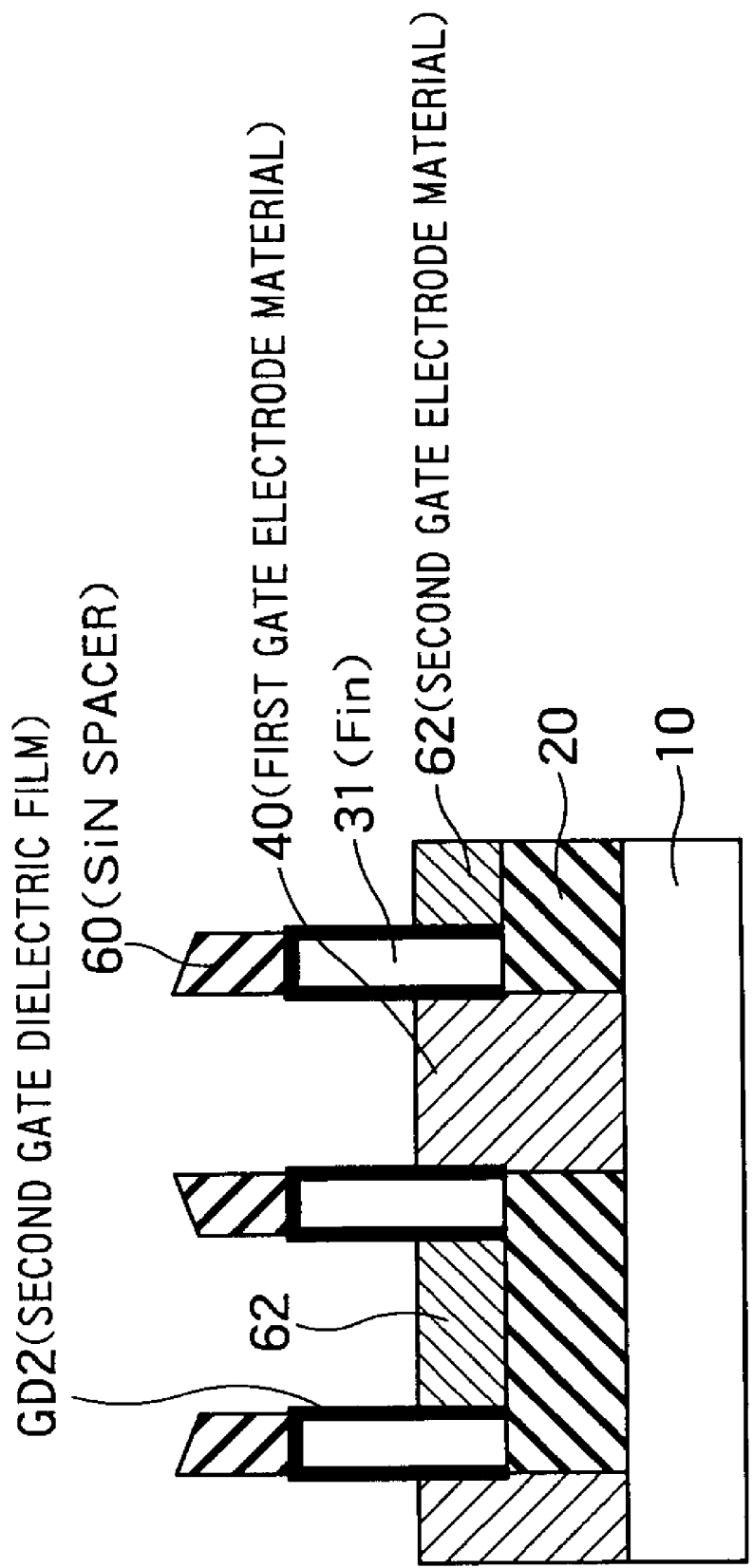

After the SiN cap 70 is patterned into a shape of word lines WLs, the first gate electrode material 40, the STI material on the second gate electrode material 62, and the second gate electrode material 62 are etched using the SiN cap 70 as a mask through similar steps to those according to the first embodiment. At this time, as shown in FIG. 55, the top surface of the first gate electrode material 40 is higher in level than the bottom of each Fin semiconductor layer 31. The top surface of the second gate electrode material 62 is almost equal in height to that of the first gate electrode material 40.

FIGS. 56A and 56B are cross-sectional views in the column direction. Comparison of FIG. 56A with FIG. 32B shows that the fourth embodiment differs from the second embodiment in that the second gate electrode material 62 is not etched down to the BOX layer 20 at this stage. Furthermore, comparison of FIG. 56B with FIG. 32C shows that the fourth embodiment differs from the second embodiment in that the first gate electrode material 40 is etched so as to be equal in height to the second gate electrode material 62.

Thereafter, a lower-layer resist 80, an SOG (Spin On Glass), and an upper-layer resist are formed on the first and second gate electrode materials 40 and 62. The upper-layer resist is patterned to have the width W12 larger than the width W11 of each word line WL. Using the patterned upper-layer resist as a mask, the SOG and the lower-layer resist 80 are etched. Further, using the SOG and the lower-layer resist 80 as a mask, the first and second gate electrode materials 40 and 62 are etched. As a result, as shown in FIGS. 57A and 57B, the first gate electrodes GE1 and the second gate electrodes GE2 are formed.

The SOG and the lower-layer resist 80 are removed and the steps shown in FIG. 19 and the following according to the first embodiment are executed, thereby completing the FBC memory device according to the fourth embodiment.

(Modification of Fourth Embodiment)

Figure 59:
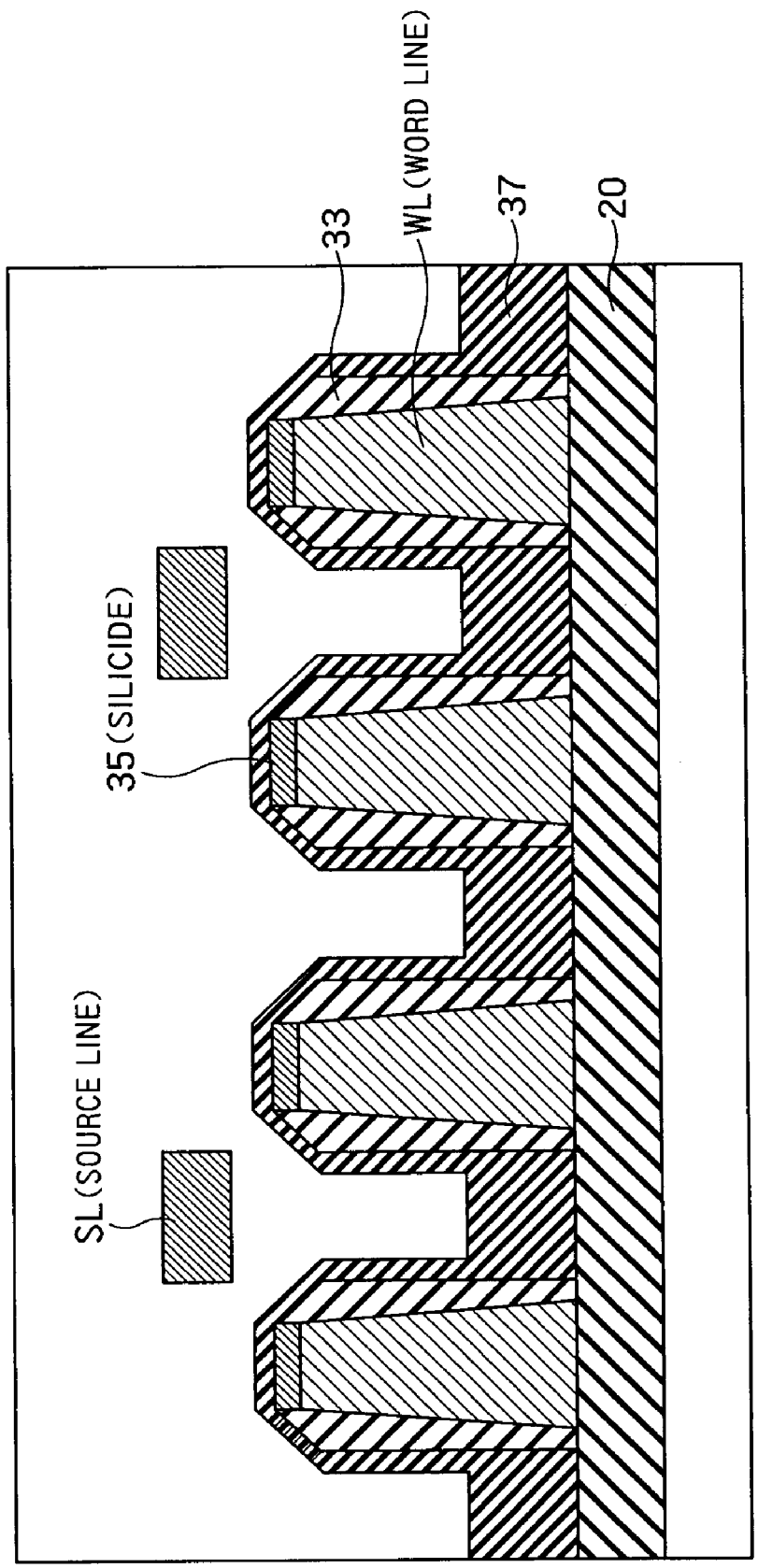

FIGS. 58 and 59 are cross-sectional views of an FBC memory device according to a modification of the fourth embodiment of the present invention. In the modification, a lower portion of each of the bodies B and the first and second gate electrodes GE1 and GE2 are gradually wider relatively to the upper portion thereof in a forward tapered manner.

As a method of manufacturing the FBC memory device according to the modification of the fourth embodiment, it suffices that taper etching is performed at the step shown in FIGS. 55 and 56. Thereafter, the steps shown in FIG. 19 and the following according to the first embodiment are executed without executing the step shown in FIGS. 57A and 57B, thereby completing the FBC memory device according to the modification. Since it is possible to dispense with the lithographic step shown in FIGS. 57A and 57B, the FBC memory device according to the modification can be manufactured at lower cost than that according to the fourth embodiment.

Fifth Embodiment

FIG. 60 is a plan view showing wirings of an FBC memory device according to a fifth embodiment of the present invention. In the fifth embodiment, each of the source line contacts SLCs and the bit line contacts BLCs is formed into an ellipse having a major diameter in the column direction.

Figure 61:
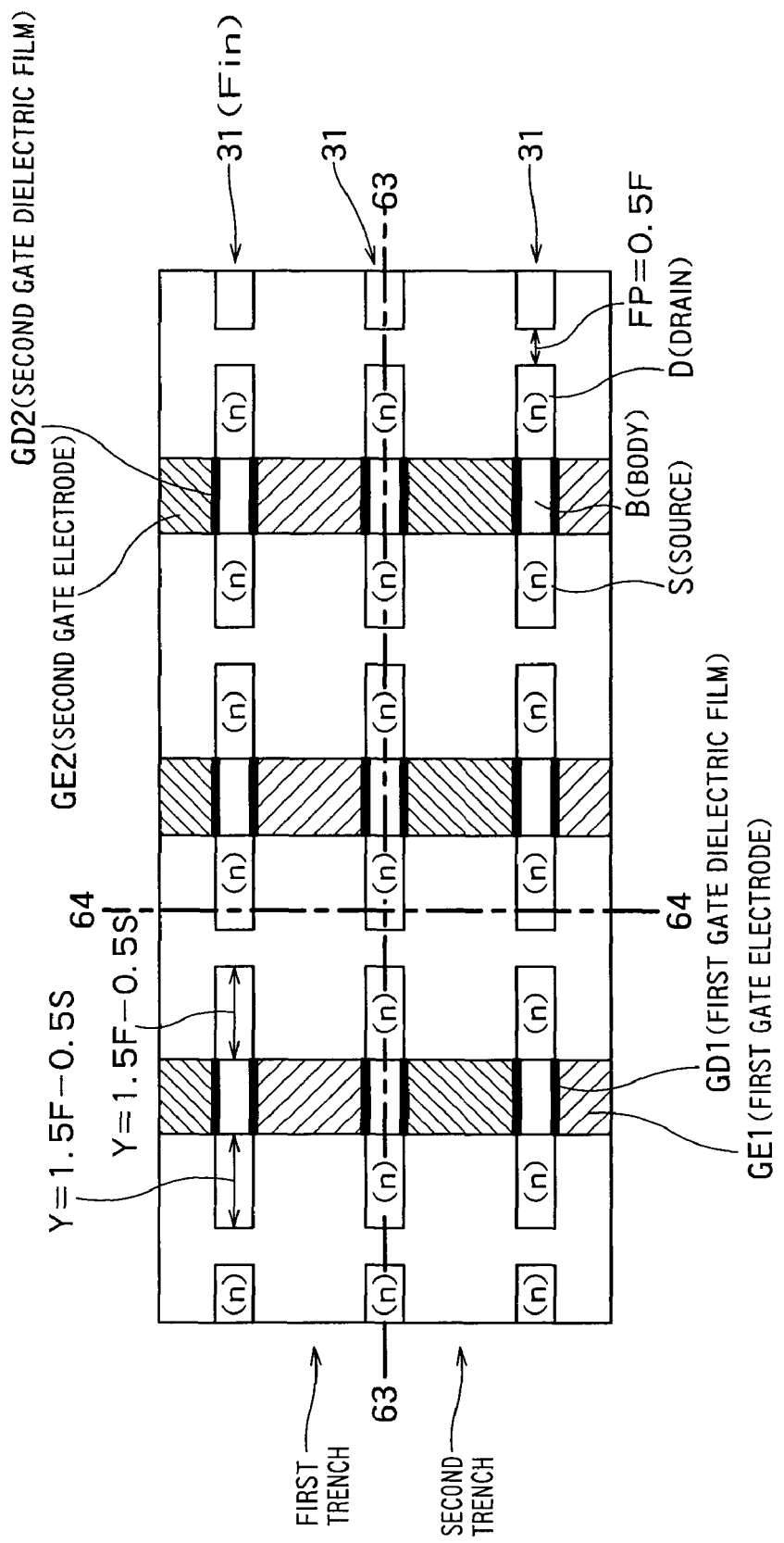
FIG. 61 is a plan view along upper surfaces of the bodies B.
Figure 62:
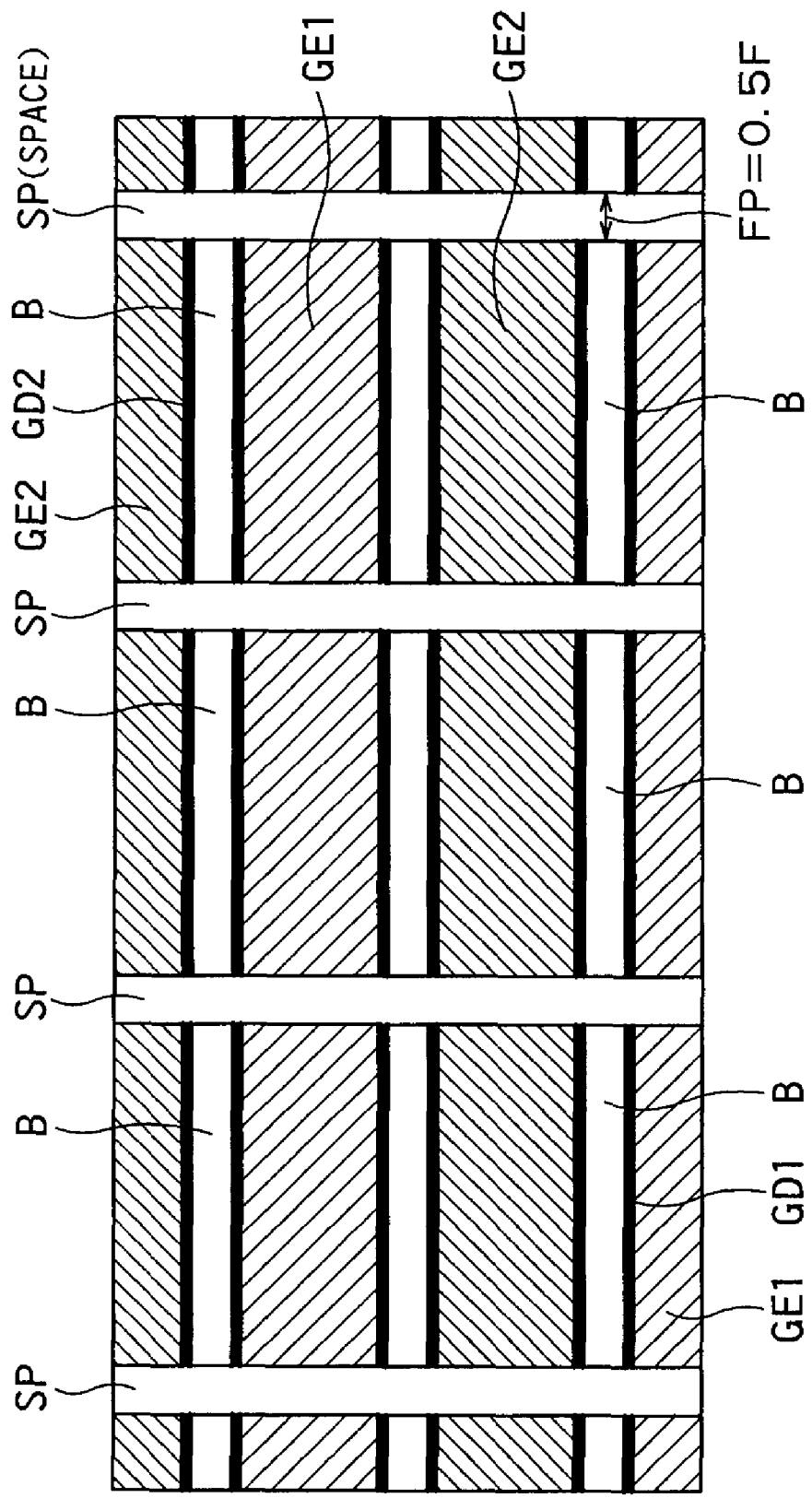
FIG. 62 is a plan view along bottoms of the bodies B.

FIG. 61 is a plan view along top surfaces of the bodies B. FIG. 62 is a plan view along bottom surfaces of the bodies B. As can be seen from FIG. 61, the Fin semiconductor layers 31 according to the fifth embodiment are cut among the memory cells MCs adjacent in the column direction. The width of a space SP between the two memory cells MCs adjacent in the column direction is, for example, 0.5F.

Figure 63:
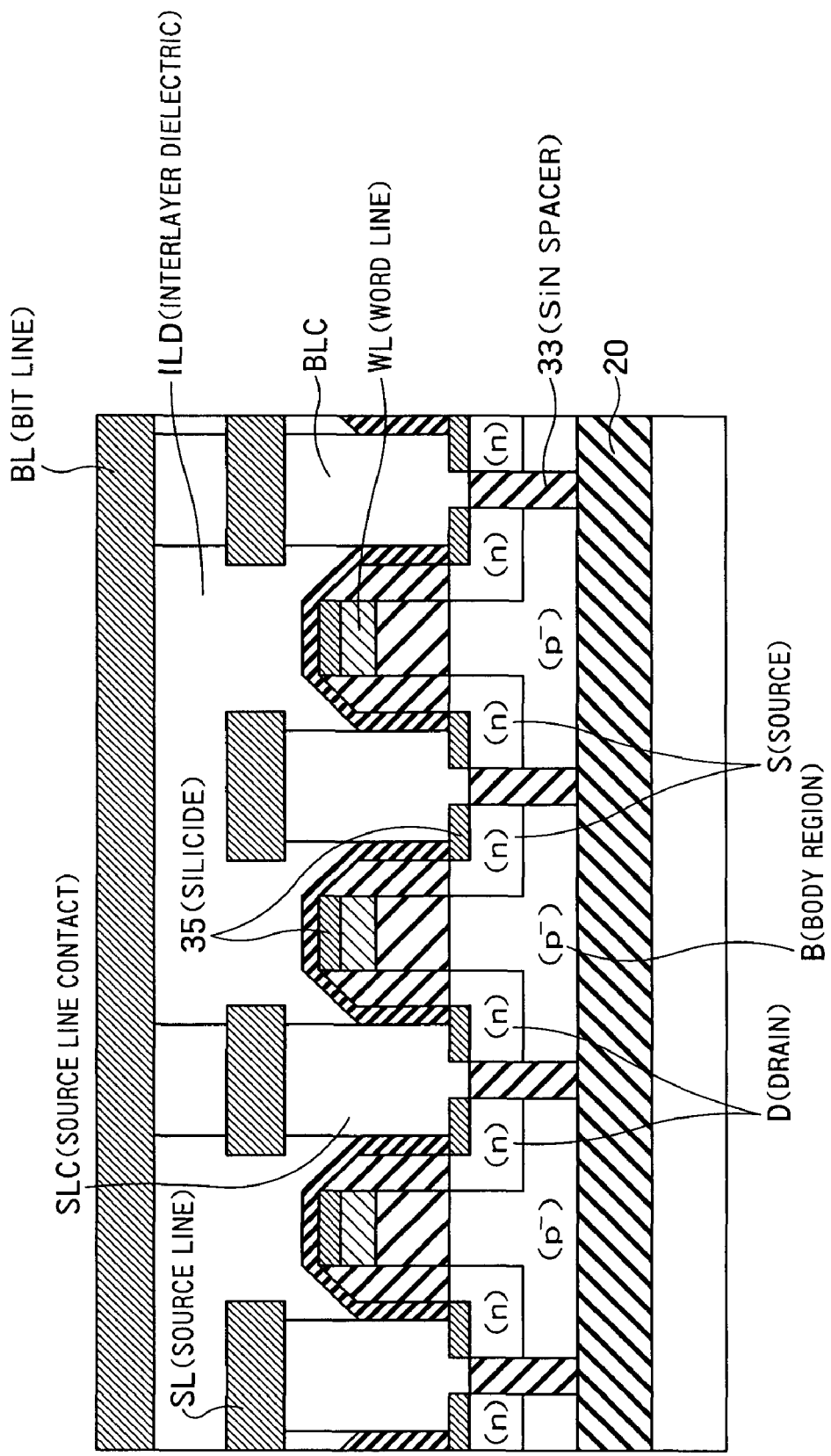
FIG. 63 is a cross-sectional view taken along a line 63-63 of FIG. 61.
Figure 64:
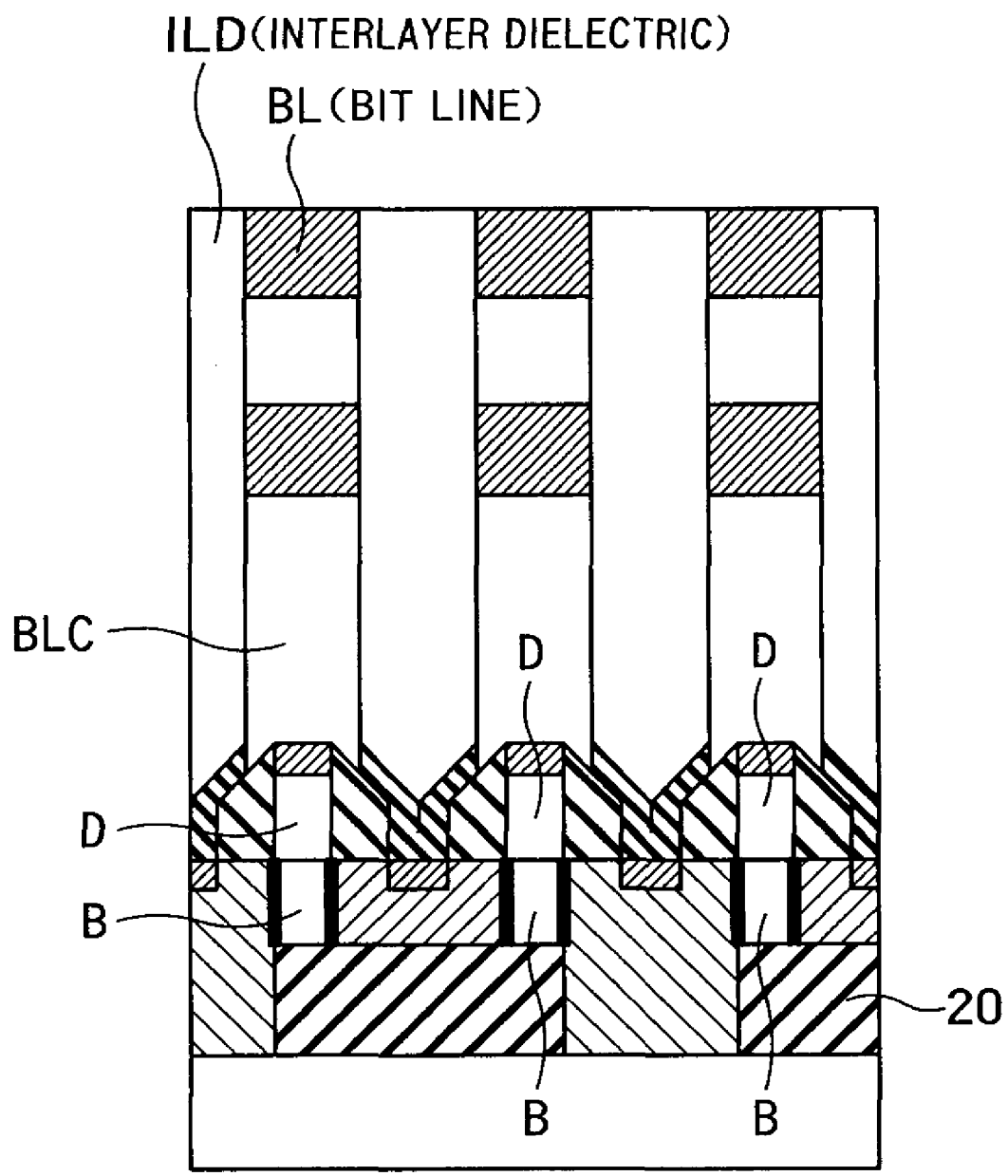
FIG. 64 is a cross-sectional view taken along a line 64-64 of FIG. 61.

FIG. 63 is a cross-sectional view taken along a line 63-63 of FIG. 61 (along one bit line BL). FIG. 64 is a cross-sectional view taken along a line 64-64 of FIG. 61. As can be seen from FIG. 63, the bottom surface of each body B is wider than the top surface thereof in the column direction and spreads throughout each Fin semiconductor layer 31. Therefore, as shown in FIG. 62, the body B is formed in the entire Fin semiconductor layer 31 and the source layer S and the drain layer D do not appear in the drawing. The first and second gate electrodes GE1 and GE2 are formed to front on the entire body B. In FIG. 62, therefore, each of the first and second gate electrodes GE1 and GE2 appears equal in length to each body B in the column direction. As shown in FIG. 64, in the cross section of the bit line contacts BLC in the row direction, each drain layer D is provided above the body B.

In the fifth embodiment, since the memory cells MCs adjacent in the column direction are isolated by dielectric films, no bipolar disturbance occurs. Because of the space SP between the two adjacent memory cells MCs, each of the source line contacts SLCs and the bit line contacts BLCs is formed into an ellipse having a major diameter in the column direction in the plan view. By so forming, each source line contact SLC and each bit line contact BLC can be connected to the source layers S and the drain layers D of the adjacent memory cells MCs in common at low resistance.

In the fifth embodiment, each of the bodies B has an inverse T shape similarly to the fourth embodiment. Although the lower portion of each body B is not interposed between the source layer S and the drain layer D, an area of the body portion fronting on the plate electrode increases and an influence of the capacitance of the plate electrode on the potential of the body B becomes greater than that of the parasitic capacitance of the drain D on the potential of the body B. As a result, the threshold voltage difference between the "0" cell and the "1" cell increases. In the fourth embodiment, if the height H12 shown in FIG. 52 increases, the area of the pn junction between the body B and the source S and that between the body B and the drain D increase. In the fifth embodiment, by contrast, if the height H12 is set large, the areas of the pn junctions do not increase since the lower portion of the body B is not interposed between the source layer S and the drain layer D. It is thereby possible to increase the number of holes accumulated in the body B while suppressing an increase in the leakage current at each pn junction. As a result, memory cell data retention time can be lengthened. Moreover, the first and second gate electrodes GE1 and GE2 are provided to correspond to the body B and do not front on the source layer S and the drain layer D. Top surfaces of the second part of the first gate electrode GE1 and the second part of the second gate electrode GE2 are located at lower positions than the top surface of each Fin semiconductor layer 31. Therefore, the fifth embodiment can also achieve the effect of the fourth embodiment.

Since each of the source line contacts SLCs and the bit line contacts BLCs is formed into an ellipse in the plan view, the unit cell size is larger than those according to the other embodiments as shown in FIG. 60. The distance D between one word line WL and one source line contact SLC or bit line contact BLC is, for example, 0.75F. A major diameter Φ of each source line contact SLC or bit line contact BLC is, for example, 3F−2D=1.5F. A width of each word line WL is, for example, F. In this case, the unit cell size is $8F^2$.

A method of manufacturing the FBC memory device according to the fifth embodiment will be described. First, through similar steps to those according to the second embodiment, the structure shown in FIG. 30 is obtained. Next, the second gate electrode material 62, the SiN cap 70, an amorphous silicon layer 90, and a silicon nitride film (SiN) layer 92 are sequentially deposited on the structure.

Figure 65:
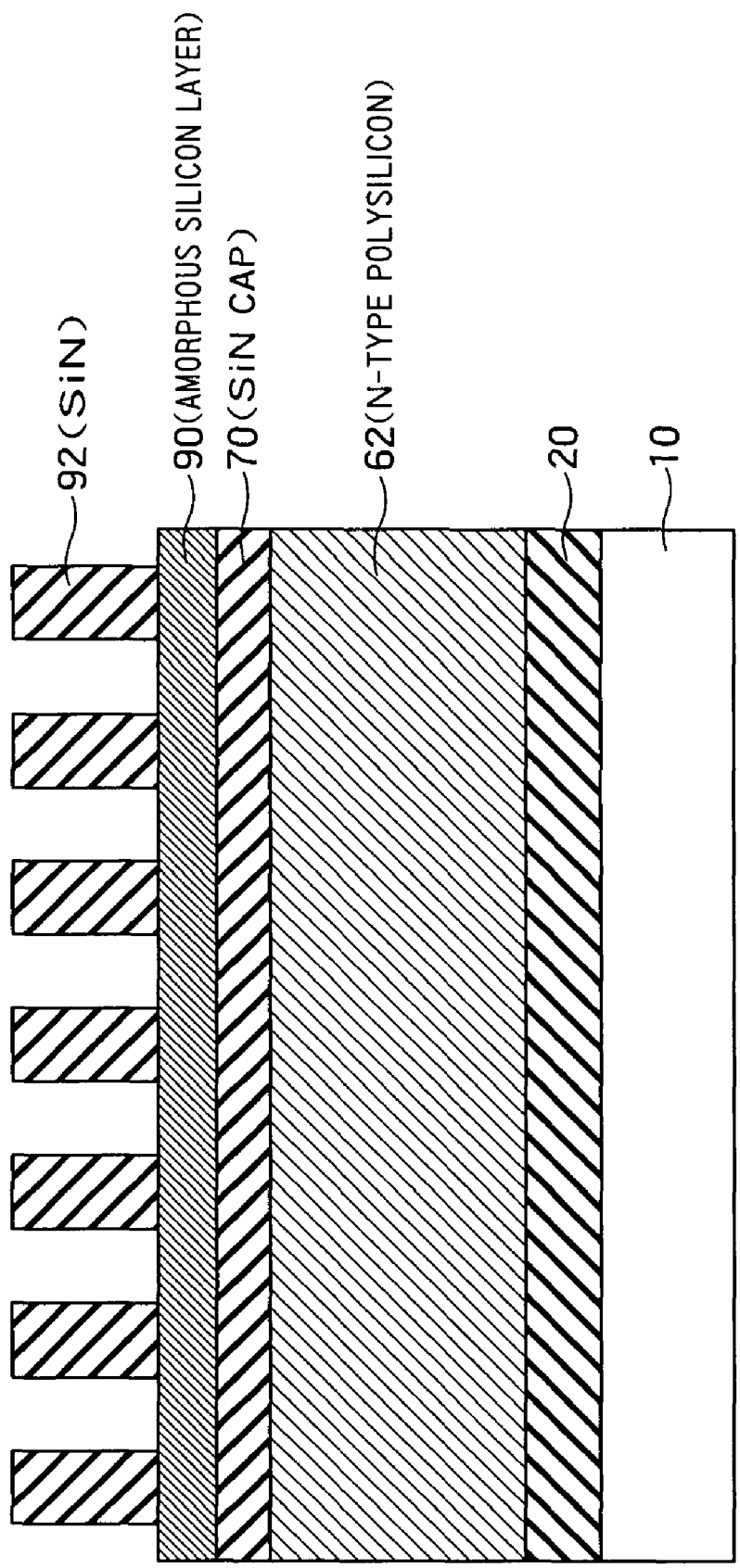
FIGS. 65 to 79 show a method of manufacturing the FBC memory device according to the fifth embodiment.
Figure 66:
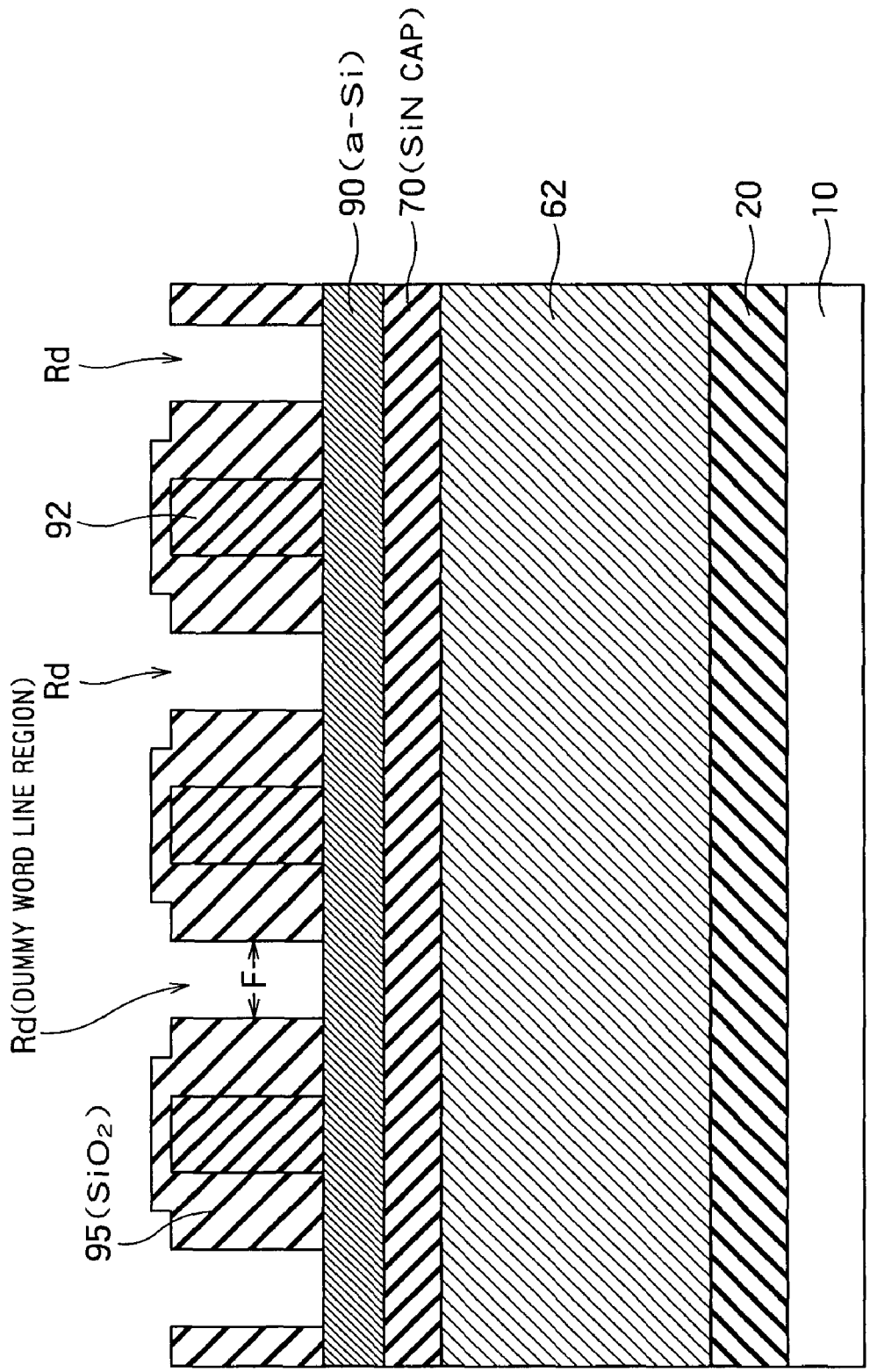
Figure 67:
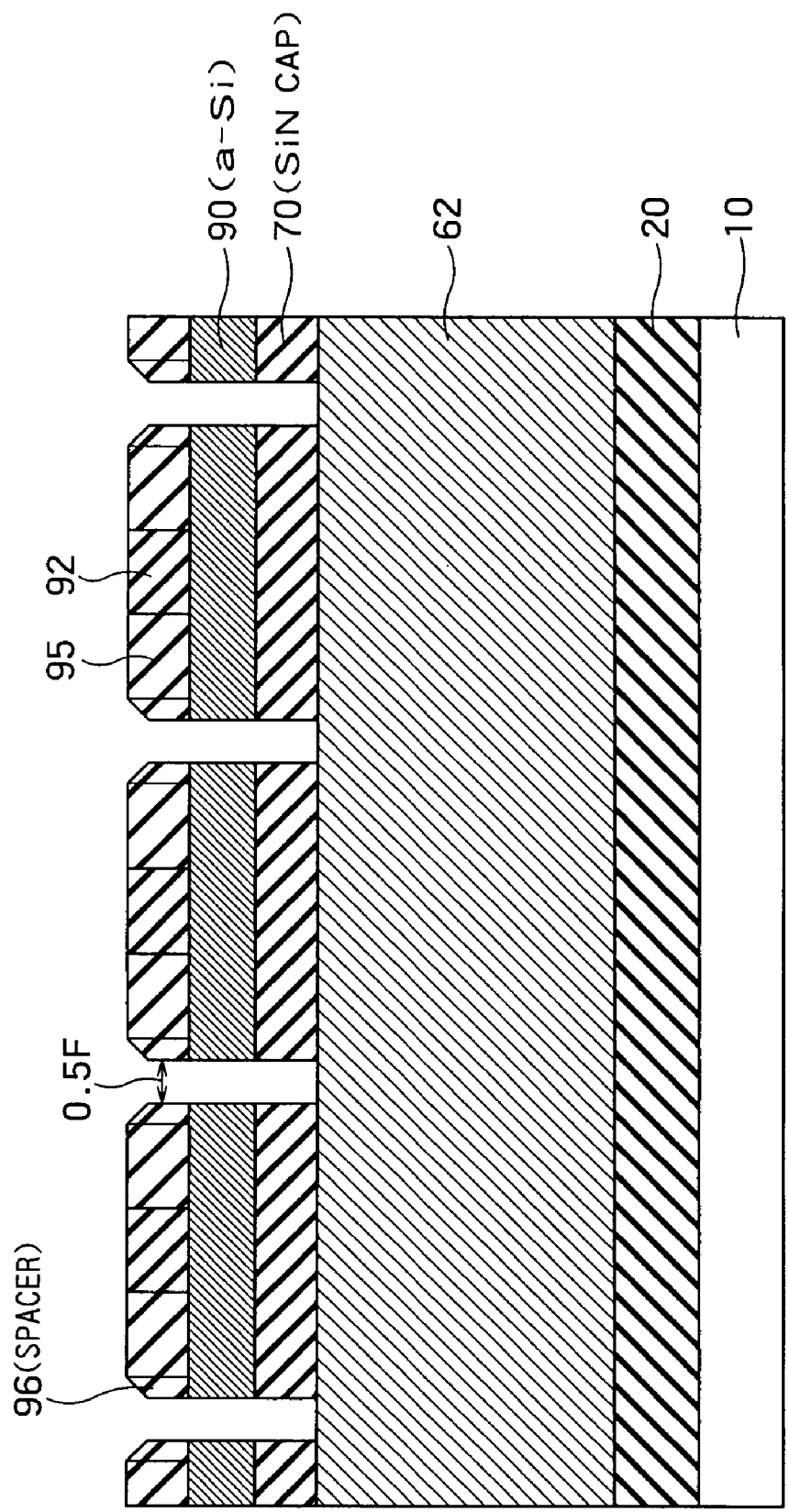

FIGS. 65 to 67 are cross-sectional views along the second trench T2. As shown in FIG. 65, the silicon nitride film layer 92 is patterned into a shape of word lines WLs and dummy word lines DWLs. Note that the pattern of dummy word lines DWLs is also used to form the spaces SP.

A silicon oxide film 95 is deposited on the silicon nitride film layer 92 and the amorphous silicon layer 90. Using the silicon nitride film layer 92 as a stopper, the silicon oxide film 95 is flattened by the CMP. After depositing the silicon oxide film 95 again, the silicon oxide film 95 and the silicon nitride film 92 in dummy word line regions Rd are removed. As a result, a structure shown in FIG. 66 is obtained. A width of each dummy word line region Rd is, for example, F.

An SiO2 spacer 96 is formed on a sidewall of each dummy word line region Rd. If a thickness of the spacer 96 is set to 0.25F, the width of each dummy word line region Rd is 0.5F. As shown in FIG. 67, using the spacers 96 and the silicon oxide film 95 as a mask, the amorphous silicon layer 90 and the SiN cap 70 are anisotropically etched.

Figure 68:
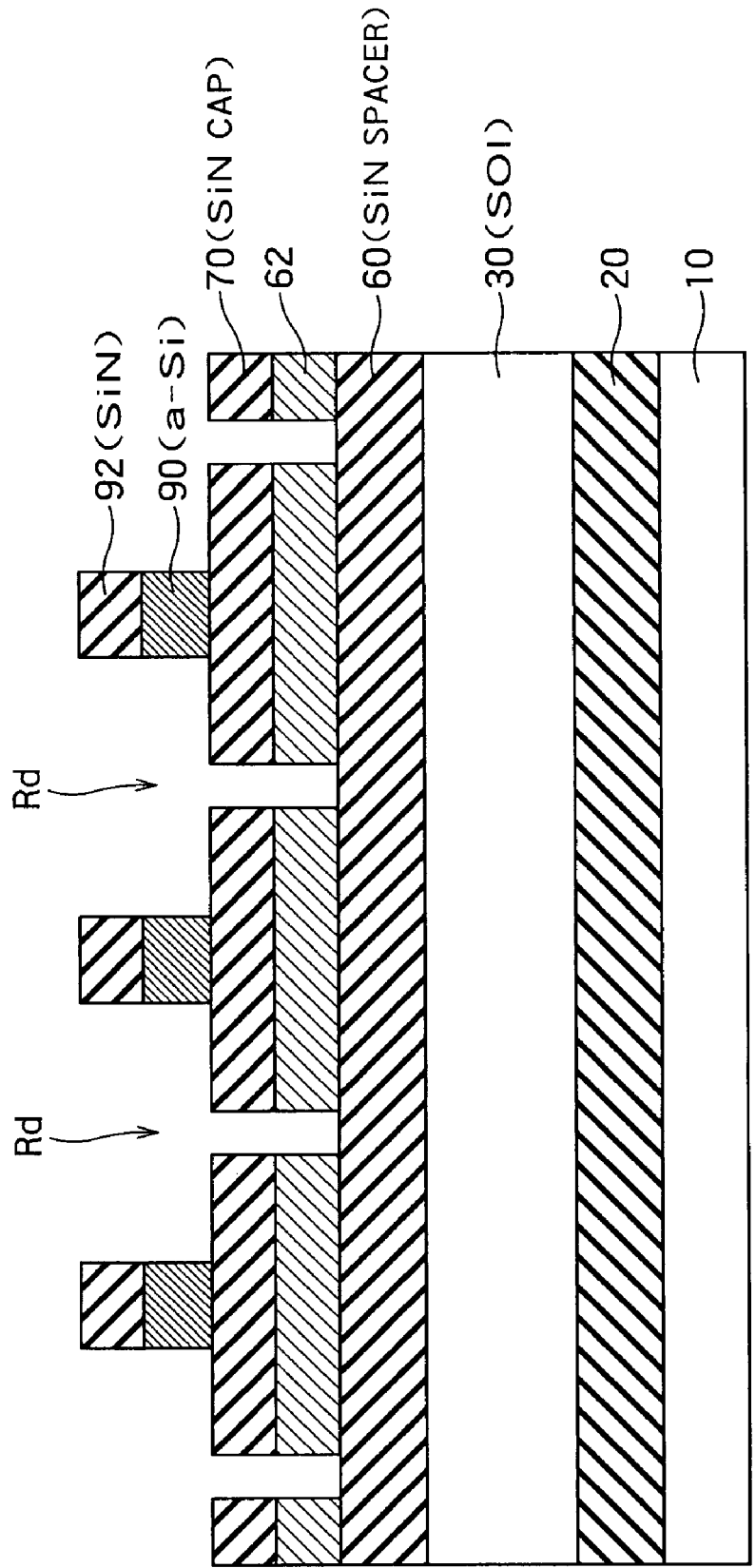
Figure 69:
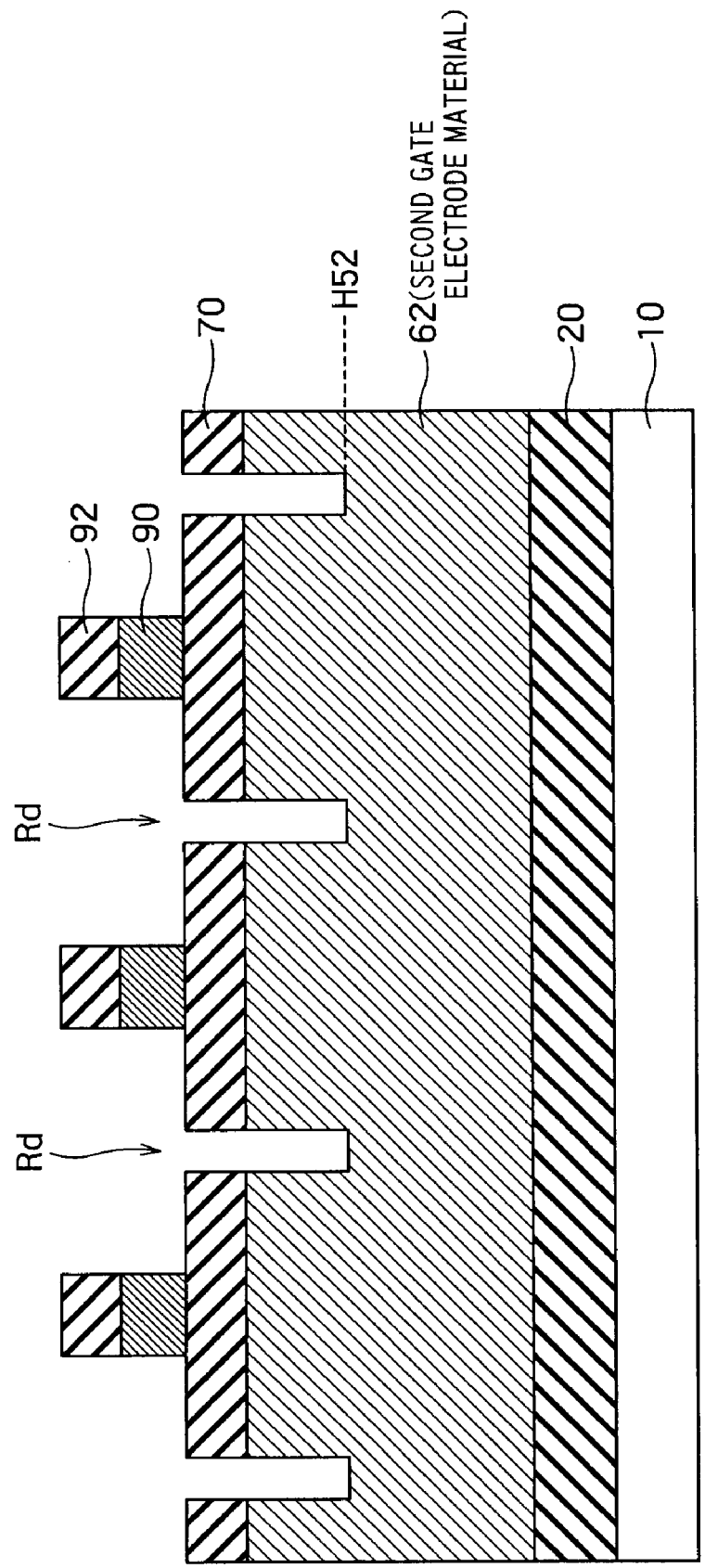
Figure 70:
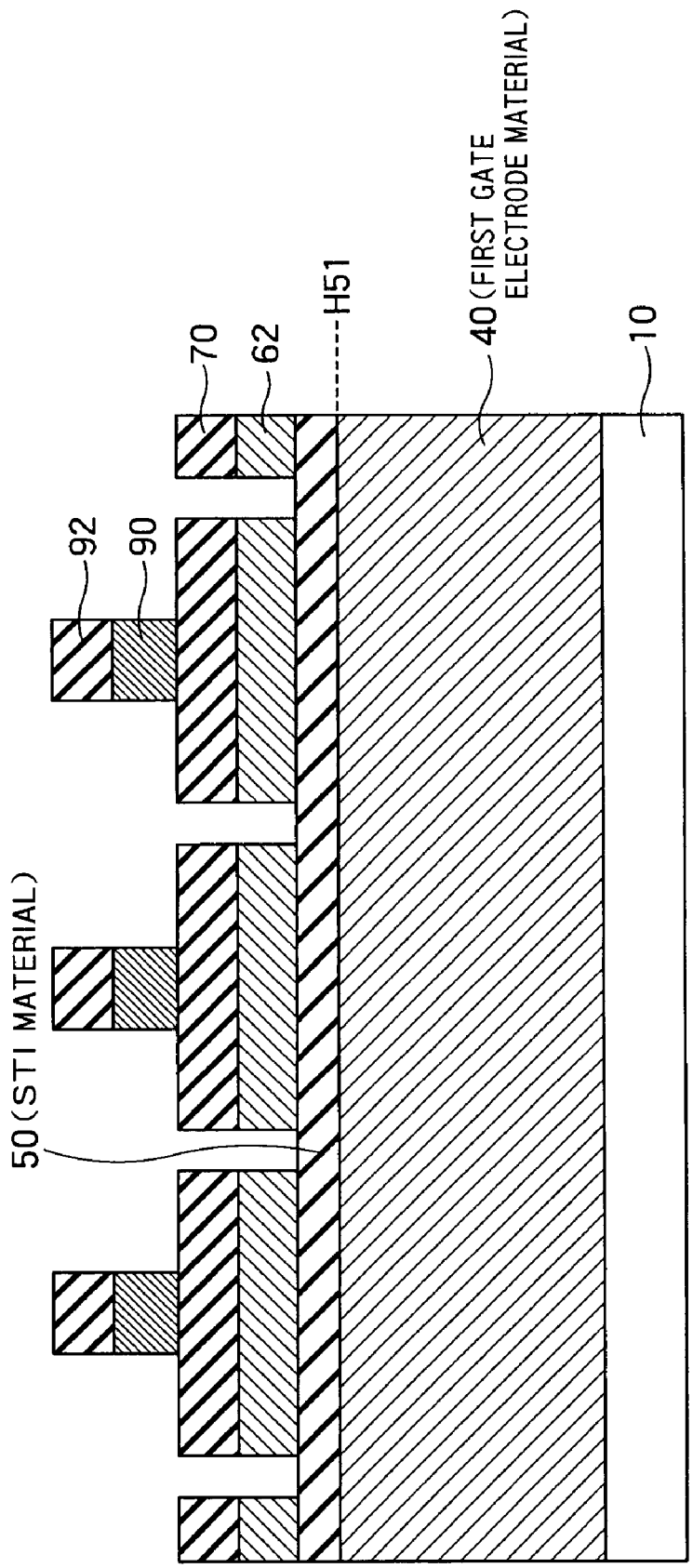

After removing the silicon oxide film 95 and the spacers 96, the second gate electrode material 62 is etched using the SiN caps 70 as a mask. At the same time, using the silicon nitride film layer 92 as a mask, the amorphous silicon layer 90 is etched. FIGS. 68 to 70 show cross sections at the same step. FIG. 69 is a cross-sectional view along the second trench T2 and subsequent to FIG. 67. FIG. 68 is a cross-sectional view along one Fin semiconductor layer 31. FIG. 70 is a cross-sectional view along the second trench T2. As shown in FIGS. 68 to 70, a height H52 of the top surface of the second gate electrode material 62 in each dummy word line region Rd is almost equal to a height H51 of the top surface of the first gate electrode material 40.

Figure 71:
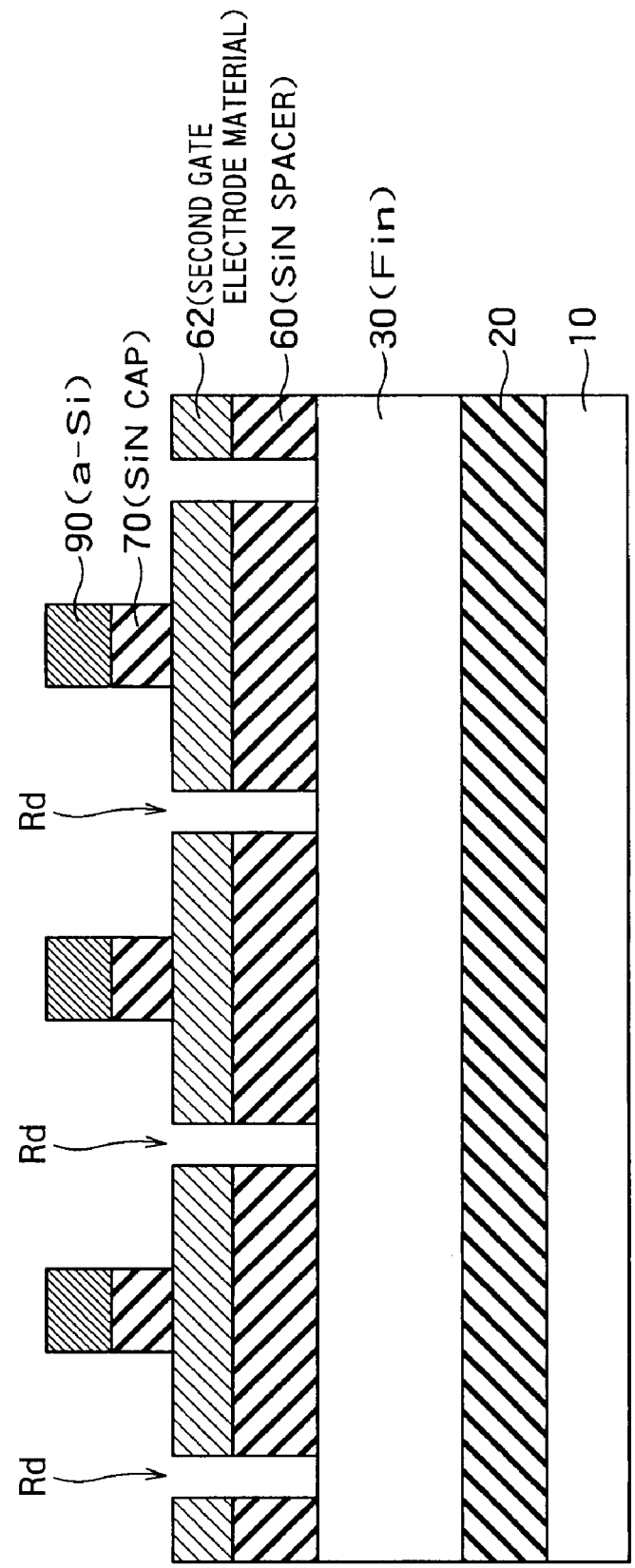
Figure 72:
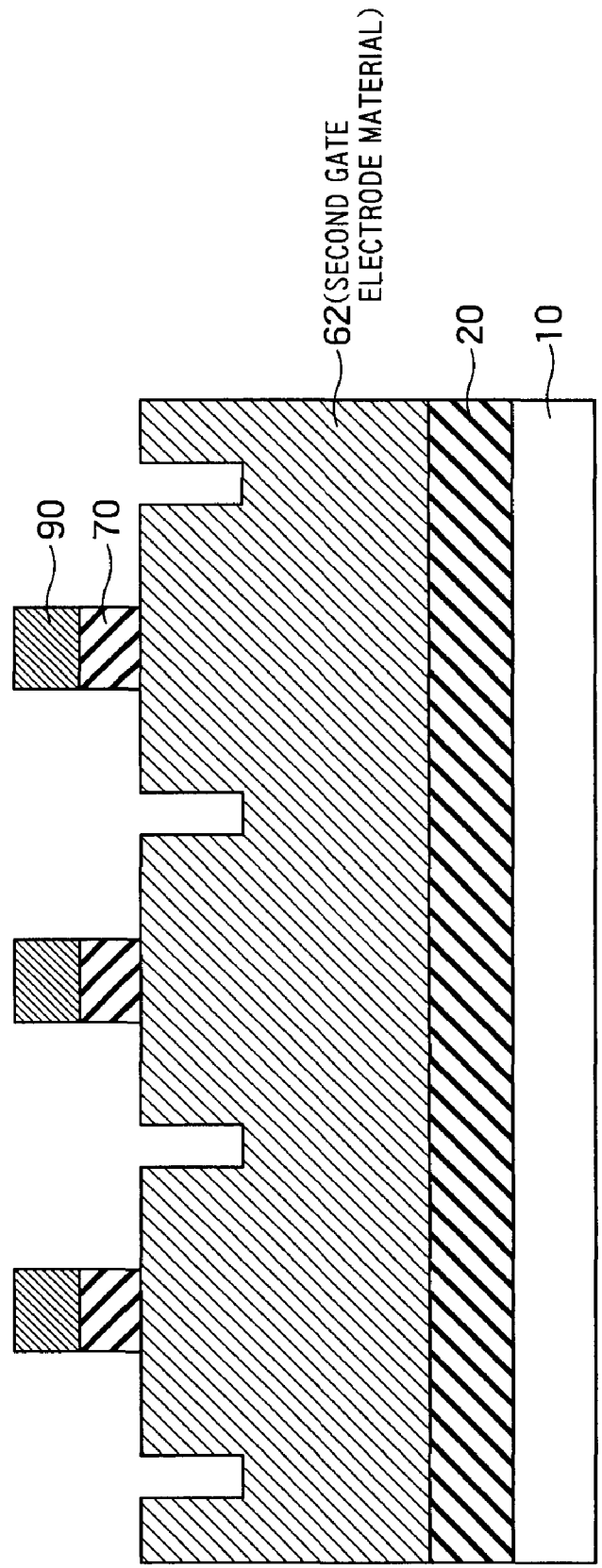
Figure 73:
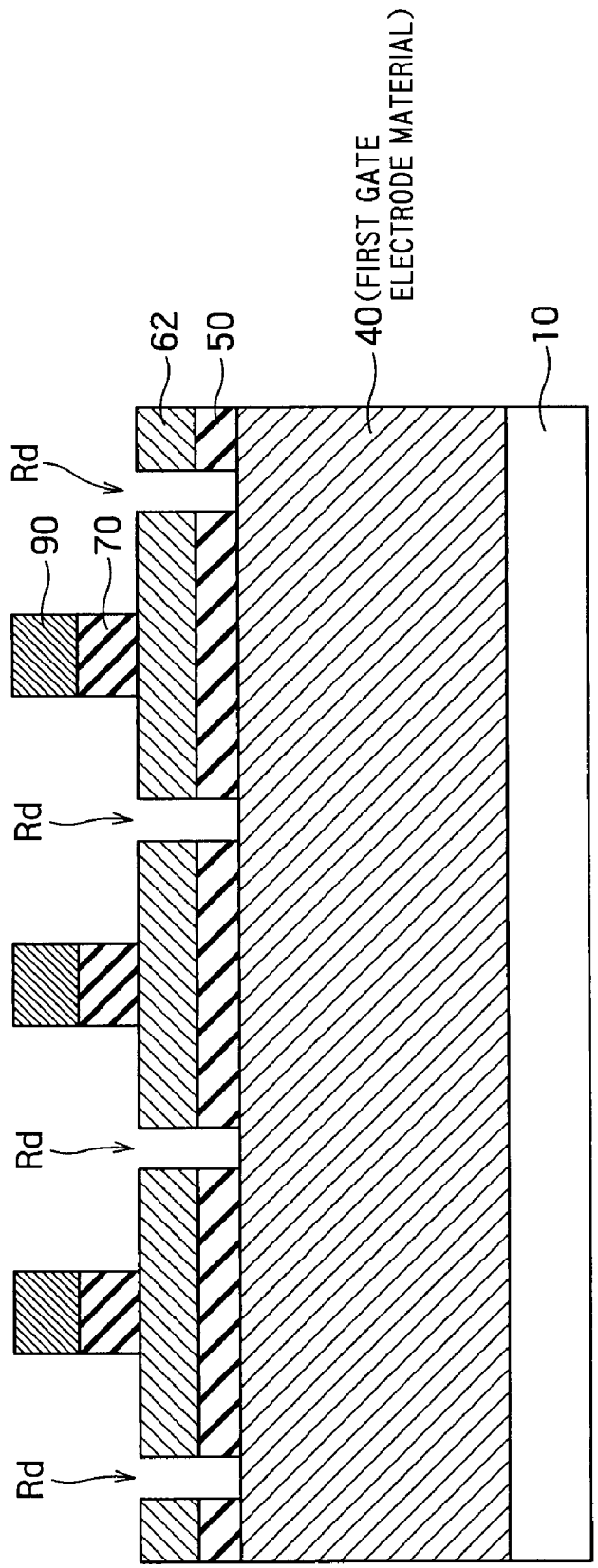

FIGS. 71 to 73 are cross-sectional views subsequent to FIGS. 68 to 70, respectively. As shown in FIG. 71, the SiN caps 70 are etched using the amorphous silicon layer 90 as a mask. At the same time, as shown in FIGS. 71 and 73, the SiN spacers 60 and the STI material 50 in the regions Rd are etched using the SiN spacers 60 as a mask. At this time, the silicon nitride film 92 is removed.

Figure 74:
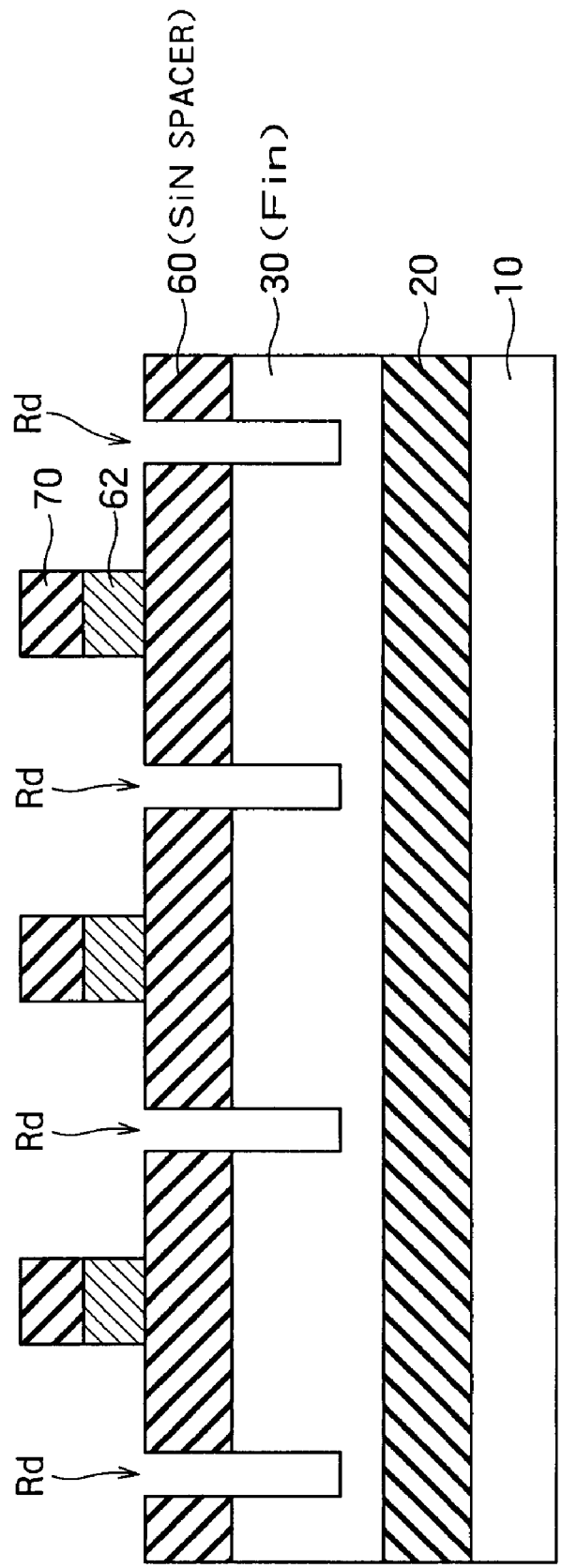
Figure 75:
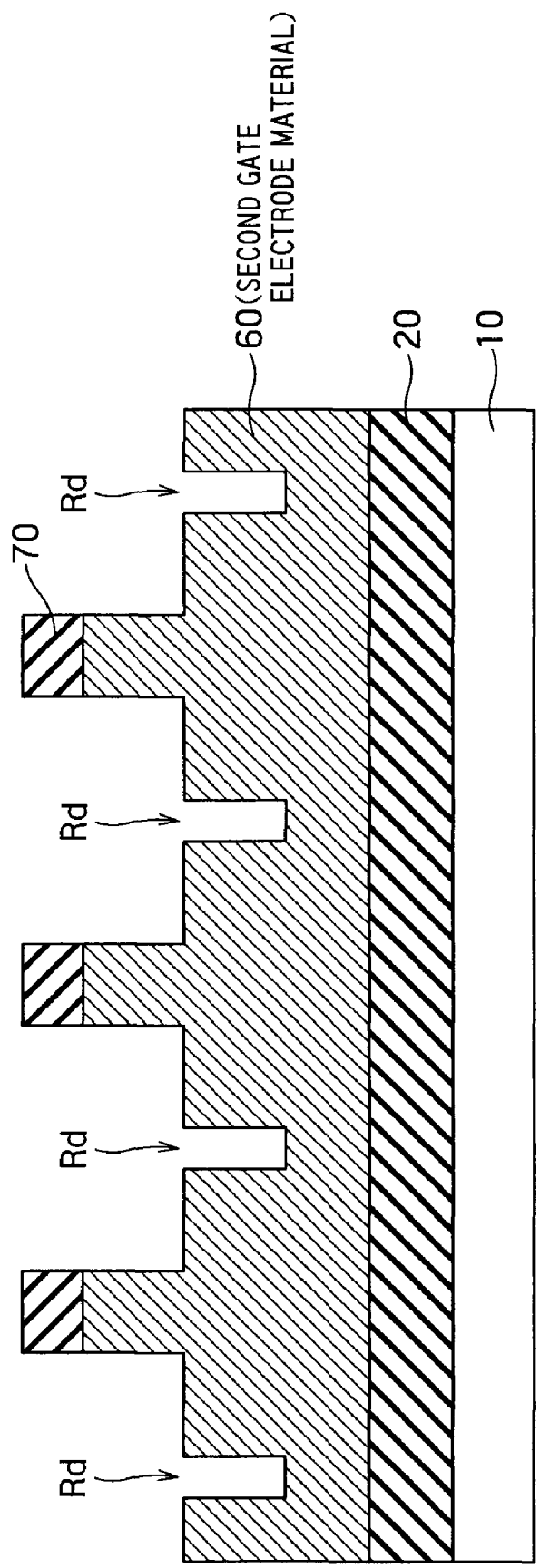
Figure 76:
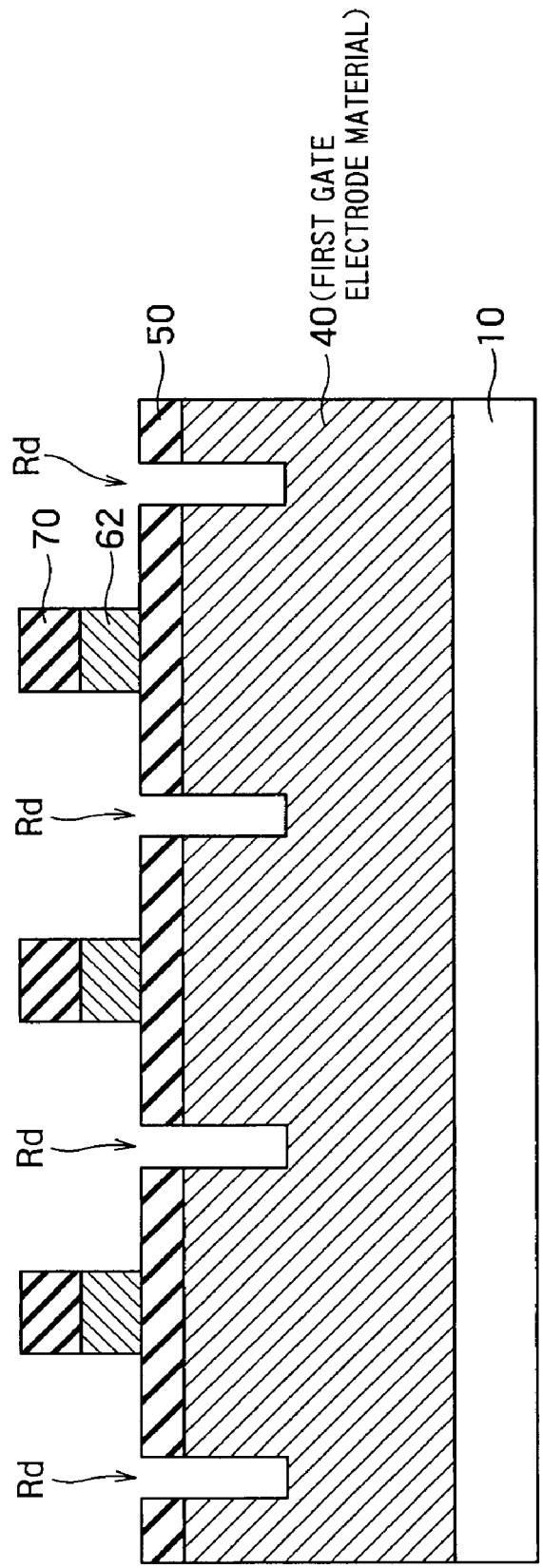

FIGS. 74 to 76 are cross-sectional views subsequent to FIGS. 71 to 73, respectively. As shown in FIG. 74, using the SiN caps 70 as a mask, the second gate electrode material 62 is etched. At the same time, using the SiN spacers 60 as a mask, the Fin semiconductor layers 31 in the regions Rd are etched. Furthermore, as shown in FIG. 76, the first gate electrode material 40 in the regions Rd is etched using the STI material 50 as a mask. At this time, as shown in FIG. 75, the second gate electrode material 62 is etched using the SiN caps 70 as a mask. The amorphous silicon layer 90 is removed at this stage.

Figure 77:
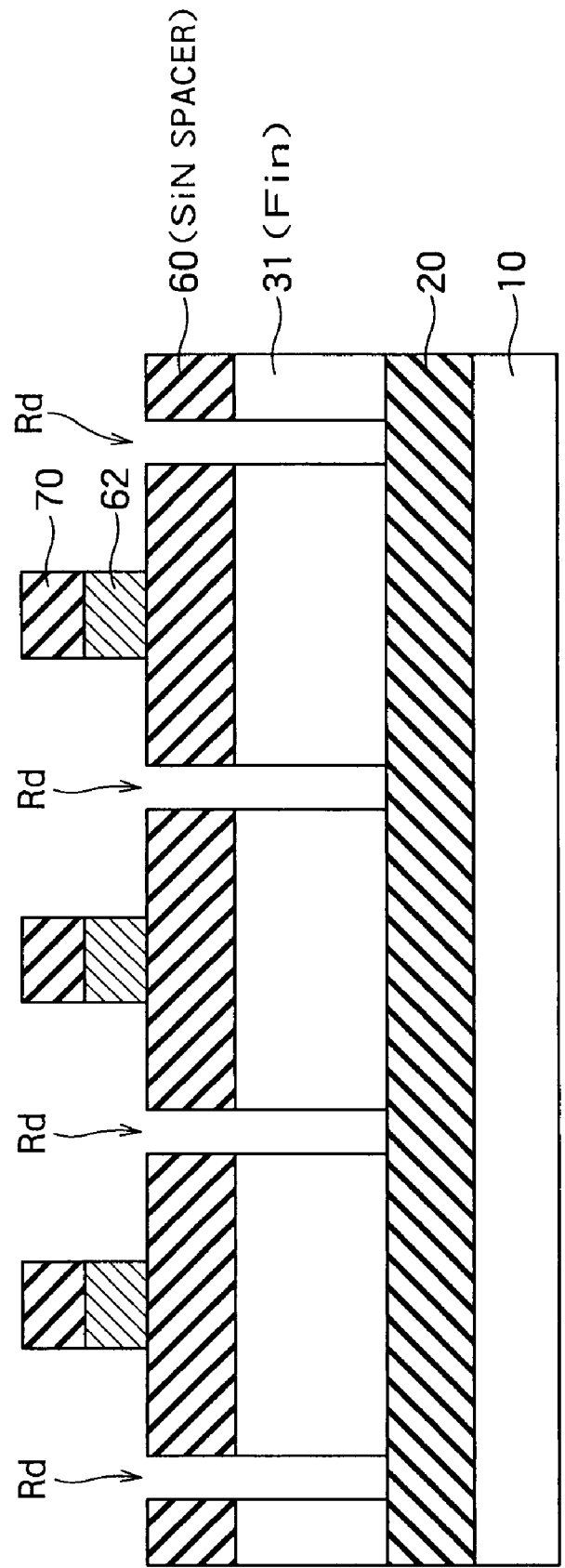
Figure 78:
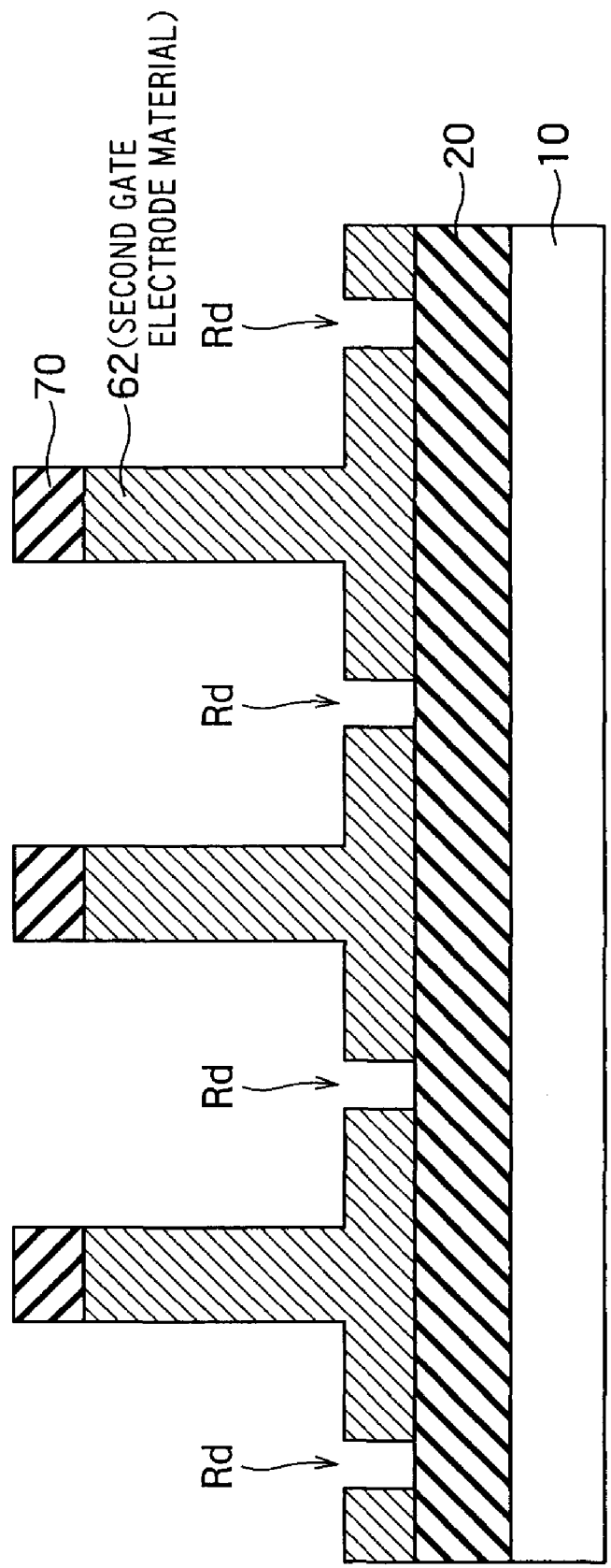
Figure 79:
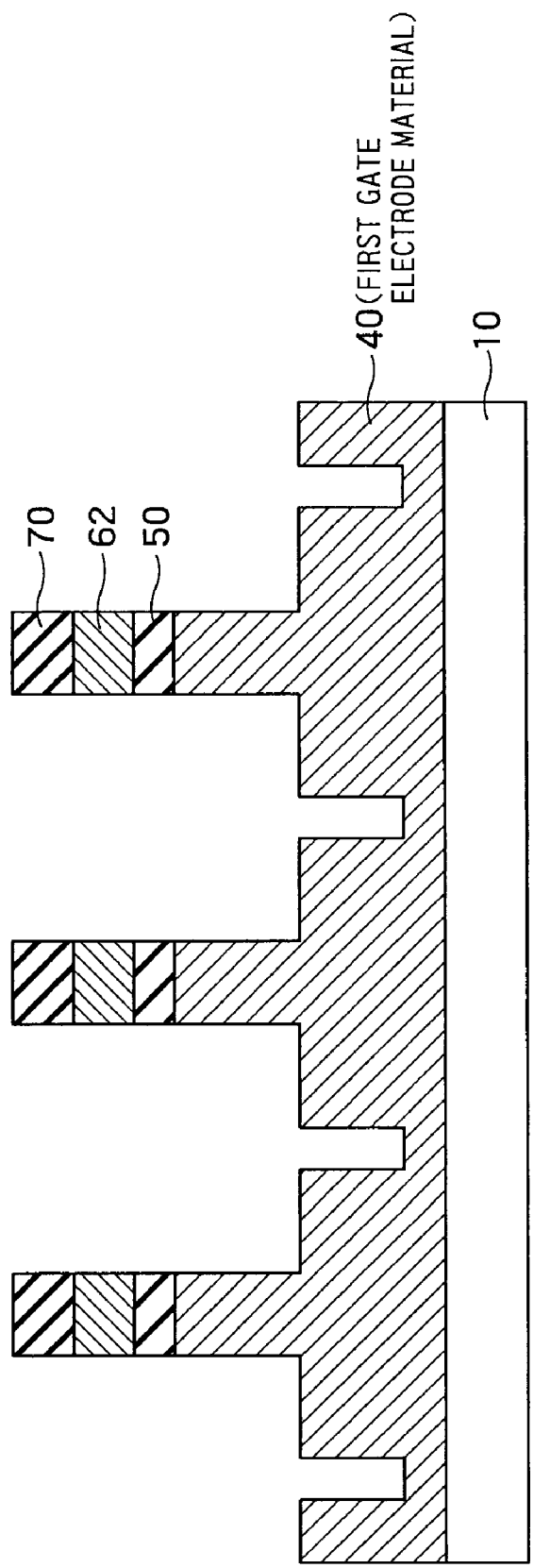

FIGS. 77 to 79 are cross-sectional views subsequent to FIGS. 74 to 76, respectively. As shown in FIG. 79, the STI material 50 is etched using the SiN caps 70 as a mask. At the same time, the Fin semiconductor layers 31 and the second gate electrode material 62 are etched so that the regions Rd penetrate through the Fin semiconductor layers 31 and the second gate electrode material 62 as shown in FIGS. 77 and 78.

The SiN caps 70 and the SiN spacers 60 are removed and the steps shown in FIG. 19 and the following according to the first embodiment are executed, thereby completing the FBC memory device according to the fifth embodiment.

During the oblique ion implantation shown in FIG. 16, the bodies B of the inverse T shape are formed since the first or second gate electrode material 40 or 62 shown in FIG. 78 or 79 is used as a mask. Further, as compared with the first embodiment, a contact hole mask has a pattern of an ellipse having a major diameter in the column direction.

In the fifth embodiment, the spacers SP are formed in a self-aligned fashion based on the pattern of dummy word lines DWLs. Due to this, misalignment is small and there is no fluctuation among the memory cells MCs in lengths Y (Y=1.5F−0.5S) of the source layers S and the drain layers D. This can ensure stable characteristics of the memory cells MCs.

In the preceding embodiments, each body B is made of a p⁻ material. In the case of the FD-FBC, the body B can be made of an intrinsic semiconductor. While each of the memory cells MCs is the nFET, a pFET can be used as the memory cell MC.

Sixth Embodiment

Figure 80:
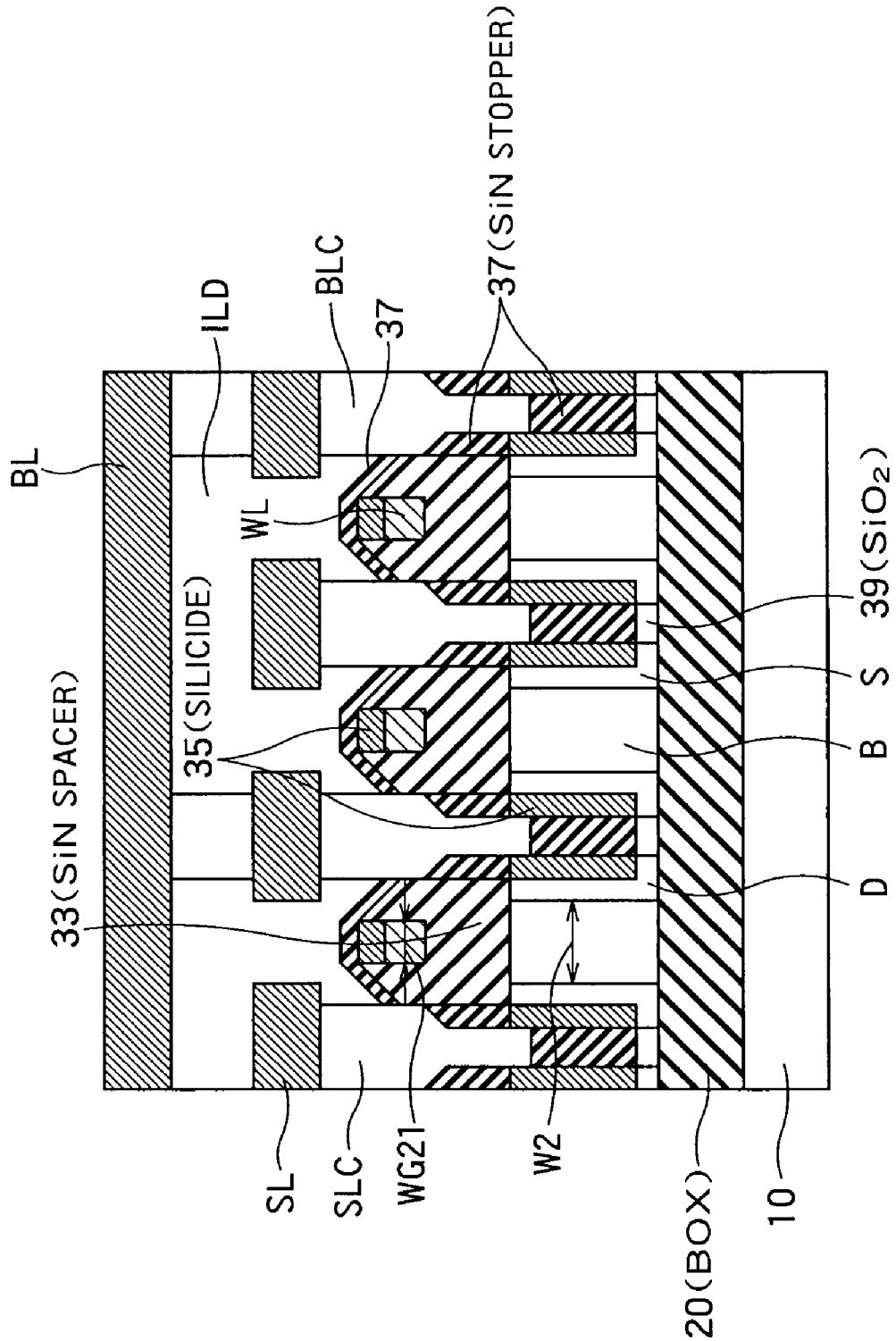
FIGS. 80 to 82 are cross-sectional views of an FBC memory device according to a sixth embodiment of the present invention.
Figure 81:
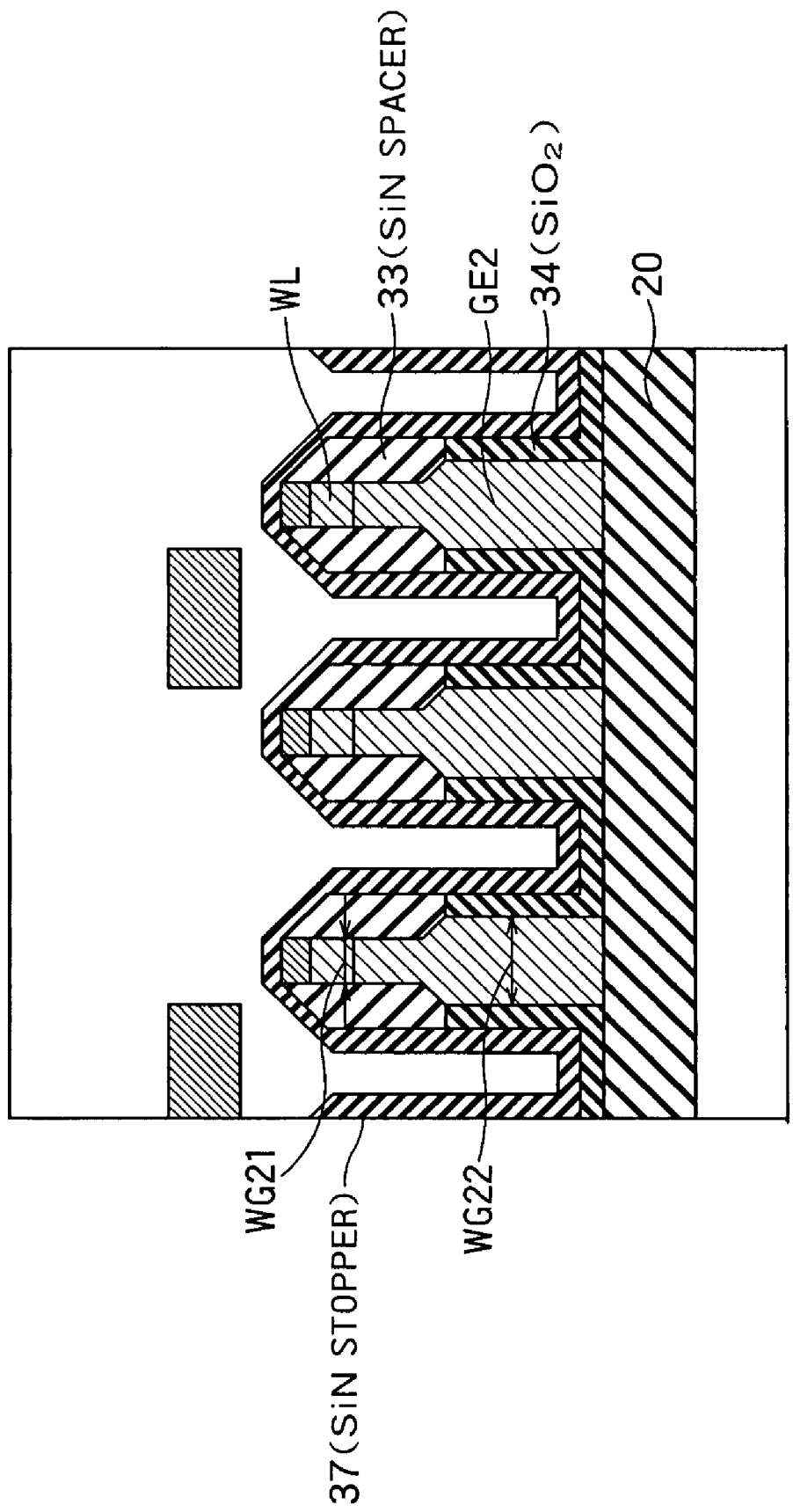
Figure 82:
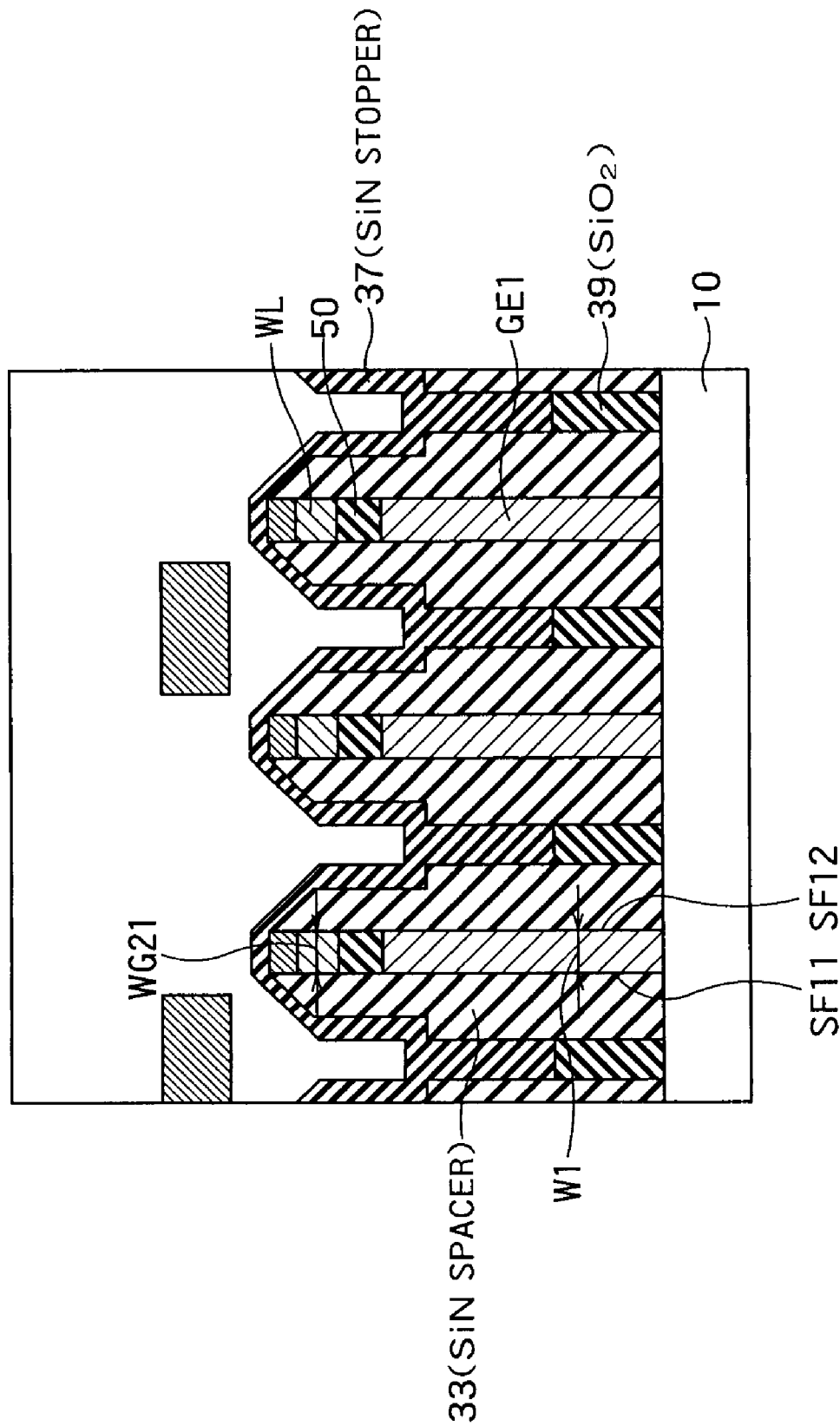

A plan view of an FBC memory device according to a sixth embodiment of the present invention is similar to that shown in FIG. 44. However, the cell size according to the sixth embodiment is smaller than that according to the third embodiment. FIGS. 80 to 82 are cross-sectional views of the FBC memory device according to the sixth embodiment. The sixth embodiment can achieve the same effects of the third embodiment.

FIG. 80 is a cross-sectional view corresponding to FIG. 45. A feature of the sixth embodiment different from those of the third embodiment is that the width WG21 of each word line WL in the column direction is smaller than the width W2 of each body B in the column direction. Accordingly, with a structure according to the sixth embodiment, the cell size can be reduced while securing the distance between each word line WL and each bit line contact BLC and the distance between each word line WL and each source line contact SLC.

FIG. 81 is a cross-sectional view along the second trench T2 corresponding to FIG. 44. In a cross section perpendicular to the row direction, the width of each word line WL is WG21, the width of the top surface of each second gate electrode GE2 is WG21, and the width of the bottom surface of each second gate electrode GE2 is WG22 (>WG21). Each of the second gate electrodes GE2 includes the first part and the second part. The first part is formed below the word lines WLs and has the width WG21. The second part is formed to front on the entire second surface of each body B and has the width WG22. The width WG22 is almost equal to the length W2 of each body B in the column direction.

FIG. 82 is a cross-sectional view corresponding to FIG. 46. In the sixth embodiment, the width WG21 of each word line WL in the column direction is equal to the width W1 of the first gate electrode GE1 in the column direction. The width W1 is smaller than the width W2 of each body B in the column direction. Therefore, as described in the third embodiment, the GIDL is less during the data holding operation.

A method of manufacturing the FBC memory device according to the sixth embodiment will be described. First, through similar steps to those according to the second embodiment, the structure shown in FIG. 30 is obtained. Next, the second gate electrode material 62, the SiN cap 70, a silicon oxide film (SiO2) layer 86, and the amorphous silicon layer 90 are sequentially deposited on the structure.

Figure 83:
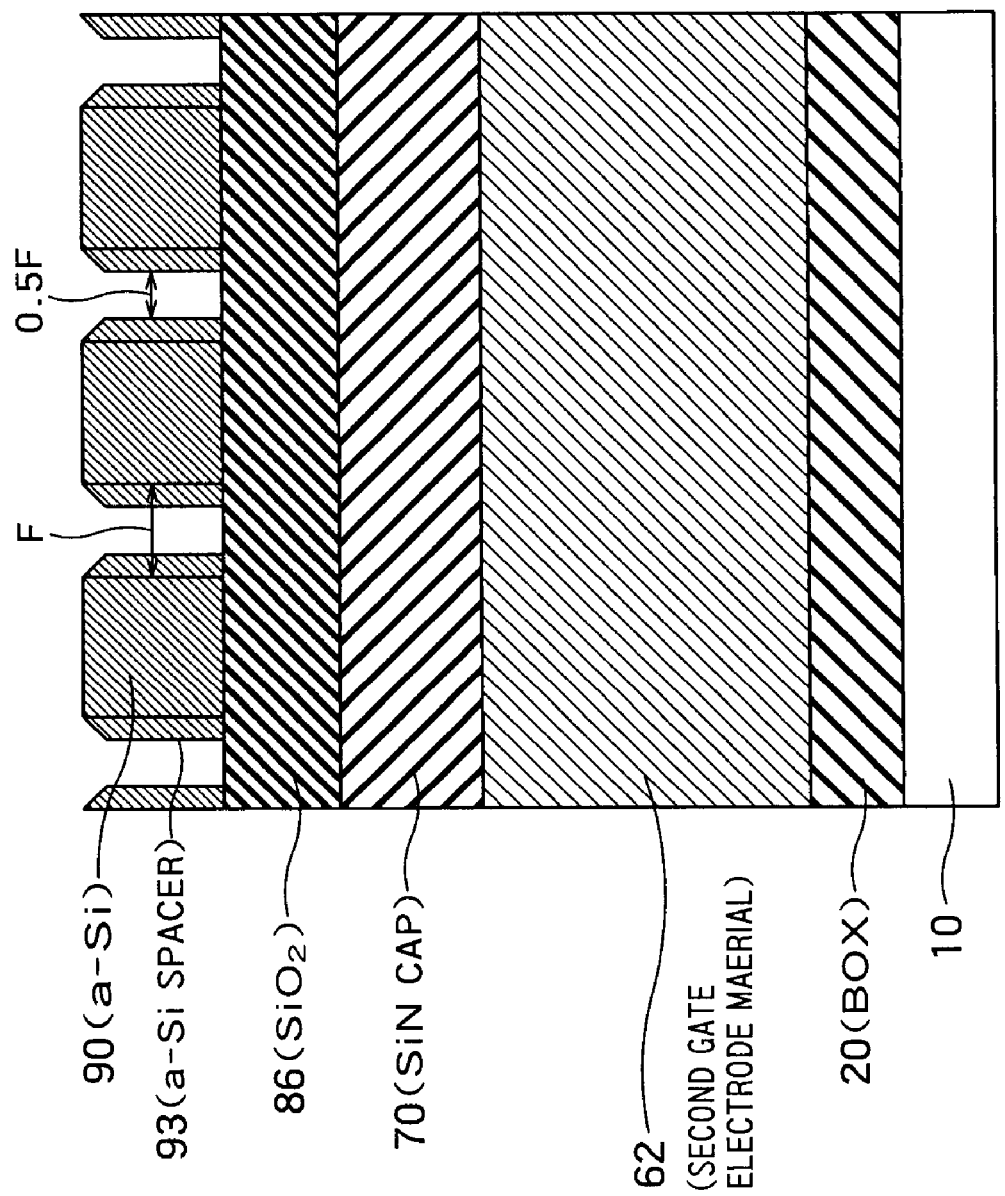
FIGS. 83 to 96 show a method of manufacturing the FBC memory device according to the sixth embodiment.
Figure 84:
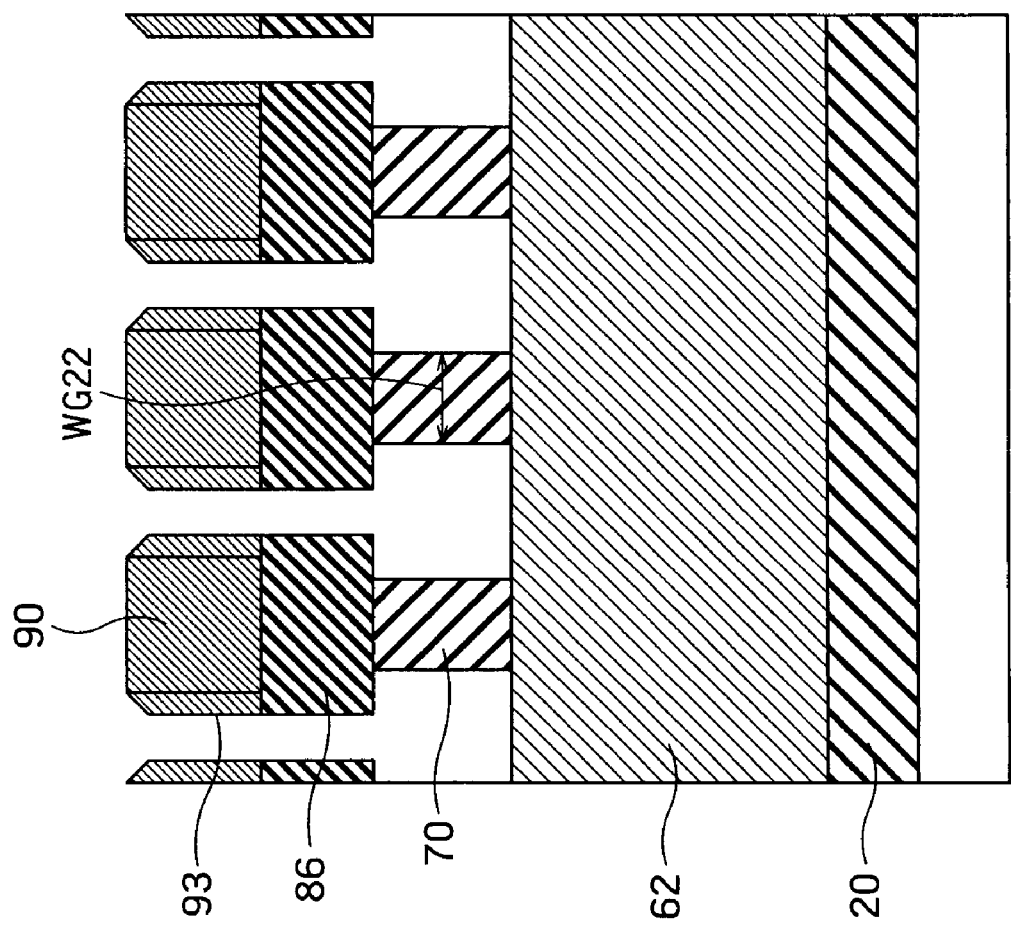

FIGS. 83 and 84 correspond to the cross-sectional views along the second trench T2. As shown in FIG. 83, the amorphous silicon layer 90 is formed. At this time, a space of a width F is formed along each of regions for forming the bit line contacts BLCs and the source line contacts SLCs. An amorphous silicon spacer 93 is formed on each sidewall of the amorphous silicon layer 90. As a result, spaces each having a width 0.5F are formed.

As shown in FIG. 84, using the amorphous silicon layer 90 and the amorphous silicon spacers 93 as a mask, the silicon oxide film layer 86 and the SiN cap 70 are anisotropically etched. By etching the SiN cap 70 using a hot phosphoric acid solution, SiN caps 70 each having the width WG22 are formed. The width W22 corresponds to the width of the lower portion of each body B and that of the lower portion (second part) of each second gate electrode GE2 in the column direction.

Figure 85:
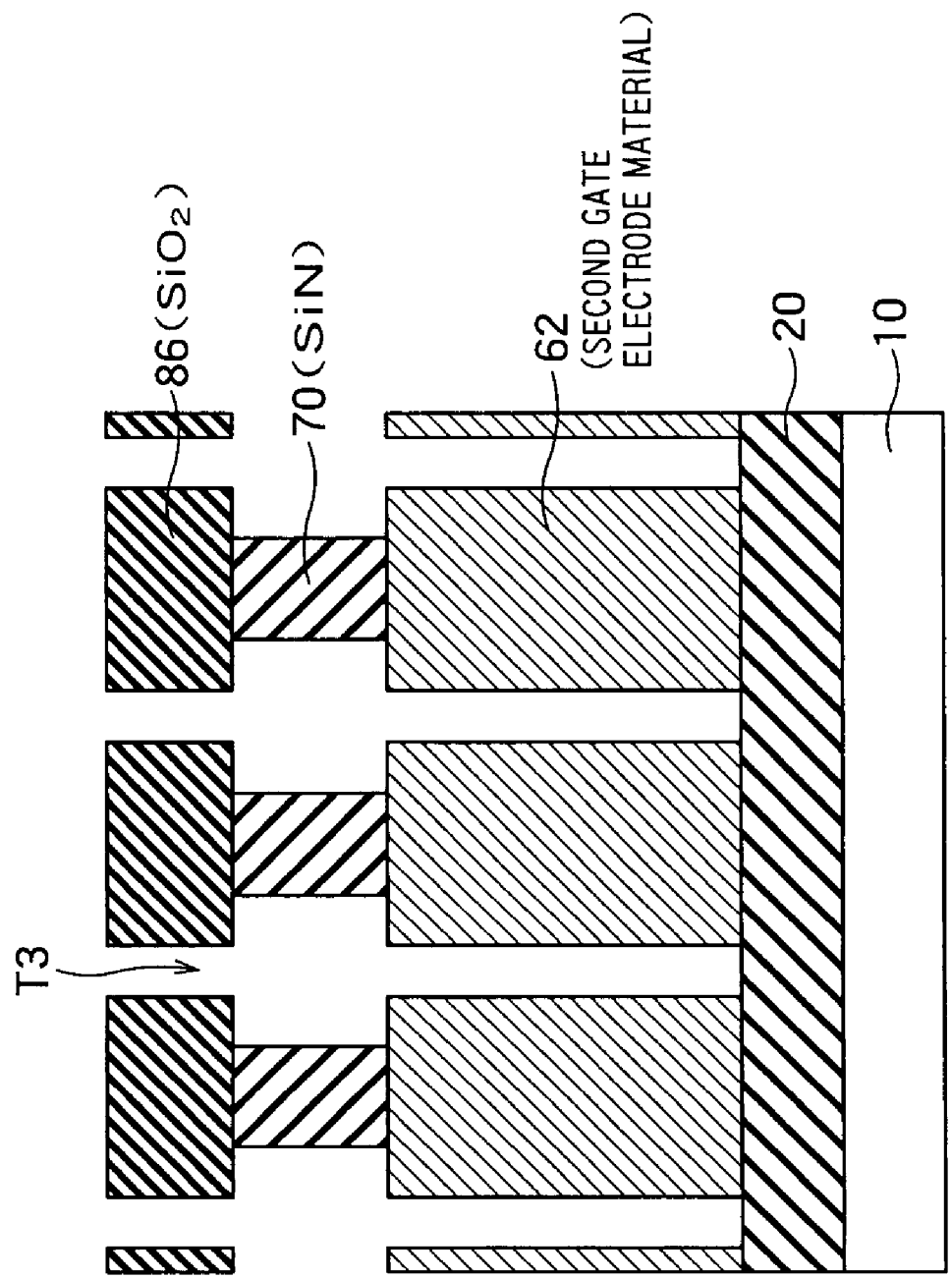
Figure 86:
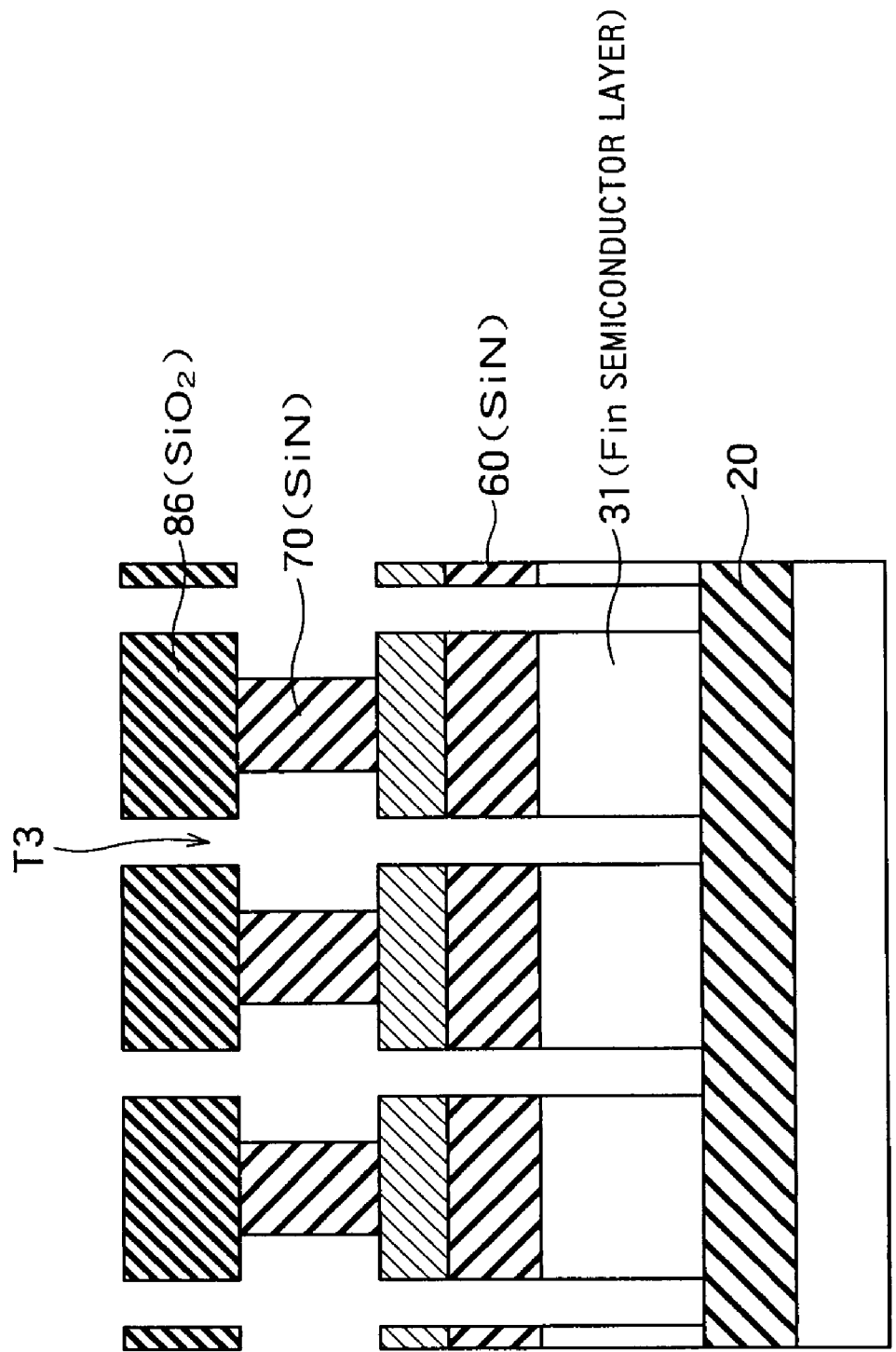
Figure 87:
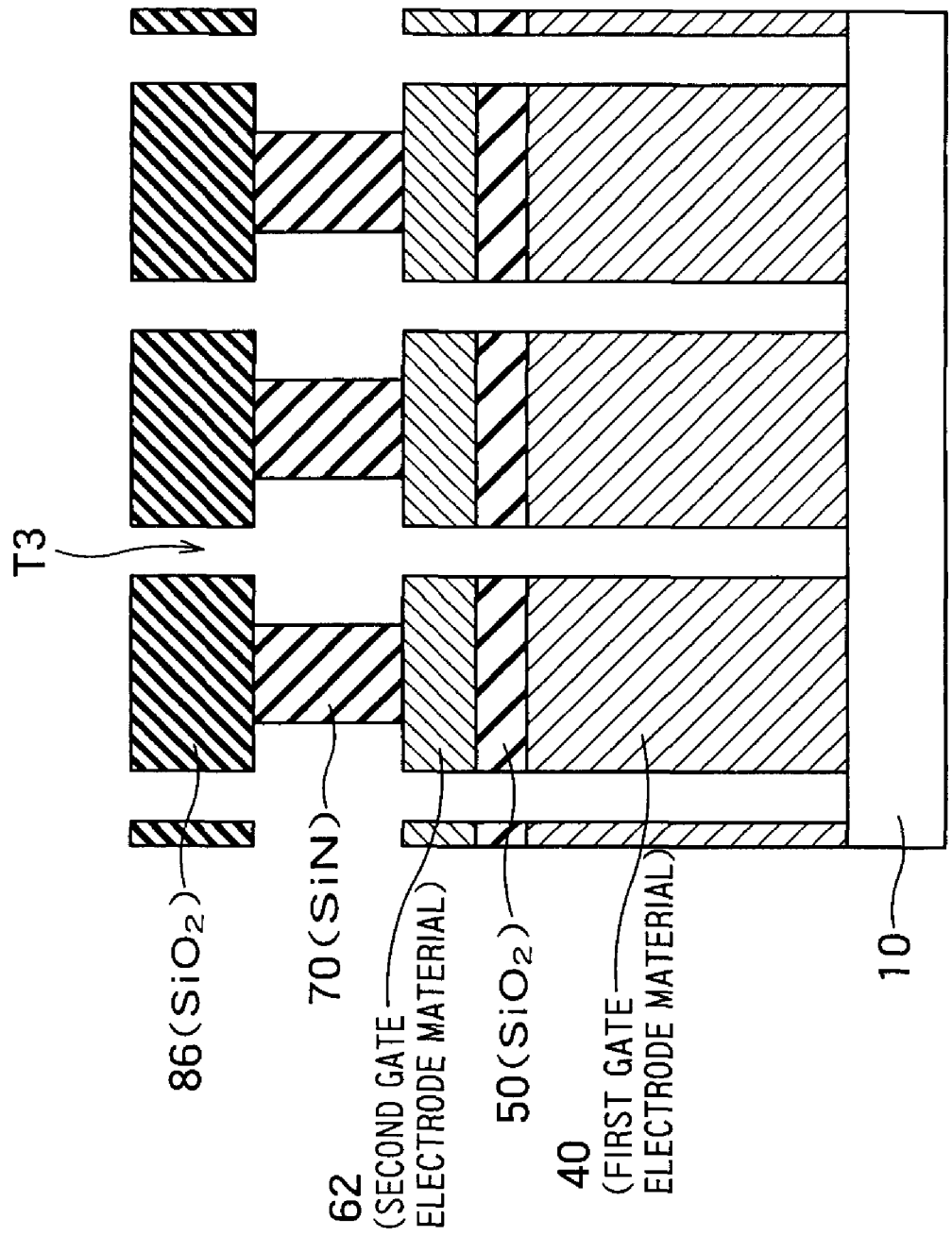

FIGS. 85 to 87 show cross sections at the same step. FIG. 85 is a cross-sectional view along the second trench T2 and subsequent to FIG. 84. FIG. 86 is a cross-sectional view along one Fin semiconductor layer 31. FIG. 87 is a cross-sectional view along the first trench T1. As shown in FIGS. 85 to 87, the first gate electrodes GE1, the second gate electrodes GE2, and the Fin semiconductor layers 31 are etched using the silicon oxide film layer 86 as a mask, thereby separating the memory cells MCs adjacent in the column direction by trenches T3, respectively.

Figure 88:
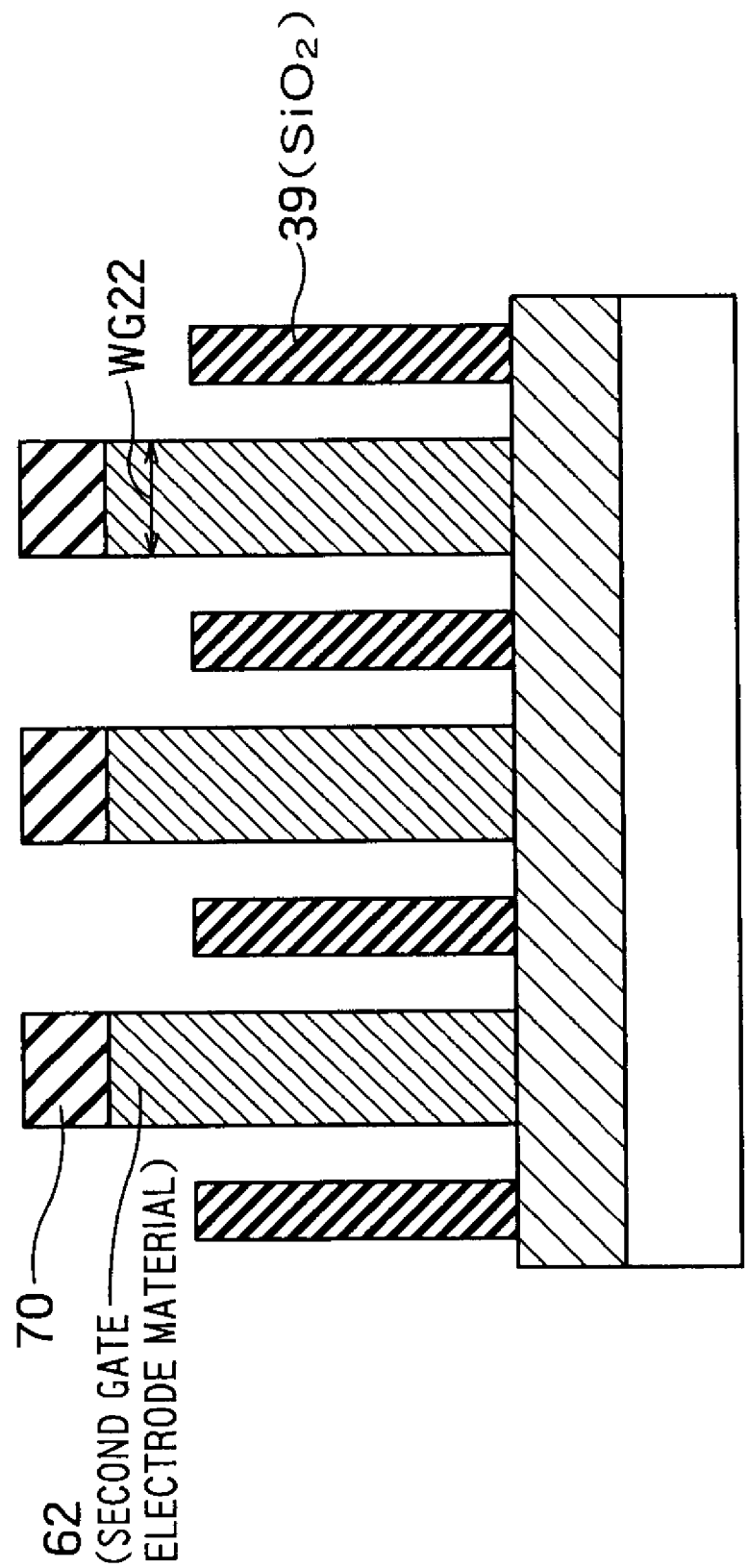
Figure 89:
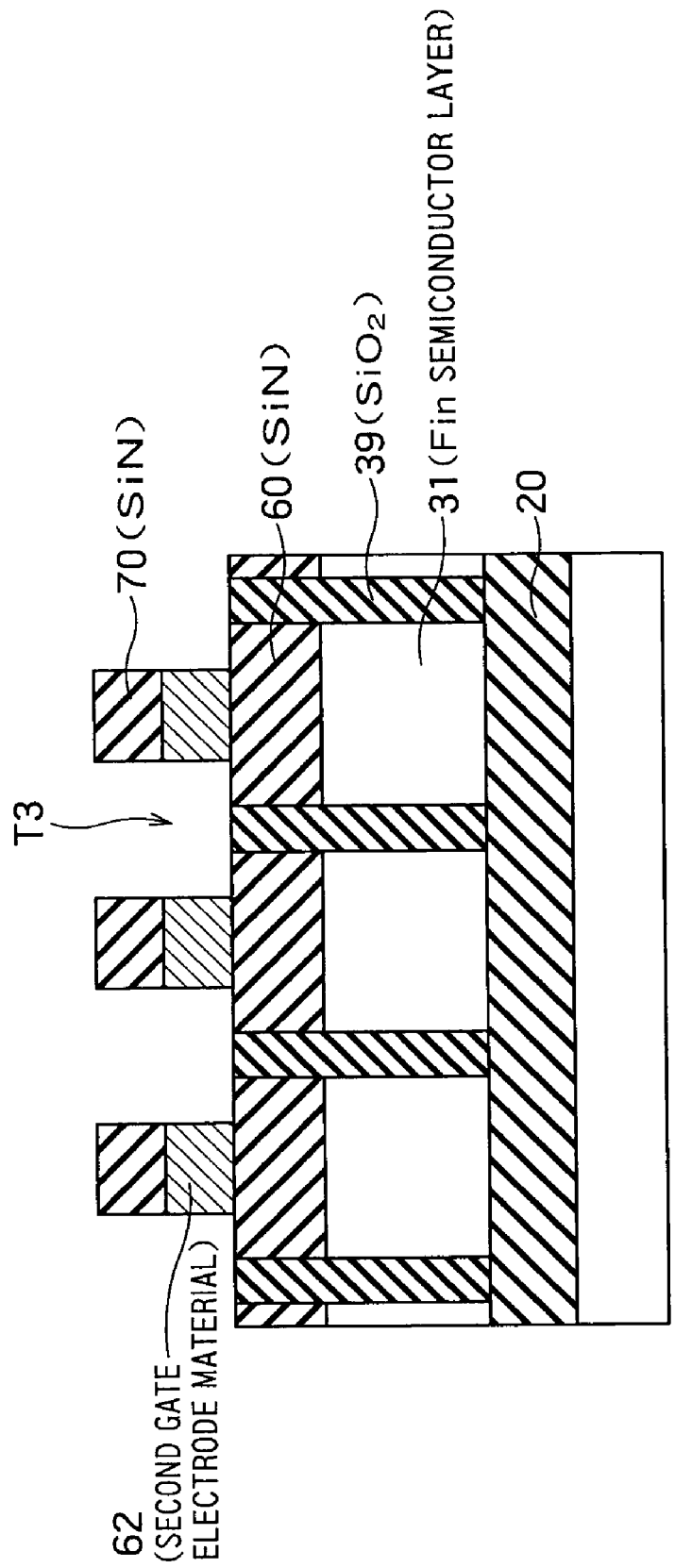
Figure 90:
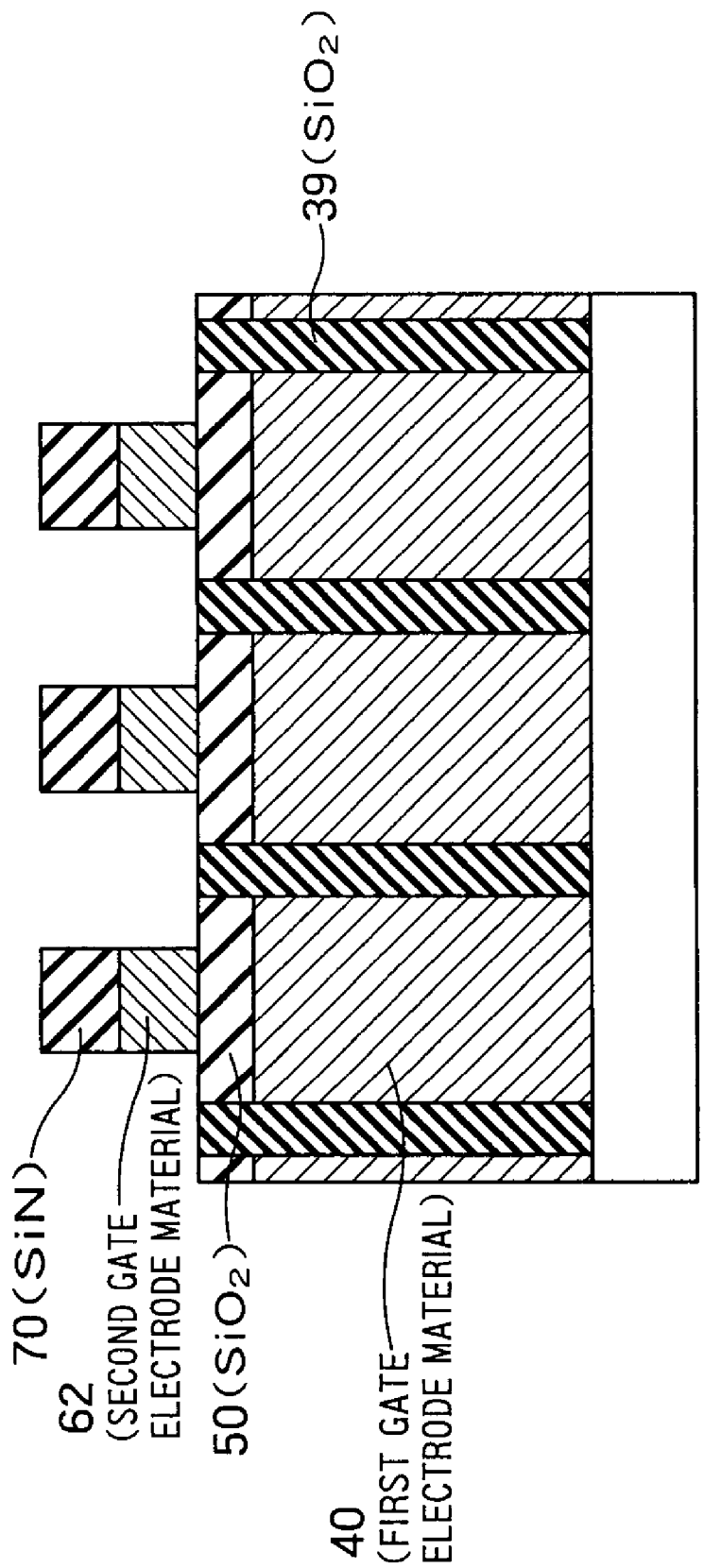

FIGS. 88 to 90 are cross-sectional views subsequent to FIGS. 85 to 87, respectively. As shown in FIG. 89, an oxide film 39 is filled up in the trenches T3. At this time, a top surface of the oxide film 39 is set to be almost equal to that of each SiN spacer 60. Using the SiN caps 70 as a mask, the second gate electrode material 62 is anisotropically etched. As a result, the second gate electrodes GE2 each at the width WG22 are formed.

Similarly to the second embodiment, N-impurity ions are implanted from the oblique direction or plasma doping is performed. As a result, an extension layer is formed in each of the source and drain regions in each of the Fin semiconductor layers 31. At this stage, similarly to the second embodiment, the first side surface SF1 of each Fin semiconductor layer 31 is covered with the first gate electrode material 40 (see FIG. 30).

Figure 91:
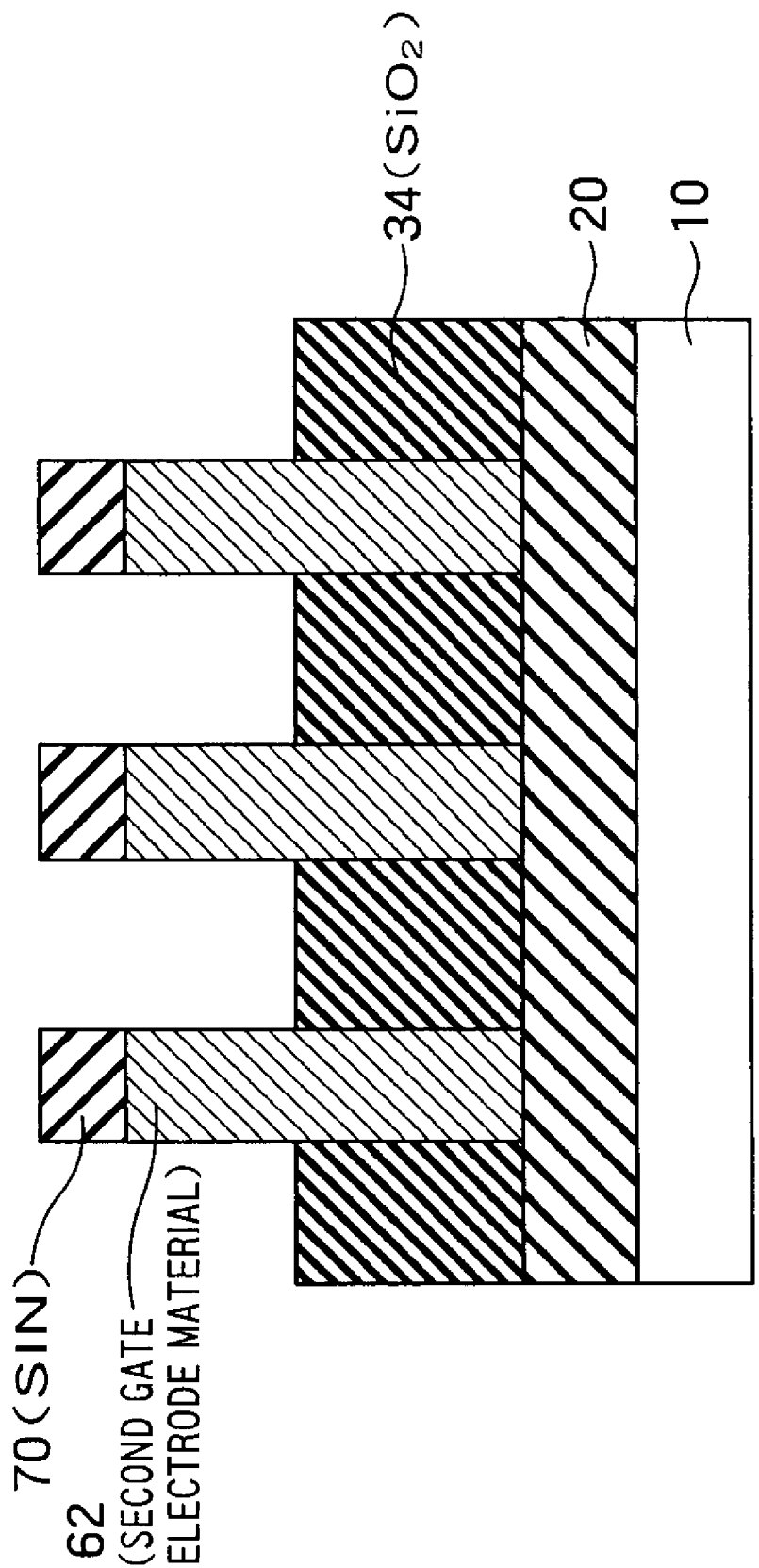
Figure 92:
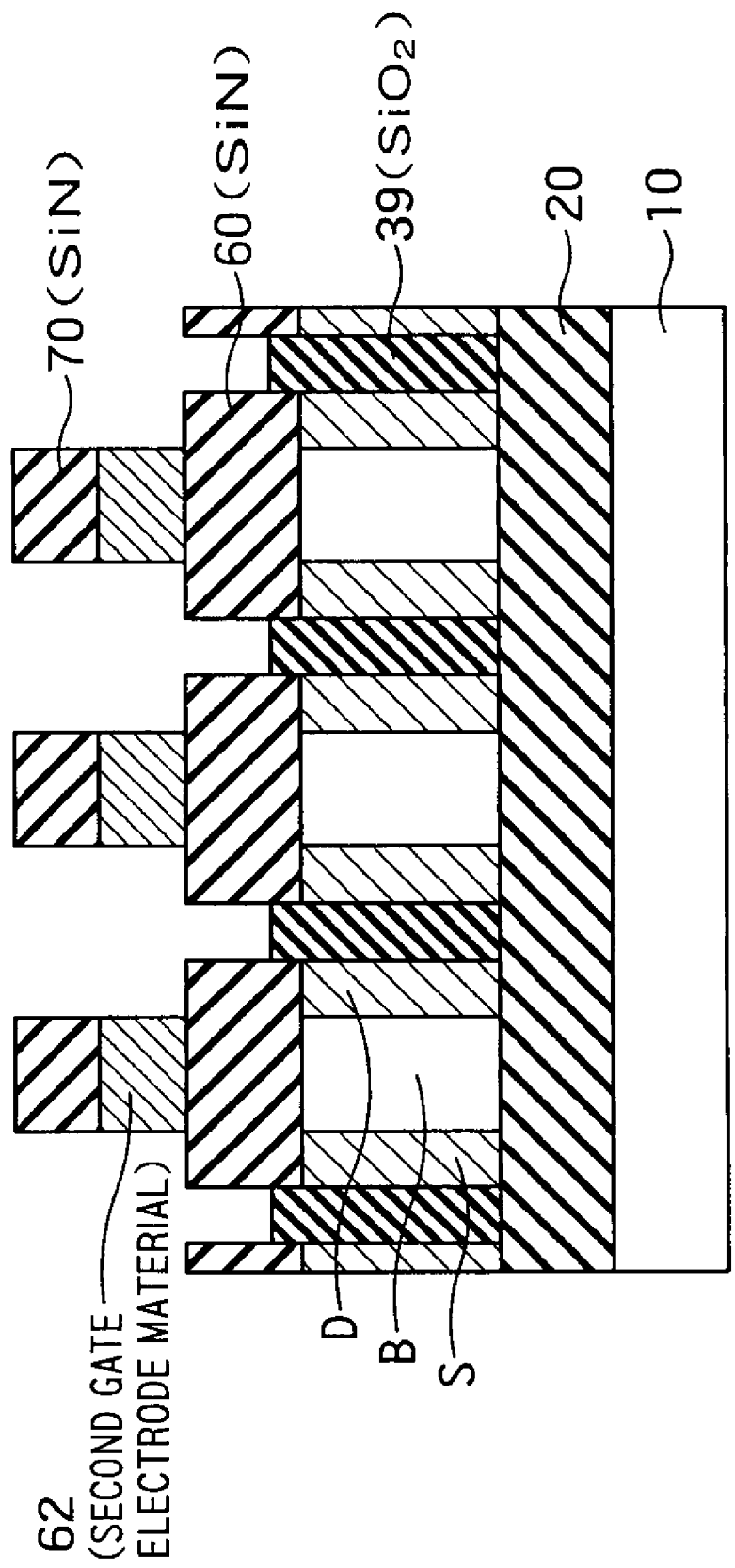
Figure 93:
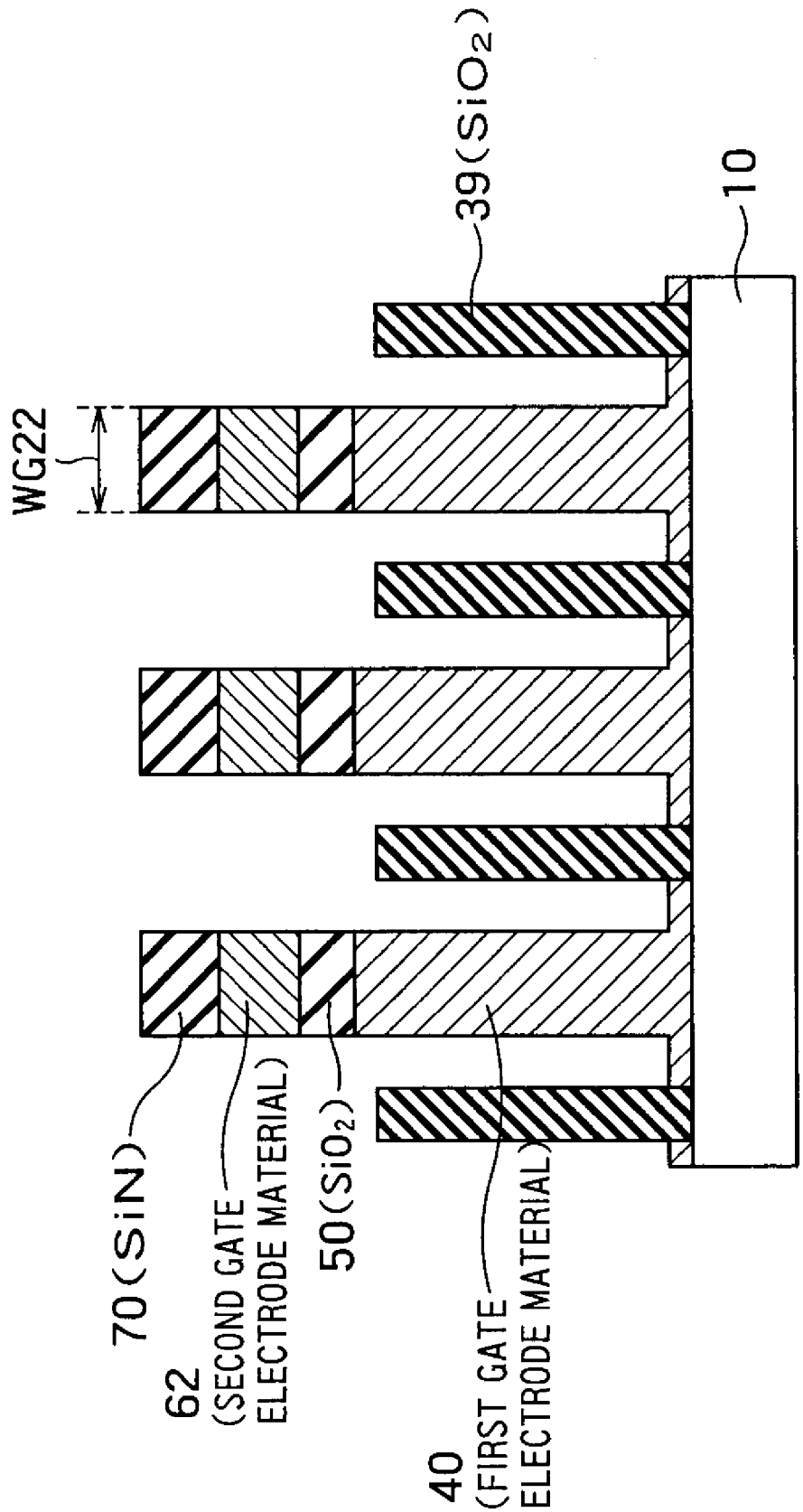

FIGS. 91 to 93 are cross-sectional views subsequent to FIGS. 88 to 90, respectively. As shown in FIG. 91, an oxide film 34 is filled up in the second trenches T2. At this time, the oxide film 34 is formed to cover up the part (second part) of each second gate electrode GE2 fronting on each body B. Using the SiN caps 70 as a mask, an oxide film 34 and the first gate electrode material 40 are anisotropically etched.

Figure 94:
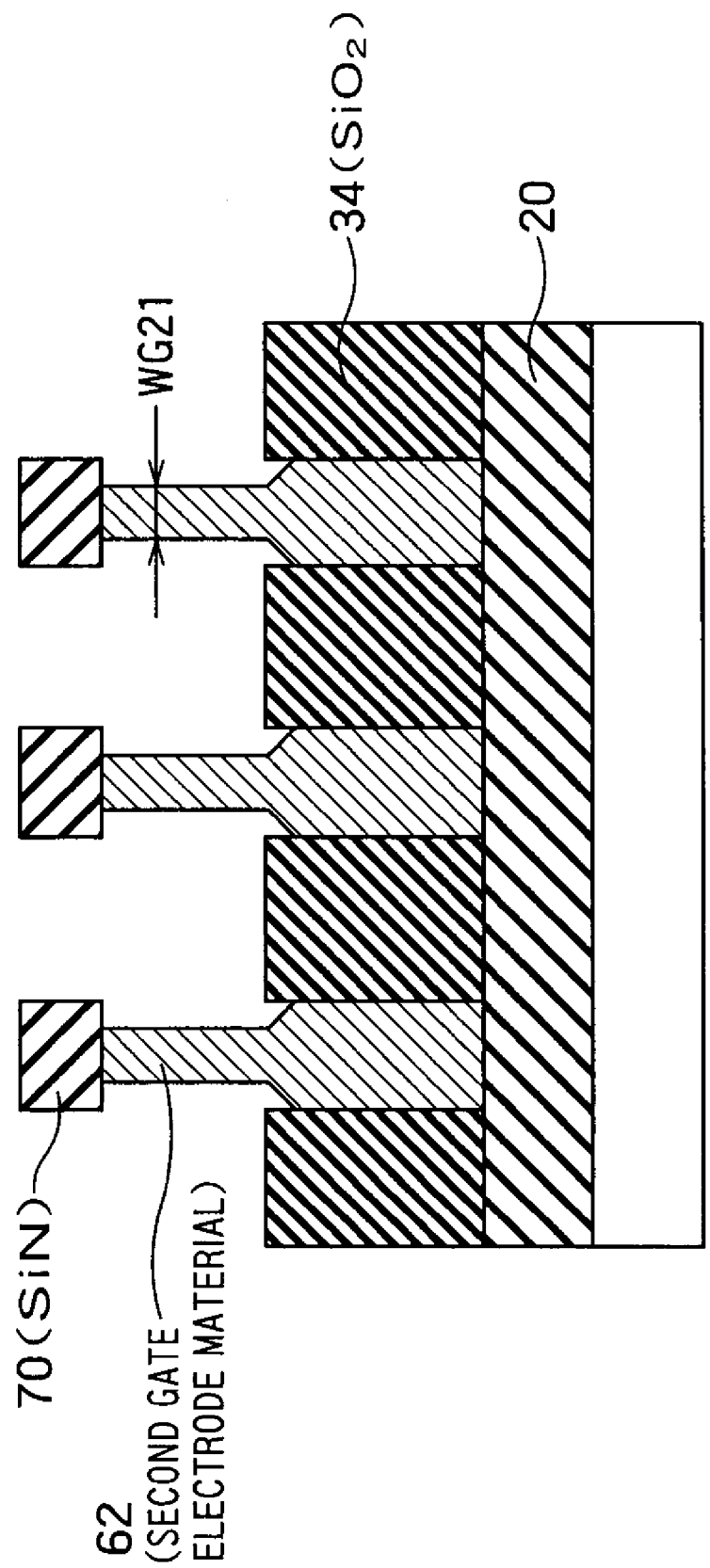
Figure 95:
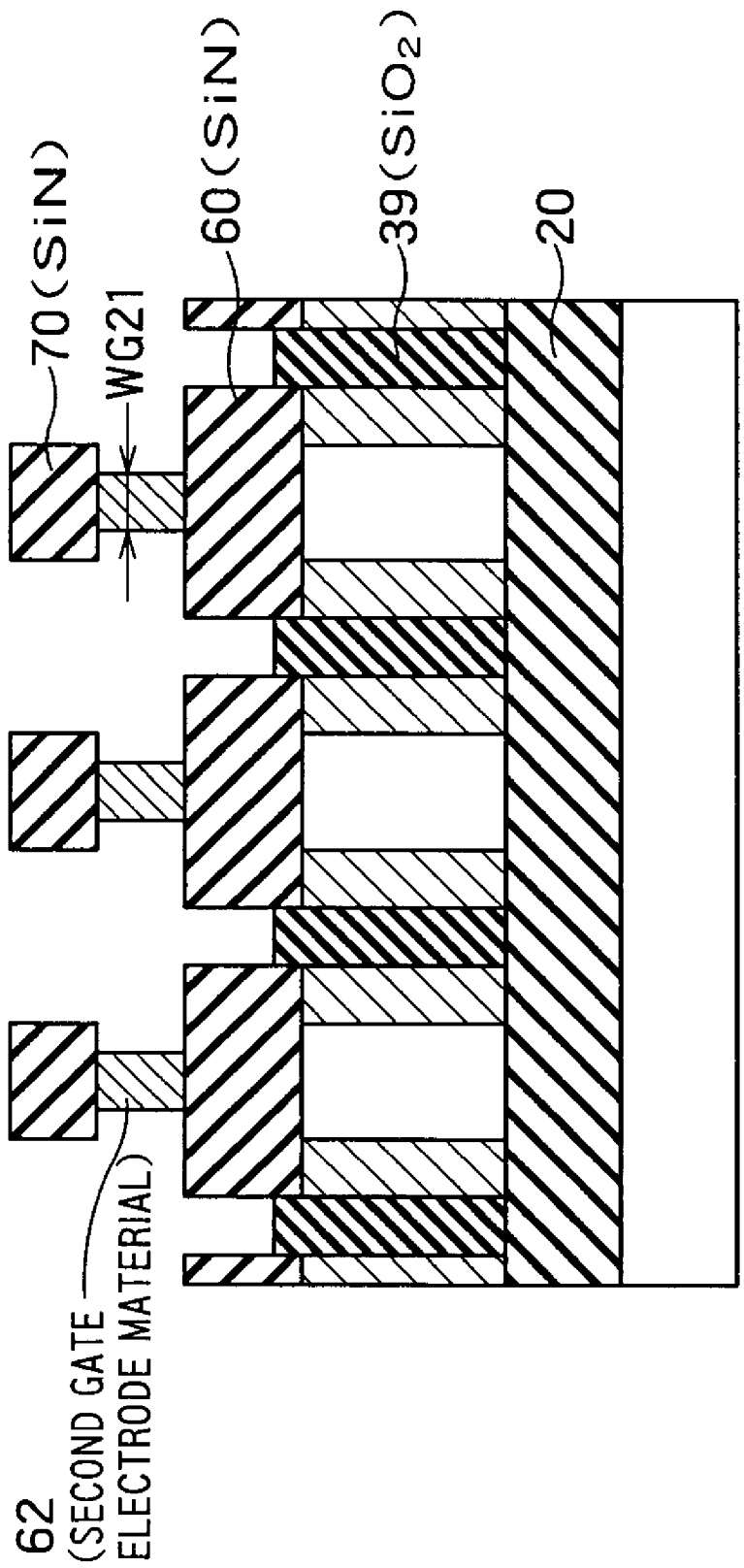
Figure 96:
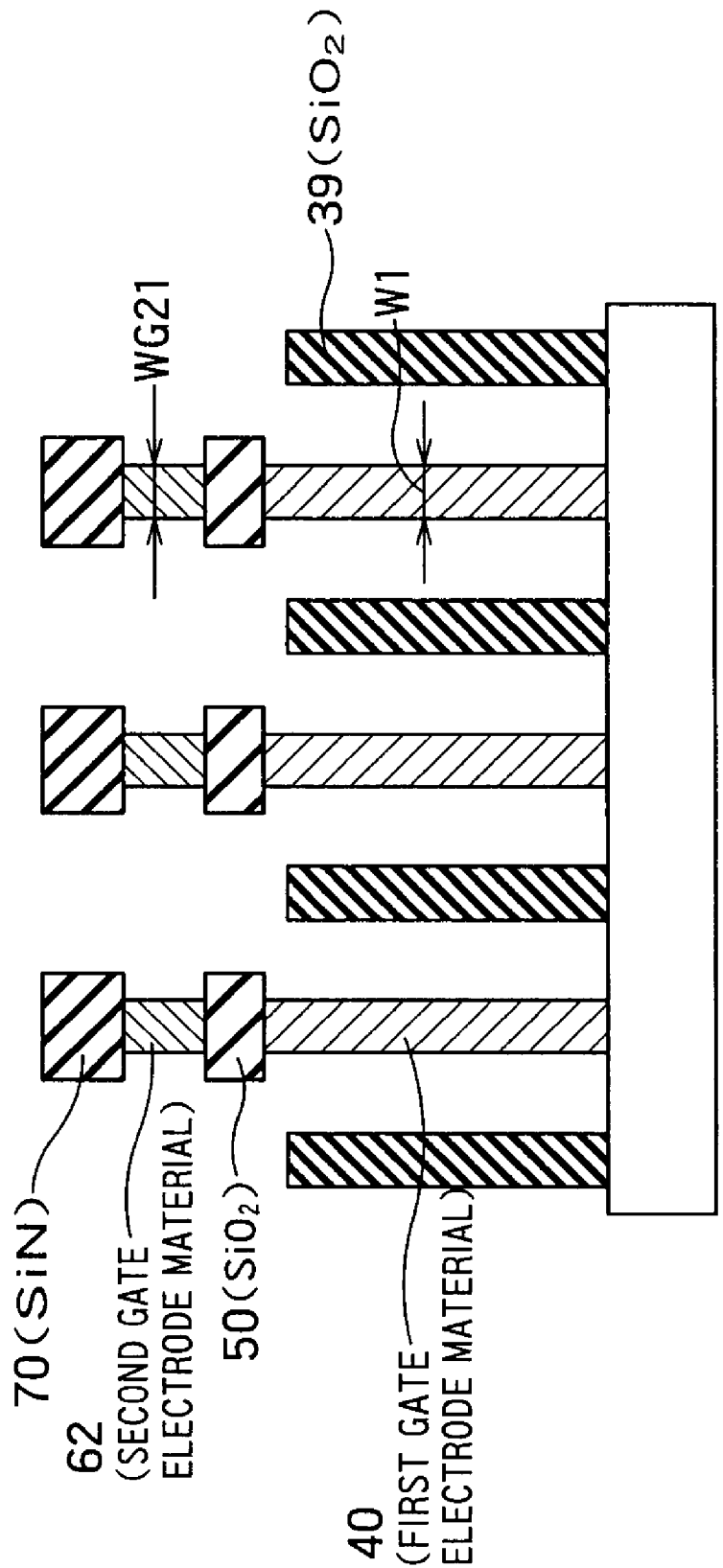

FIGS. 94 to 96 are cross-sectional views subsequent to FIGS. 91 to 93, respectively. As shown in FIG. 96, the first electrode material 40 is isotropically etched, thereby setting the width of each first electrode GE1 to WG21. At the same time, as shown in FIGS. 94 to 96, the second gate electrode material 62 is isotropically etched, thereby setting each of the width of the upper portion (first part) of each second electrode GE2 and that of each word line WL to WG21. At this time, the width of the lower portion (second part) of the second gate electrode GE2 remains WG22.

The SiN caps 70 and the SiN spacers 60 are removed and the steps shown FIG. 19 and the following according to the first embodiment are executed, thereby completing the FBC memory device according to the sixth embodiment.

Seventh Embodiment

A plan view of an FBC memory device according to a seventh embodiment of the present invention is similar to those shown in FIG. 60 to 62. FIGS. 97 to 100 are cross-sectional views of the FBC memory device according to the seventh embodiment. A cross-sectional view along the first trench T1 is similar to FIG. 82. A cost of fabricating the seventh embodiment is reduced, since it can be fabricated starting with a bulk wafer. Similarly to the fourth embodiment, the second gate electrode GE2 of the seventh embodiment has an inverse T-shape, and a first gate electrode GE1 dose not face a source layer S and a drain layer D. As a result, the FBC memory device according to the seventh embodiment can achieve the same effects of the fourth embodiment.

Figure 97:
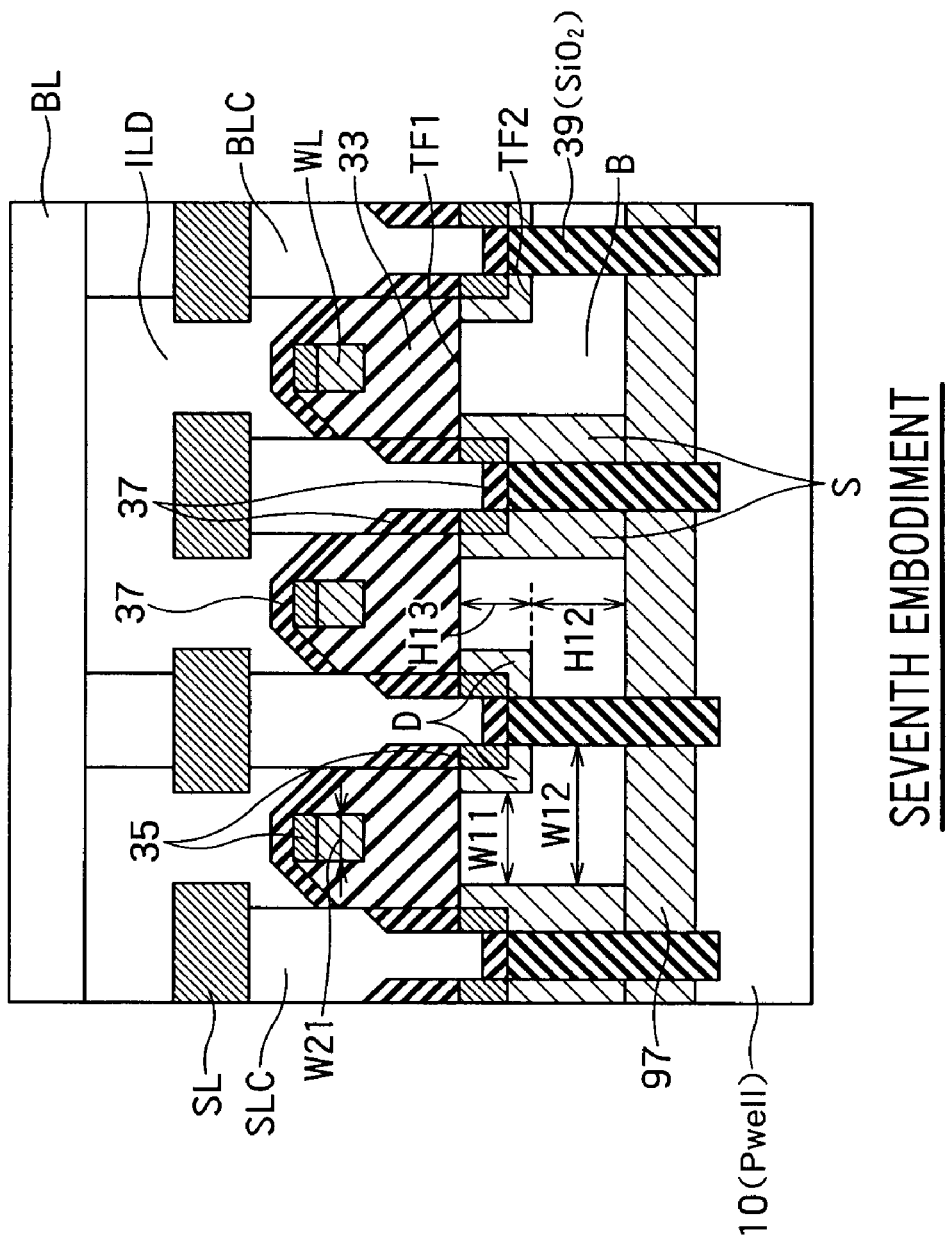
FIGS. 97 to 100 are cross-sectional views of an FBC memory device according to a seventh embodiment of the present invention.

FIG. 97 is a cross-sectional view corresponding to FIG. 52. Similarly to the sixth embodiment, the width WG21 of each word line WL in the column direction is smaller than the width W11, W12 of upper and lower portions of the body B in the column direction. Accordingly, the cell size can be reduced while keeping the distance W11 between the source layer S and the drain layer D, or the channel length. Differently from the preceding embodiments, instead of a buried oxide 20, an N-type diffusion layer 97 is formed under a body B of a memory cell. The body B of each memory cell is isolated from bodies of neighboring memory cells by the N-type diffusion layer 97 and insulating films 39.

Figure 98:
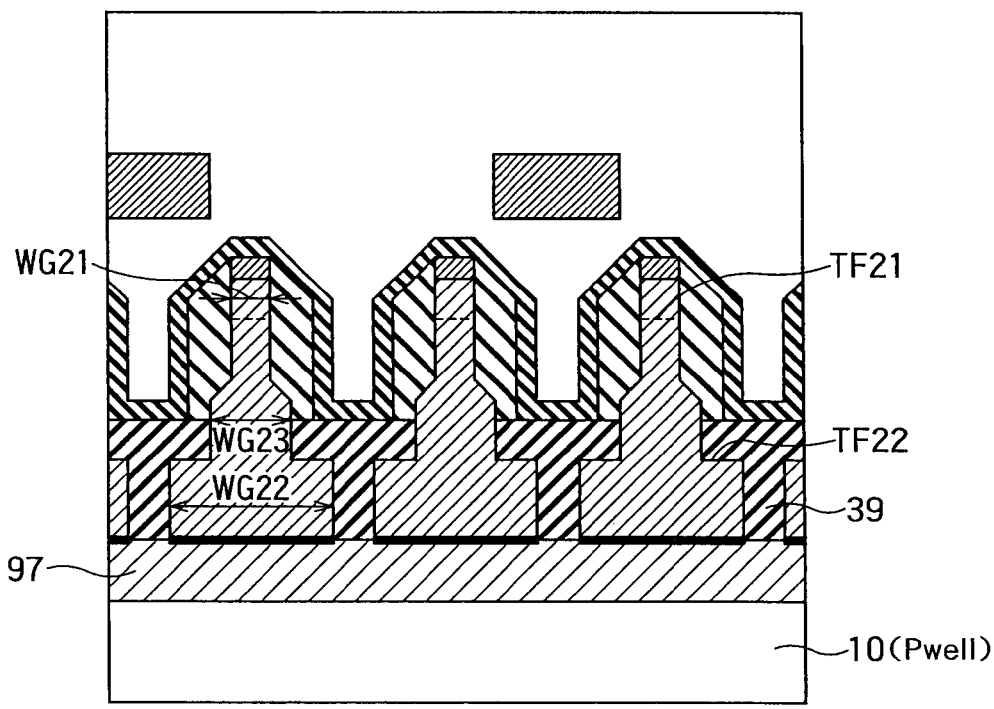

The N-type diffusion layer 97 is connected to a source layer S of a memory cell, and a source voltage (for example, 0V) is applied to the diffusion layer 97 through a source line contact SLC and the source layer S. Under the diffusion layer 97, P-well is formed, and a negative voltage (for example, −2V) is applied to the P-well. Similarly to the preceding embodiments, the memory cell of the present embodiment is an FD-FBC. Since channel currents flow vertically as well as laterally between the N-type diffusion layer 97 and the drain layer D, larger signal difference is obtained compared with the structure of the fifth embodiment, FIG. 98 is a cross-sectional view corresponding to FIG. 53. As shown in FIG. 98, in a cross section perpendicular to the row direction, a width of a top surface of each second gate electrode GE2 is WG21 and a width of a bottom surface thereof is WG22 (>WG21). Each of the second gate electrodes GE2 includes a first part and a second part. The first part of the second electrode GE2 extends downward from the word lines WLs and has a top surface TF21. The second part of the second electrode GE2 has a top surface TF22 lower than the top surface TF21 of the first part. The top surface TF22 is located between the top surface and the bottom surface of the corresponding Fin semiconductor layer 31. Differently from the fourth embodiments, the width of the second part of the second gate electrode GE2 along the column direction increases from WG21 to WG23 (WG21<WG23<WG22). The width WG23 is equal to the distance between the source layer S and the drain layer D. That is, the width WG23 is equal to the channel length.

Figure 99:
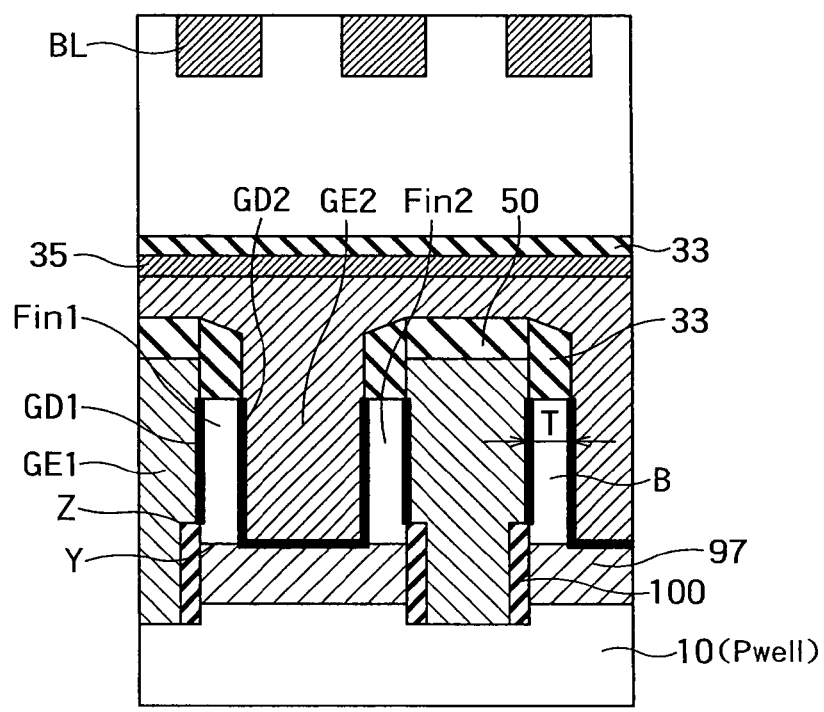

FIG. 99 is a cross-sectional view corresponding to FIG. 27. Differently from FIG. 27, an N-type diffusion layer 97 is formed under a body B of a memory cell, and a P-well is formed under the N-type diffusion layer 97. A first gate electrode GE1 is made of P-type polysilicon, and a bottom thereof is connected to the P-well. An insulating film 100 is formed between the body B and the first gate electrode GE1. The equivalent oxide thickness of the insulating film 100 is larger than that of a first gate dielectric film GD1. A top surface of the insulating film 100 is set higher than a position of a PN junction Y between the body B and the N-type diffusion layer 97. This structure reduces influence of a voltage applied to the first gate electrode GE1 on the electric field at the PN junction, and hence, it reduces the leakage current between the body B and the N-type diffusion layer 97.

Figure 100:
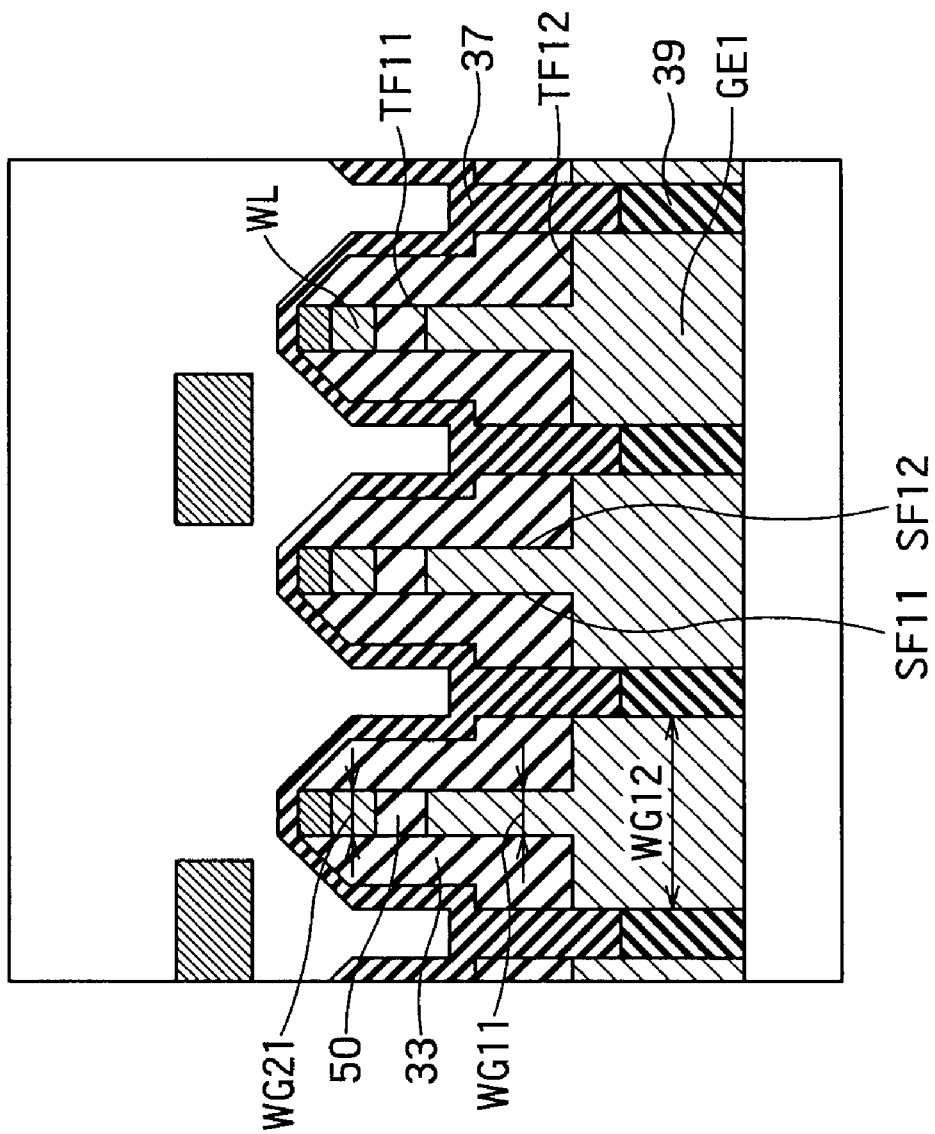

FIG. 100 is a cross-sectional view corresponding to FIG. 54. Similarly to the fourth embodiment, the first gate electrode GE1 has two side surfaces SF11 and SF12 oriented to the column direction. In a cross section perpendicular to the row direction, a width of a top surface of each first gate electrode GE1 is WG11 and a width of a bottom surface thereof is WG12 (>WG11). Each of the first gate electrodes GE1 includes a first part and a second part. The first part of the second electrode GE1 is formed under the word line WL and has a top surface TF11. The second part of the first electrode GE1 has a top surface TF12 lower than the top surface TF11 of the first part. The top surface TF11 is located higher than the top surface of the corresponding Fin semiconductor layer 31. The top surface TF12 is located between the bottom surface of the drain layer and the top surface of the N-type diffusion layer 97. This structure reduces the parasitic capacitance between the first gate electrode GE1 and the drain layer D, and reduces influence of a voltage applied to the first gate electrode GE1 on the electric field at a PN junction between the bottom of the drain layer and the body.

Referring to FIG. 99, one memory cell can be composed of two Fin semiconductor layers 31. For example, Fin1 and Fin2 shown in FIG. 99 can be connected to the same bit line to constitute a memory cell.

Referring to FIG. 97 and FIG. 98, an N-well can be formed in a surface of the supporting substrate 10 instead of the P-well. In this case, 0V is applied to the N-well. Referring to FIG. 99 and FIG. 100, the memory cell can be configured so that the first gate line GL1 is formed under the first gate electrode GE1, and the insulating film 100 is formed between the first gate line GL1 and the supporting substrate 10. In this case, the first gate line GL1 is extended to a peripheral region of a cell array, and a negative voltage (for example, −2V) is applied to the first gate line through a contact in the peripheral region.

Figure 101:
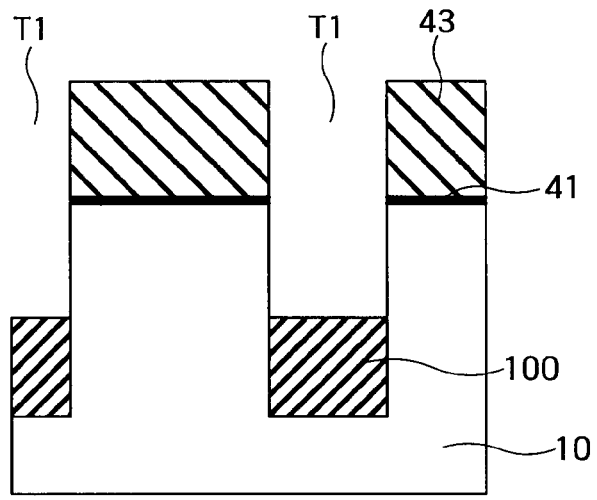
FIGS. 101 to 106 show a method of manufacturing the FBC memory device according to the seventh embodiment.

A method of manufacturing the FBC memory device according to the seventh embodiment will be described below. As shown in FIG. 101, a silicon oxide film 41 is formed on a bulk wafer (silicon substrate) 10. An SiN mask 43 is deposited on the silicon oxide film 41. The SiN mask 43 is patterned into a shape of the first trench T1. Using the SiN mask 43 as a mask, the silicon substrate 10 is etched by RIE. A lower part of the first trench T1 is filled with an oxide film 100.

Figure 102:
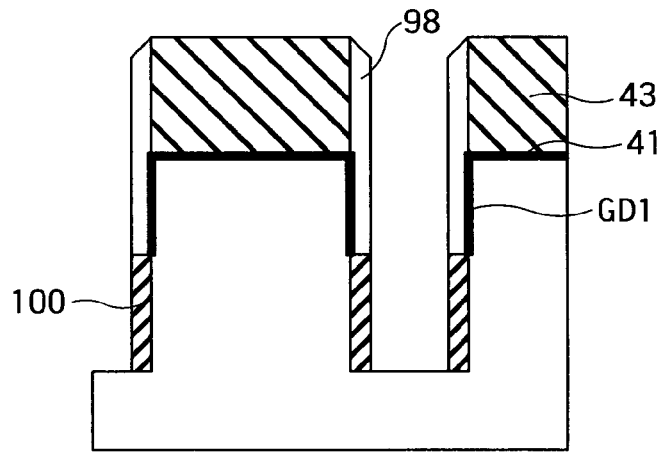

As shown in FIG. 102, the first gate dielectric film GD1 is formed on side surfaces of the silicon substrate 10. A first gate electrode material 98 is deposited on surfaces of the first trench T1 and on the SiN mask 43. The first gate electrode material 98 is, for example, P-type-doped polysilicon. By etching back the first gate electrode material 98 by anisotropic etching, the first gate electrode material 98 is left only on side surfaces of the first trench T1. Using the P-type-doped polysilicon and the SiN mask 43 as a mask, the oxide film 100 is etched by RIE. After that, similar steps to those according to the second embodiment are performed from a step of filling the first trench T1 with the first gate electrode material 97 through a step of forming the second trench T2.

Figure 103:
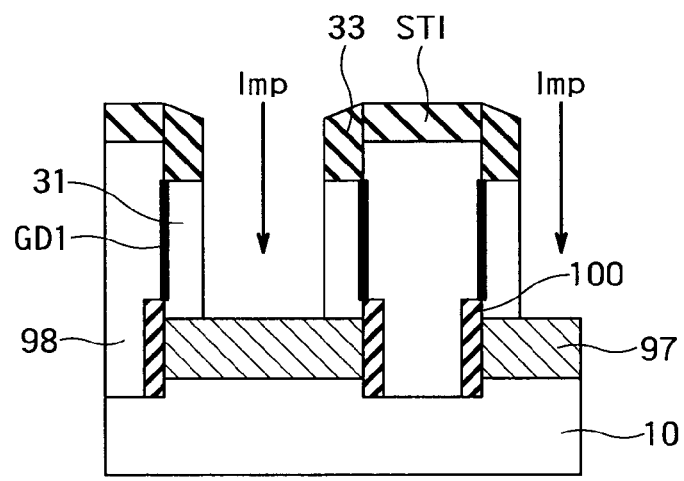

Next, by introducing P-type impurities into the silicon substrate 10 and the Fin semiconductor layer 31, the P-well and the body B are formed. As indicated by arrows Imp shown in FIG. 103, N-type impurity ions are implanted into a bottom of the second trench T2, and the N-type diffusion layer 97 is formed. After that, similar steps to those according to the sixth embodiment are performed from a step of forming the second dielectric film GD2 through a step of etching the second gate electrode GE2 using the SiN cap 70 as a mask.

Figure 104:
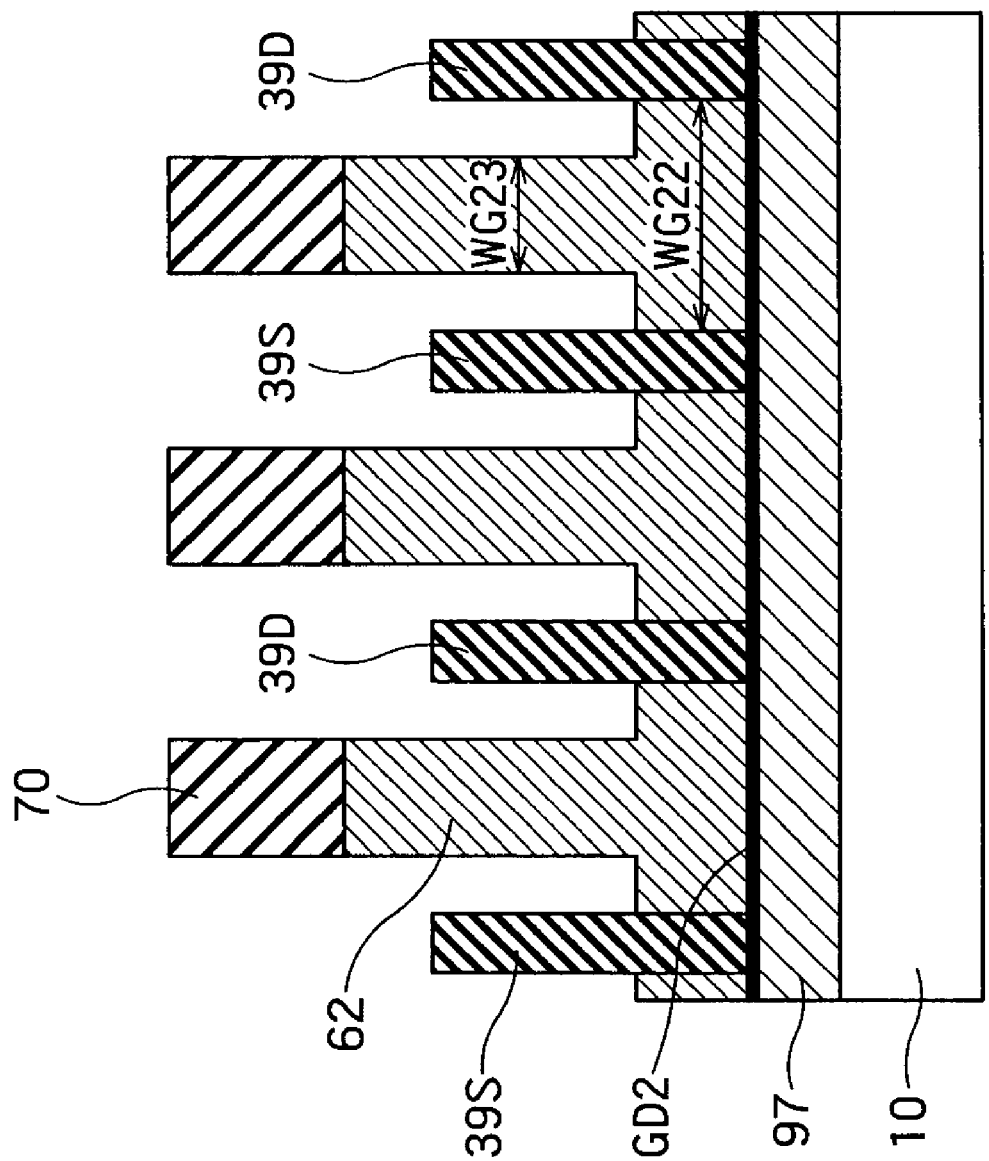
Figure 105:
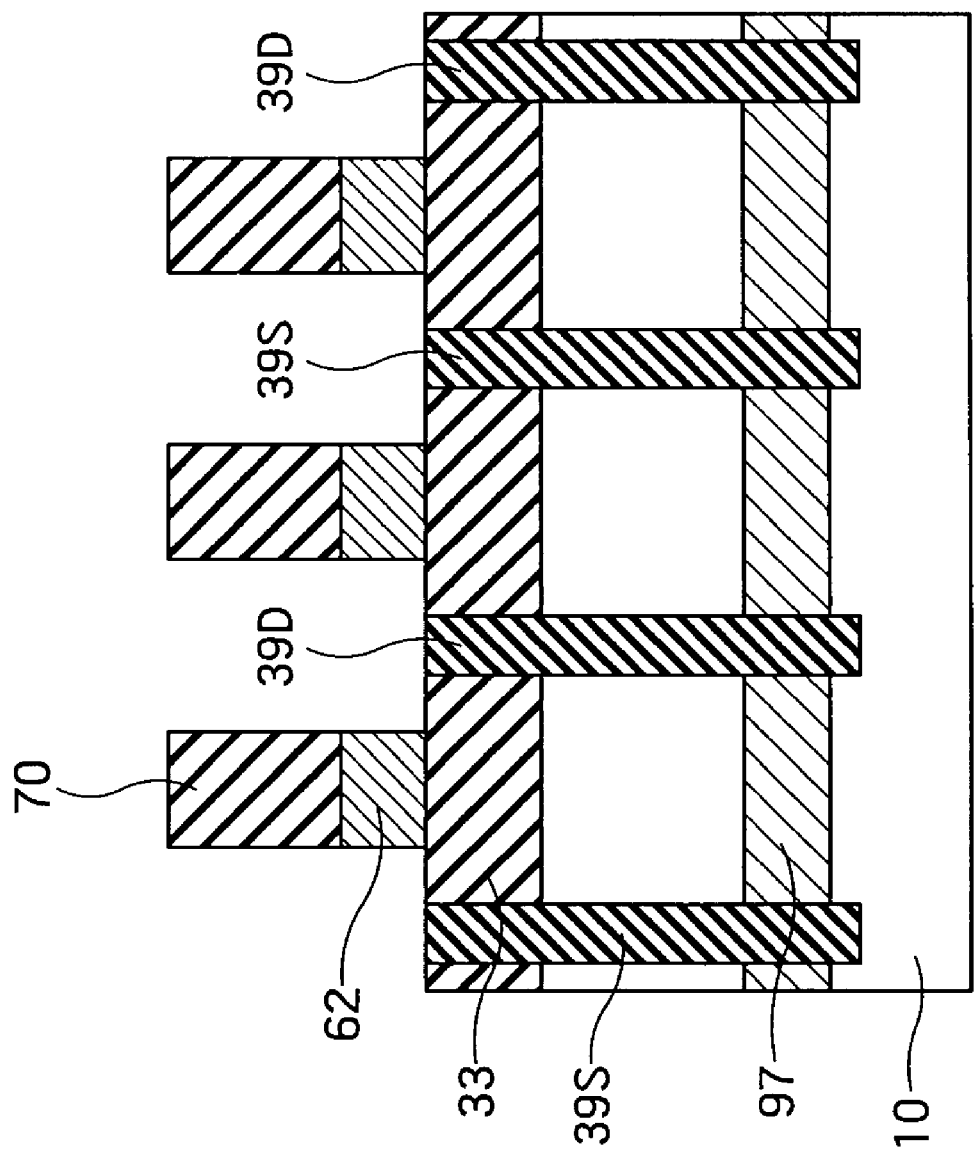
Figure 106:
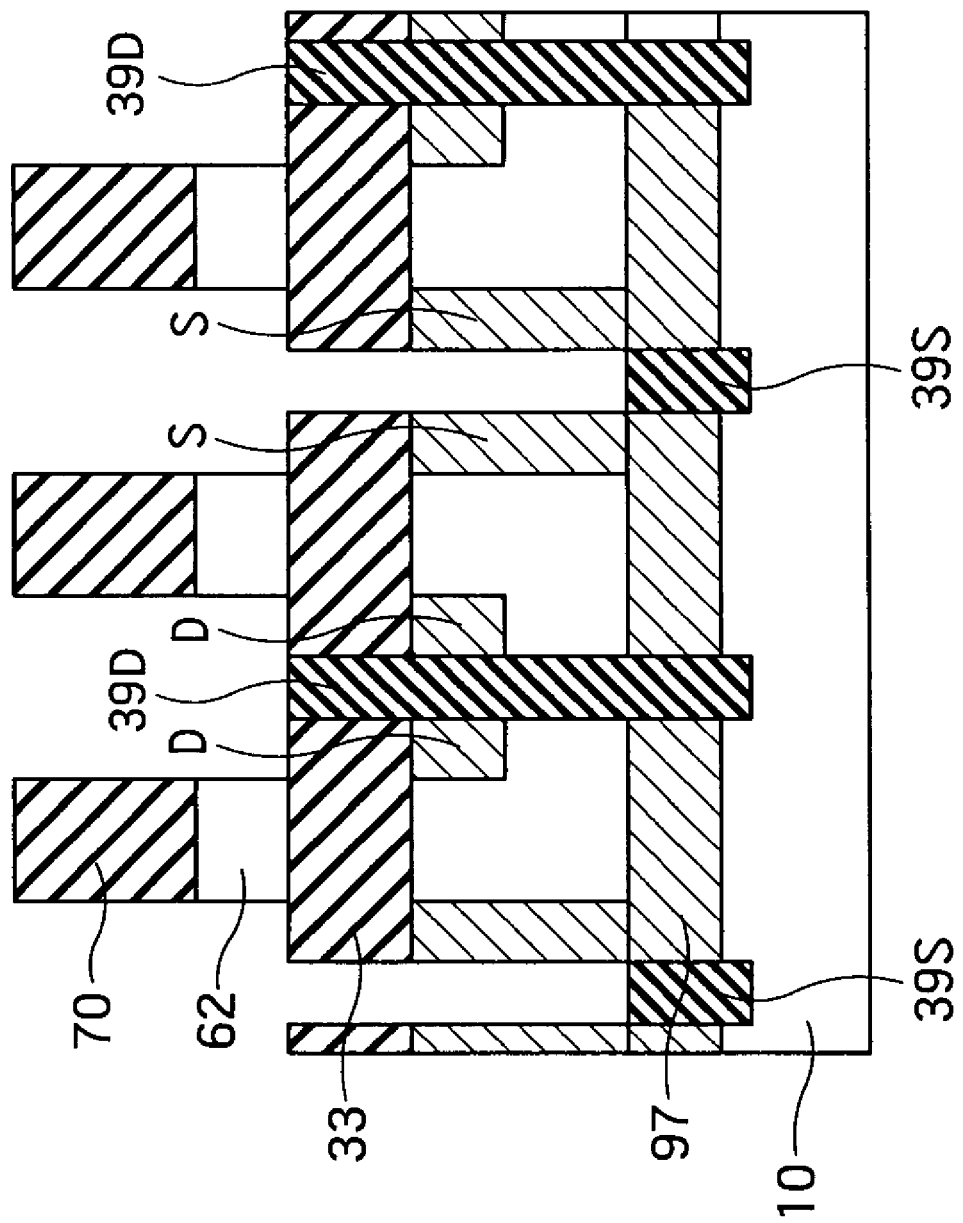

FIGS. 104 to 105 correspond to FIGS. 88 to 89, respectively. At this stage of the present embodiment, the second gate electrode GE2 has an inverse-T-shape. An oxide film 39S adjacent to source-to-be layers is etched back by RIE, and then, N-type impurities are introduced into the Fin semiconductor layer 31 by ion implantation or plasma doping. As shown in FIG. 106, the source layer S and the drain layer D are formed in the Fin semiconductor layer 31 so that the drain layer is separated from the N-type diffusion layer 97 and the source layer is connected to the N-type diffusion layer 97. The similar steps according to the sixth embodiment are performed, thereby completing the FBC memory device according to the seventh embodiment.

The invention claimed is:

1. A semiconductor memory device comprising:
   a supporting substrate;
   a semiconductor layer provided above the supporting substrate, and extending in a first direction;
   a source layer provided in the semiconductor layer;
   a drain layer provided in the semiconductor layer;
   a body provided between the source layer and the drain layer in the semiconductor layer, the body being in an electrically floating state, electric charges being accumulated in or emitted from the body to store data;
   a bit line connected to the drain layer, and extending in the first direction;
   a first gate dielectric film provided on a first side surface of the body;
   a first gate electrode provided on the first side surface of the body via the first gate dielectric film;
   a first gate line extending in the first direction, connected to a bottom of the first gate electrode, and formed integrally with the first gate electrode using same material;
   a second gate dielectric film provided on a second side surface of the body, the second side surface being opposite to the first side surface;
   a second gate electrode provided on the second side surface of the body via the second gate dielectric film, the second gate electrode extending upward above a top surface of the body and isolated from the first gate electrode; and
   a second gate line extending above the body in a second direction crossing the first direction, connected to an upper portion of the second gate electrode, and formed integrally with the second gate electrode using same material.

2. The semiconductor memory device according to claim 1, wherein
   a plurality of semiconductor layers are provided,
   first side surfaces of the semiconductor layers are opposed to each other in a first trench between the adjacent semiconductor layers,
   second side surfaces of the semiconductor layers are opposed to each other in a second trench between the adjacent semiconductor layers, and
   a plurality of first trenches and a plurality of second trenches are alternately arranged in the second direction.

3. The semiconductor memory device according to claim 1, wherein a width of a bottom of the body in the first direction is larger than a width of a top surface of the body in the first direction.

4. The semiconductor memory device according to claim 1, wherein a top surface of the first gate line is located at a lower position than a position of a bottom of the drain layer.

5. A semiconductor memory device comprising:
   a supporting substrate;
   a semiconductor layer provided above the supporting substrate, and extending in a first direction;
   a source layer provided in the semiconductor layer;
   a drain layer provided in the semiconductor layer;
   a body provided between the source layer and the drain layer in the semiconductor layer, the body being in an electrically floating state, electric charges being accumulated in or emitted from the body to store data;
   a bit line connected to the drain layer, and extending in the first direction;
   a first gate dielectric film provided on a first side surface of the body;

a first gate electrode provided on the first side surface of the body via the first gate dielectric film and connected to the supporting substrate;

a second gate dielectric film provided on a second side surface of the body, the second side surface being opposite to the first side surface;

a second gate electrode provided on the second side surface of the body via the second gate dielectric film, the second gate electrode extending upward above a top surface of the body and isolated from the first gate electrode; and a second gate line extending above the body in a second direction crossing the first direction, connected to an upper portion of the second gate electrode, and formed integrally with the second gate electrode using same material.

6. The semiconductor memory device according to claim 5, wherein a plurality of semiconductor layers are provided, first side surfaces of the semiconductor layers are opposed to each other in a first trench between the adjacent semiconductor layers, second side surfaces of the semiconductor layers are opposed to each other in a second trench between the adjacent semiconductor layers, and a plurality of first trenches and a plurality of second trenches are alternately arranged in the second direction.

7. The semiconductor memory device according to claim 5, wherein a width of a bottom of the body in the first direction is larger than a width of a top surface of the body in the first direction.

8. The semiconductor memory device according to claim 6, wherein the first gate electrode is shared between first surfaces of the semiconductor layers opposed to each other in each of the first trenches.

9. The semiconductor memory device according to claim 5, wherein a width of an upper portion of the second gate electrode in the first direction is smaller than a width of a lower portion of the second gate electrode in the first direction.

10. A semiconductor memory device comprising:

a supporting substrate;

a semiconductor layer provided above the supporting substrate, and extending in a first direction;

a source layer provided in the semiconductor layer;

a drain layer provided in the semiconductor layer;

a body provided between the source layer and the drain layer in the semiconductor layer, the body being in an electrically floating state, electric charges being accumulated in or emitted from the body to store data;

a bit line connected to the drain layer, and extending in the first direction;

a first gate dielectric film provided on a first side surface of the body;

a first gate electrode provided on the first side surface of the body via the first gate dielectric film and including a first part and a second part;

a second gate dielectric film provided on a second side surface of the body, the second side surface being opposite to the first side surface;

a second gate electrode provided on the second side surface of the body via the second gate dielectric film, the second gate electrode extending upward above a top surface of the body and isolated from the first gate electrode; and a second gate line extending above the body in a second direction crossing the first direction, connected to an upper portion of the second gate electrode, and formed integrally with the second gate electrode using same material, wherein a first part is provided below the second gate line and includes two side surfaces facing to the first direction, and a second part includes a top surface located lower than a top surface of the first part.

11. The semiconductor memory device according to claim 10, wherein a plurality of semiconductor layers are provided, first side surfaces of the semiconductor layers are opposed to each other in a first trench between the adjacent semiconductor layers, second side surfaces of the semiconductor layers are opposed to each other in a second trench between the adjacent semiconductor layers, and a plurality of first trenches and a plurality of second trenches are alternately arranged in the second direction.

12. The semiconductor memory device according to claim 10, wherein a width of a bottom of the body in the first direction is larger than a width of a top surface of the body in the first direction.

* * * * *